(12) United States Patent
Nobbe et al.

(10) Patent No.: US 10,184,973 B2
(45) Date of Patent: *Jan. 22, 2019

(54) MISMATCH DETECTION USING REPLICA CIRCUIT

(71) Applicant: pSemi Corporation, San Diego, CA (US)

(72) Inventors: Dan William Nobbe, Crystal Lake, IL (US); Ronald Eugene Reedy, San Diego, CA (US); Peter Bacon, Derry, NH (US); James S. Cable, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/829,761

(22) Filed: Dec. 1, 2017

(65) Prior Publication Data

US 2018/0164366 A1 Jun. 14, 2018

Related U.S. Application Data

(63) Continuation of application No. 15/341,955, filed on Nov. 2, 2016, now Pat. No. 9,864,000, which is a
(Continued)

(51) Int. Cl.
*G01R 31/28* (2006.01)
*H03F 1/56* (2006.01)
(Continued)

(52) U.S. Cl.
CPC ......... *G01R 31/28* (2013.01); *G01R 31/2836* (2013.01); *H03F 1/0277* (2013.01);
(Continued)

(58) Field of Classification Search
CPC . G01R 31/28; H03F 1/56; H03F 3/195; H03F 3/213; H03F 2200/102;
(Continued)

(56) References Cited

U.S. PATENT DOCUMENTS 5,973,363 A * 10/1999 Staab ................ H01L 21/76264
257/288
6,297,696 B1 * 10/2001 Abdollahian ........... H03F 3/602
330/124 R
(Continued)

OTHER PUBLICATIONS

Curtis, Sean M., Office Action received from the USPTO dated Jun. 30, 2017 for U.S. Appl. No. 15/341,955, 17 pgs.
(Continued)

*Primary Examiner* — Patrick Assouad
*Assistant Examiner* — Sean Curtis
(74) *Attorney, Agent, or Firm* — Jaquez Land Greenhaus LLP; Martin J. Jaquez, Esq.; Alessandro Steinfl, Esq.

(57) ABSTRACT

An apparatus for detecting difference in operating characteristics of a main circuit by using a replica circuit is presented. In one exemplary case, a sensed difference in operating characteristics of the two circuits is used to drive a tuning control loop to minimize the sensed difference. In another exemplary case, several replica circuits of the main circuit are used, where each is isolated from one or more operating variables that affect the operating characteristic of the main circuit. Each replica circuit can be used for sensing a different operating characteristic, or, two replica circuits can be combined to sense a same operating characteristic.

20 Claims, 34 Drawing Sheets

Related U.S. Application Data continuation-in-part of application No. 14/883,321, filed on Oct. 14, 2015, now Pat. No. 9,535,110, which is a continuation of application No. 14/272,415, filed on May 7, 2014, now Pat. No. 9,178,493.

(51) Int. Cl.

| | | |
|---|---|---|
| *H03F 3/195* | (2006.01) | |
| *H03F 3/213* | (2006.01) | |
| *H03F 3/24* | (2006.01) | |
| *H03F 1/02* | (2006.01) | |
| *H03F 1/22* | (2006.01) | |
| *H03F 3/193* | (2006.01) | |
| *H03F 3/21* | (2006.01) | |
| *H03F 3/72* | (2006.01) | |
| *H03H 7/38* | (2006.01) | |
| *H04B 1/44* | (2006.01) | |
| *H04B 1/48* | (2006.01) | |
| *H04B 17/11* | (2015.01) | |

(52) U.S. Cl.
CPC ............. *H03F 1/223* (2013.01); *H03F 1/56* (2013.01); *H03F 1/565* (2013.01); *H03F 3/193* (2013.01); *H03F 3/195* (2013.01); *H03F 3/211* (2013.01); *H03F 3/213* (2013.01); *H03F 3/245* (2013.01); *H03F 3/72* (2013.01); *H03H 7/38* (2013.01); *H04B 1/44* (2013.01); *H04B 1/48* (2013.01); *H03F 2200/102* (2013.01); *H03F 2200/105* (2013.01); *H03F 2200/222* (2013.01); *H03F 2200/378* (2013.01); *H03F 2200/387* (2013.01); *H03F 2200/451* (2013.01); *H03F 2200/453* (2013.01); *H03F 2200/456* (2013.01); *H03F 2200/471* (2013.01); *H03F 2200/61* (2013.01); *H03F 2203/21142* (2013.01); *H03F 2203/7236* (2013.01); *H04B 17/11* (2015.01)

(58) Field of Classification Search
CPC ......... H03F 2200/105; H03F 2200/387; H03F 2200/451; H03F 2200/456; H03F 2200/471
USPC ........................................................ 324/537
See application file for complete search history.

(56) References Cited

U.S. PATENT DOCUMENTS

| | | | | |
|---|---|---|---|---|
| 6,804,502 B2* | 10/2004 | Burgener | ................. | H01P 1/15 455/333 |
| 6,812,885 B2 | 11/2004 | Brettner, III et al. | | |
| 7,003,043 B2* | 2/2006 | Casper | ................. | H04L 5/1423 327/379 |
| 7,248,120 B2* | 7/2007 | Burgener | ................. | H03F 1/223 330/277 |
| 7,353,020 B2* | 4/2008 | Saitou | ................. | H04W 52/20 455/115.1 |
| 7,786,797 B2* | 8/2010 | Okazaki | ................. | H03F 1/0288 330/124 R |
| 7,894,546 B2* | 2/2011 | Magoon | ................. | H03C 5/00 375/296 |
| 7,910,993 B2* | 3/2011 | Brindle | ................. | H01L 29/78609 257/347 |
| 8,005,445 B2* | 8/2011 | Kuriyama | ................. | H03F 1/0205 330/124 R |
| 8,112,043 B2* | 2/2012 | Knudsen | ................. | H04B 1/0458 379/264 |
| 8,131,232 B2* | 3/2012 | Muhammad | ................. | H04B 1/0458 330/86 |
| 8,446,173 B1* | 5/2013 | Faucher | ................. | H03K 19/00361 326/27 |
| 8,482,353 B2* | 7/2013 | Blednov | ................. | H03F 1/0288 330/124 R |
| 9,026,068 B2* | 5/2015 | Blanka | ................. | H04B 1/0458 375/295 |
| 9,178,493 B1* | 11/2015 | Nobbe | ................. | H03F 3/72 |
| 9,276,527 B2* | 3/2016 | Gaynor | ................. | H03F 3/72 |
| 9,294,056 B2* | 3/2016 | Nobbe | ................. | H03F 1/0261 |
| 9,419,565 B2* | 8/2016 | Nobbe | ................. | H04B 17/12 |
| 9,535,110 B2* | 1/2017 | Nobbe | ................. | H03F 3/72 |
| 9,595,923 B2* | 3/2017 | Nobbe | ................. | H03F 1/30 |
| 9,712,196 B2* | 7/2017 | Ripley | ................. | H04B 1/1036 |
| 9,712,197 B2* | 7/2017 | Ripley | ................. | H04B 1/1036 |
| 9,742,359 B2* | 8/2017 | Scott | ................. | H03F 3/195 |
| 9,864,000 B2* | 1/2018 | Nobbe | ................. | G01R 31/28 |
| 2002/0021687 A1* | 2/2002 | Toki | ................. | H03F 1/32 370/345 |
| 2004/0002323 A1* | 1/2004 | Zheng | ................. | H03D 3/009 455/324 |
| 2005/0020218 A1* | 1/2005 | Zelley | ................. | G01R 27/06 455/127.1 |
| 2007/0284724 A1* | 12/2007 | Englekirk | ................. | H01L 23/66 257/692 |
| 2008/0068078 A1* | 3/2008 | Iwasaki | ................. | H03F 1/0261 330/124 R |
| 2008/0125061 A1* | 5/2008 | Kuriyama | ................. | H03F 1/0205 455/127.1 |
| 2008/0278141 A1* | 11/2008 | Kuijken | ................. | H03F 3/45744 324/76.11 |
| 2008/0284519 A1* | 11/2008 | Andrews | ................. | H03F 1/02 330/286 |
| 2009/0180403 A1* | 7/2009 | Tudosoiu | ................. | H04B 1/006 370/278 |
| 2010/0112962 A1 | 5/2010 | van Zeijl et al. | | |
| 2011/0140786 A1* | 6/2011 | Blednov | ................. | H03F 1/0288 330/295 |
| 2011/0279178 A1* | 11/2011 | Outaleb | ................. | H03F 1/0288 330/124 R |
| 2013/0222075 A1* | 8/2013 | Reedy | ................. | H03J 3/20 333/32 |
| 2014/0097698 A1* | 4/2014 | Wang | ................. | H04B 1/0458 307/104 |
| 2014/0184337 A1* | 7/2014 | Nobbe | ................. | H03F 1/0227 330/296 |
| 2014/0266433 A1* | 9/2014 | Nobbe | ................. | H03F 1/30 330/151 |
| 2014/0266452 A1* | 9/2014 | Scott | ................. | H03F 3/195 330/278 |
| 2014/0266455 A1* | 9/2014 | Kaatz | ................. | H03F 1/565 330/286 |
| 2014/0357205 A1* | 12/2014 | Spiegel | ................. | H04B 1/0458 455/121 |
| 2015/0048898 A1* | 2/2015 | Gaynor | ................. | H03H 7/40 333/124 |
| 2015/0091657 A1* | 4/2015 | Gaynor | ................. | H03F 3/21 330/302 |
| 2015/0280655 A1* | 10/2015 | Nobbe | ................. | H04B 17/12 330/9 |
| 2015/0326206 A1* | 11/2015 | Nobbe | ................. | H03F 3/72 455/78 |
| 2015/0326326 A1* | 11/2015 | Nobbe | ................. | H04B 17/12 375/224 |
| 2016/0116525 A1* | 4/2016 | Nobbe | ................. | H03F 3/72 324/537 |
| 2017/0047463 A1* | 2/2017 | Hajimiri | ................. | H03F 3/19 |
| 2017/0063314 A1* | 3/2017 | Nobbe | ................. | H03F 3/72 |
| 2017/0146591 A1* | 5/2017 | Nobbe | ................. | G01R 31/28 |

OTHER PUBLICATIONS

Curtis, Sean M., Notice of Allowance received from the USPTO dated Nov. 7, 2017 for U.S. Appl. No. 15/341,955, 16 pgs.
Nobbe, et al., Preliminary Amendment filed in the USPTO dated Feb. 8, 2017 for U.S. Appl. No. 15/341,955, 10 pgs.

(56) References Cited

OTHER PUBLICATIONS

Nobbe, et al., Response filed in the USPTO dated Jul. 12, 2017 for U.S. Appl. No. 15/341,955, 3 pgs.
Nobbe, et al., Response filed in the USPTO dated Feb. 17, 2018 for U.S. Appl. No. 14/272,387, 30 pgs.
Nguyen, Hieu P., Office Action received from the USPTO dated Jan. 30, 2018 for U.S. Appl. No. 15/445,811, 6 pgs.
Nobbe, et al., Response filed in the USPTO dated Jan. 5, 2018 for U.S. Appl. No. 14/272,387, 16 pgs.
Cadeau, Wednel, Office Action received from the USPTO dated Apr. 5, 2018 for U.S. Appl. No. 14/272,387, 37 pgs.

\* cited by examiner

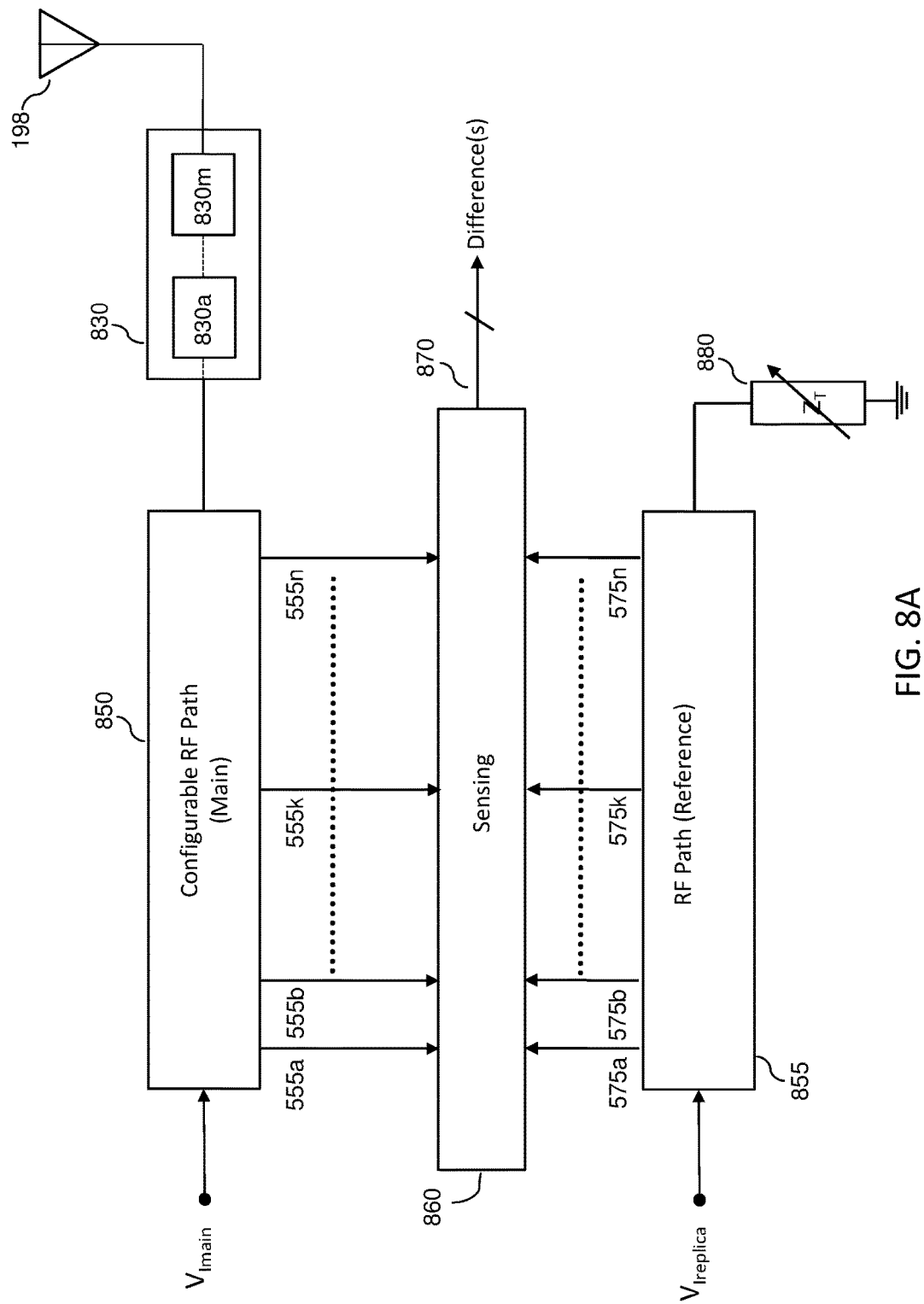

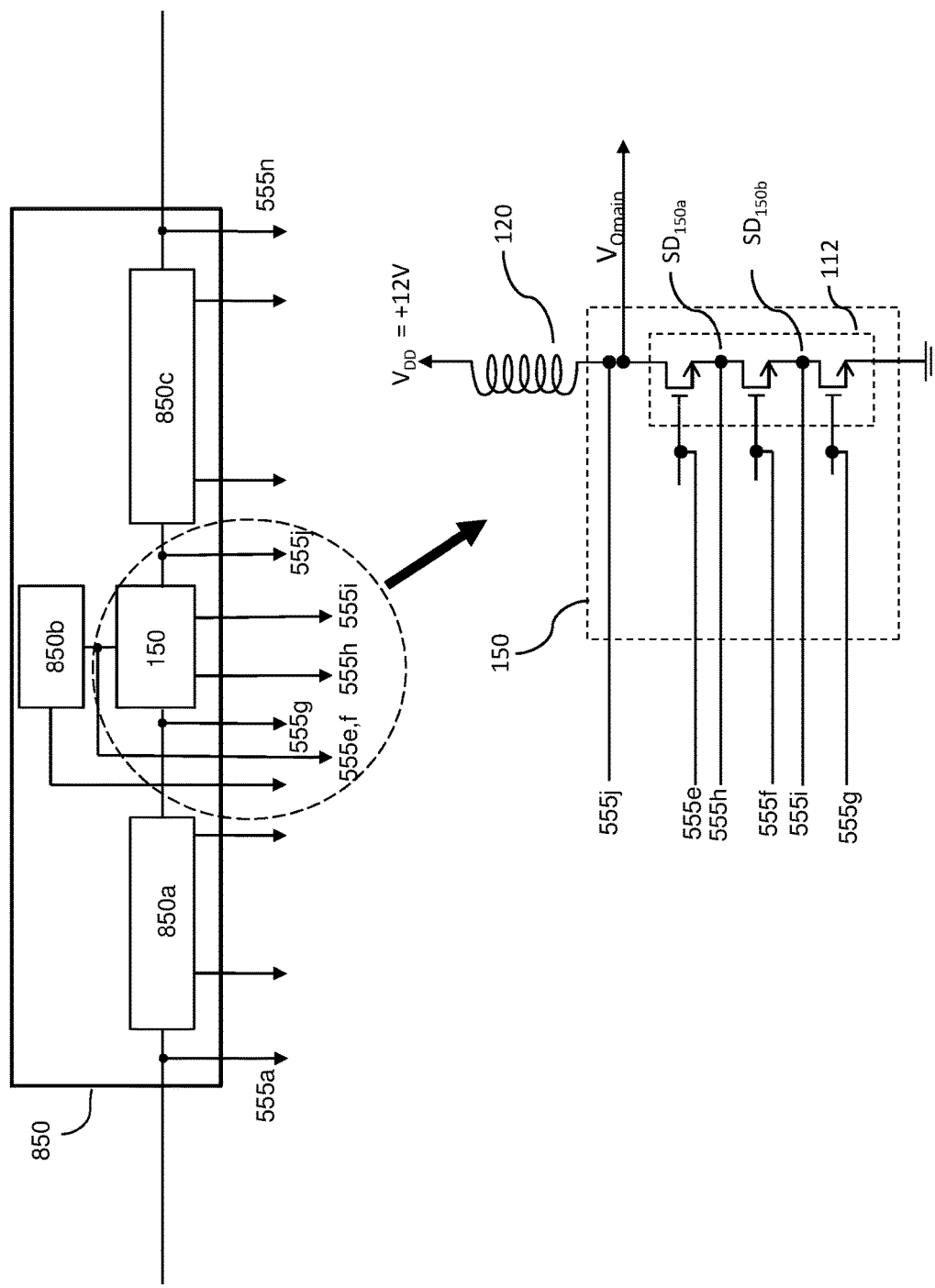

MISMATCH DETECTION USING REPLICA CIRCUIT

CROSS REFERENCE TO RELATED APPLICATIONS

The present application is a continuation of U.S. patent application Ser. No. 15/341,955 entitled "Mismatch Detection using Replica Circuit", filed on Nov. 2, 2016, which is a continuation-in-part of U.S. patent application Ser. No. 14/883,321 entitled "Mismatch Detection using Replica Circuit", filed on Oct. 14, 2015 (now U.S. Pat. No. 9,535,110, issued Jan. 3, 2017), which in turn is a continuation of U.S. patent application Ser. No. 14/272,415 entitled "Mismatch Detection using Replica Circuit", filed on May 7, 2014 and issued as U.S. Pat. No. 9,178,493 on Nov. 3, 2015, the disclosures of all of which are incorporated herein by reference in their entirety.

The present application may be related to U.S. patent application Ser. No. 14/272,387 entitled "RF Transmit Path Calibration via On-Chip Dummy Load" filed on May 7, 2014 and published as US Patent Publication No. 2015/0326326-A1 on Nov. 12, 2015, the disclosure of which is incorporated herein by reference in its entirety.

The present application may be related to U.S. patent application Ser. No. 13/797,779 entitled "Scalable Periphery Tunable Matching Power Amplifier", filed on Mar. 12, 2013, the disclosure of which is incorporated herein by reference in its entirety. The present application may also be related to International Application No. PCT/US2009/001358, entitled "Method and Apparatus for use in digitally tuning a capacitor in an integrated circuit device", filed on Mar. 2, 2009, the disclosure of which is incorporated herein by reference in its entirety. The present application may also be related to U.S. patent application Ser. No. 13/595,893, entitled "Methods and Apparatuses for Use in Tuning Reactance in a Circuit Device", filed on Aug. 27, 2012, the disclosure of which is incorporated herein by reference in its entirety. The present application may also be related to U.S. patent application Ser. No. 14/042,312, filed on Sep. 30, 2013, entitled "Methods and Devices for Impedance Matching in Power Amplifier Circuits", the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety. The present application may also be related to U.S. patent application Ser. No. 13/967,866 entitled "Tunable Impedance Matching Network", filed on Aug. 15, 2013, the disclosure of which is incorporated herein by reference in its entirety. The present application may also be related to U.S. patent application Ser. No. 13/797,686 entitled "Variable Impedance Match and Variable Harmonic Terminations for Different Modes and Frequency Bands", filed on Mar. 12, 2013, the disclosure of which is incorporated herein by reference in its entirety. The present application may also be related to U.S. Pat. No. 9,413,298 entitled "Amplifier Dynamic Bias Adjustment for Envelope Tracking", issued on Aug. 9, 2016, the disclosure of which is incorporated herein by reference in its entirety. The present application may also be related to U.S. patent application Ser. No. 14/242,373 entitled "Hot Carrier Injection Compensation", filed on Apr. 1, 2014, the disclosure of which is incorporated herein by reference in its entirety.

BACKGROUND

1. Field

The present teachings relate to performance mismatch detection in RF circuits, including performance compensation using such mismatch detection. More particularly, the present teachings relate to performance mismatch detection using a replica circuit, where one or more operating variables of the replica circuit that affect performance are made to be intentionally different from operating variables of a main circuit.

2. Description of Related Art

Performance of an RF circuit can be based on a set of operating characteristics of the RF circuit. Such operating characteristics may comprise a signal modulation characteristic, a signal linearity characteristic, a signal distortion characteristic, a signal magnitude characteristic, a signal phase characteristic, a transient response characteristic, a temperature characteristic, and other characteristics used as metrics to a performance of the RF circuit. During operation of the RF circuit, such operating characteristics may be affected by operating variables to which the RF circuit is subjected. In turn, the operating variables can cause performance of the RF circuit to deviate from a nominal performance. Such operating variables may comprise a load to the RF circuit, a local temperature at the RF circuit, HCI and floating body effects of transistor devices of the RF circuit, transient effects associated to transition from idle/inactive to normal/active modes of operation of the RF circuit, different operating modes of the RF circuit, different frequencies of operation of the RF circuit, etc.

In some cases, it may not be desirable to directly measure performance of the RF circuit during normal operation of the RF circuit, since coupling to the RF circuit for the sake of the measurement may adversely affect performance of the RF circuit. One may consider measuring the performance during a test mode of the RF circuit with the drawback of not being able to compensate in real time (during normal operation). In other cases, performance, per the operating characteristics, may not be directly measured, but rather derived by way of signals sensed from the RF circuit. Such signals may be influenced by the operating variables in such way that they may not be representative of the real performance of the RF circuit.

A varying load coupled to an output node of the RF circuit can affect a VSWR of the circuit. Such varying load may be caused by a varying antenna, or elements coupled to the output node affected by various operating variables. VSWR (voltage standing wave ratio) is a metric commonly used to indicate a degree of impedance mismatch between two different stages in a circuit (e.g. a power amplifier and a transmitting antenna). A VSWR of 1:1 indicates a perfect impedance match (e.g. no reflected wave) while higher measures of VSWR indicate higher degrees of impedance mismatch (e.g. a VSWR of 10:1 indicates higher impedance mismatch than a VSWR of 5:1). In prior art embodiments, measurement of VSWR can be performed using a dual directional coupler and a complete power detector in order to measure both forward and reflected waves from which the VSWR measurement can be derived.

For example, an impedance mismatch between two stages of a circuit such as a power amplifier and a transmitting antenna can occur because antenna impedance can be influenced by a surrounding environment of the transmitting antenna. By way of example, and not of limitation, at assembly time the antenna may have a particular surrounding environment, leading to a first value of antenna impedance. The power amplifier may be matched to the first value of the antenna impedance. If the environment surrounding the antenna changes, antenna impedance may change to a second value as a result of the environmental change. As one example, placing the transmitting antenna on a metal table can alter the antenna impedance, causing an impedance mismatch between the power amplifier and the transmitting antenna. As another example, metal objects in proximity to the transmitting antenna can affect the antenna impedance.

SUMMARY

According to a first aspect of the present disclosure, a circuital arrangement is presented, the circuital arrangement comprising: a sensing circuit; a first radio frequency (RF) path coupled, through one or more sensing points of the first RF path, to the sensing circuit, the first RF path comprising a first amplifying circuit; and at least one second RF path coupled, through one or more sensing points of the second RF path in correspondence of the one or more sensing points of the first RF path, to the sensing circuit, the second RF path comprising a second amplifying circuit, the second amplifying circuit being a reduced size replica of the first amplifying circuit, wherein the sensing circuit is adapted to sense a difference between one or more operating characteristics of the first RF path, sensed at the one or more sensing points of the first RF path, and one or more reference operating characteristics of the second RF path, sensed at the corresponding one or more sensing points of the second RF path.

According to a second aspect of the present disclosure, a circuital arrangement is presented, the circuital arrangement comprising: a sensing circuit; a first radio frequency (RF) path coupled, through one or more sensing points of the first RF path, to the sensing circuit, the first RF path comprising a first active circuit comprising one or more transistors; and at least one second RF path coupled, through one or more sensing points of the second RF path in correspondence of the one or more sensing points of the first RF path, to the sensing circuit, the second RF path comprising a second active circuit comprising one or more transistors, the second active circuit being a reduced size replica of the first active circuit, wherein the sensing circuit is adapted to sense a difference between one or more operating characteristics of the first RF path, sensed at the one or more sensing points of the first RF path, and one or more reference operating characteristics of the second RF path, sensed at the corresponding one or more sensing points of the second RF path.

According to a third aspect of the present disclosure, a method for using the above circuital arrangement for gain stabilization of the first RF path is presented, the method comprising: monolithically integrating the arrangement; based on the integrating, placing the second amplifying circuit away from the first amplifying circuit; based on the placing, thermally isolating the second amplifying circuit from the first amplifying circuit, and based on the thermally isolating, controlling a gain of the first amplifying circuit according to a sensed difference in gains of the first amplifying circuit and the second amplifying circuit.

According to a fourth aspect of the present disclosure, a method for using the above circuital arrangement for compensation of transient and/or floating body effects of the first RF path is presented, the method comprising: monolithically integrating the arrangement; activating the second amplifying circuit prior to activation of the first amplifying circuit; based on the activating, removing transient and/or floating body effects from the second amplifying circuit; based on the removing, providing a stable operation of the second RF path; activating the first amplifying circuit; sensing a difference between one or more operating characteristics of the first RF path and the second RF path; and based on the sensing, controlling the first RF path to affect the one or more operating characteristics of the first RF path, wherein the sensed difference comprises one or more of: a) a biasing voltage, b) an output voltage, and c) a gain.

According to a fifth aspect of the present disclosure, a method for using the above circuital arrangement for compensation of a hot carrier injection (HCI) effect over the first RF path is presented, the method comprising: designing the second amplifying circuit for reduced stress; based on the designing, monolithically integrating the arrangement; based on the designing, reducing HCI effects over the second amplifying circuit; and based on the reducing, controlling biasing to the first amplifying circuit according to a sensed difference in biasing voltages of the first amplifying circuit and the second amplifying circuit.

According to a sixth aspect of the present disclosure, a method for using the above circuital arrangement for operation of the first RF path according to a plurality of different operating frequencies is presented, the method comprising: monolithically integrating the arrangement; terminating the second RF path at an output node of the second RF path using a broadband load; configuring the first RF path for operation in a selected operating frequency of the plurality of operating frequencies; sensing a difference between one or more operating characteristics of the first RF path and the second RF path; and based on the sensing, controlling the first RF path for reducing the difference, wherein the sensed difference comprises one or more of: a) a biasing voltage, b) an output voltage, c) a gain, d) an output impedance, and e) an input impedance.

According to a seventh aspect of the present disclosure, a method for using the above circuital arrangement for power control of the first RF path is presented, the method comprising: monolithically integrating the arrangement; determining the current through the conduction path of the second amplifying circuit; and based on the determining, controlling the first amplifying circuit, thereby controlling power at an output node of the first RF path.

According to an eighth aspect of the present disclosure, a method for using the above circuital arrangement for distortion control of the first RF path is presented, the method comprising: monolithically integrating the arrangement; sensing, at a sensing point of the first RF path, an envelope signal of an RF signal of the first RF path; sensing, at a sensing point of the second RF path, an envelope signal of an RF signal of the second RF path; based on the sensing, detecting a compression of the envelope signal at the sensing point of the first RF path; and based on the detecting, controlling the first amplifying circuit to remove the compression, thereby controlling distortion of the first RF path.

According to a ninth aspect of the present disclosure, a method for using the above circuital is presented, the method comprising: monolithically integrating the arrangement, wherein the at least one second RF path comprises a plurality of second RF paths; sensing a difference between an operating characteristic of two different second RF paths of the plurality of second RF paths; and based on the sensing, controlling the first RF path to affect one or more operating characteristics of the first RF path

BRIEF DESCRIPTION OF THE DRAWINGS

FIG. 8A shows a block diagram of an RF system according to an embodiment of the present disclosure where a sensing circuit is used to detect a performance difference between a main RF path and a reference RF path. The main RF path comprising a main circuit that comprises one or more transistors, such as an amplifier, and the reference RF path comprising a reduced size replica of the main circuit.

FIG. 8H shows more details on exemplary couplings of sensing points of the main RF path to the main circuit.

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The term "amplifier" as used in the present disclosure is intended to refer to amplifiers comprising single (e.g. stack height of one) or stacked transistors (e.g. stack height greater than one) configured as amplifiers, and can be used interchangeably with the terms "power amplifier (PA)" and "RF amplifier". Such terms can refer to a device that is configured to amplify an RF signal input to the device to produce an output RF signal of greater magnitude than the magnitude of the input RF signal. Stacked transistor amplifiers are described for example in U.S. Pat. No. 7,248,120, issued on Jul. 24, 2007, entitled "Stacked Transistor Method and Apparatus", the disclosure of which is incorporated herein by reference in its entirety. Such amplifier and power amplifiers can be applicable to amplifiers and power amplifiers of any stages (e.g., pre-driver, driver, final), known to those skilled in the art.

As used in the present disclosure, the term "mode" can refer to a wireless standard and its attendant modulation and coding scheme or schemes. As different modes may require different modulation schemes, these may affect required channel bandwidth as well as affect the peak-to-average-ratio (PAR), also referred to as peak-to-average-power-ratio (PAPR), as well as other parameters known to the skilled person. Examples of wireless standards include Global System for Mobile Communications (GSM), code division multiple access (CDMA), Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the term "band" can refer to a frequency range. More in particular, the term "band" as used herein refers to a frequency range that can be defined by a wireless standard such as, but not limited to, wideband code division multiple access (WCDMA) and long term evolution (LTE).

As used in the present disclosure, the term "channel" can refer to a frequency range. More in particular, the term "channel" as used herein refers to a frequency range within a band. As such, a band can comprise several channels used to transmit/receive a same wireless standard.

Figure 1:
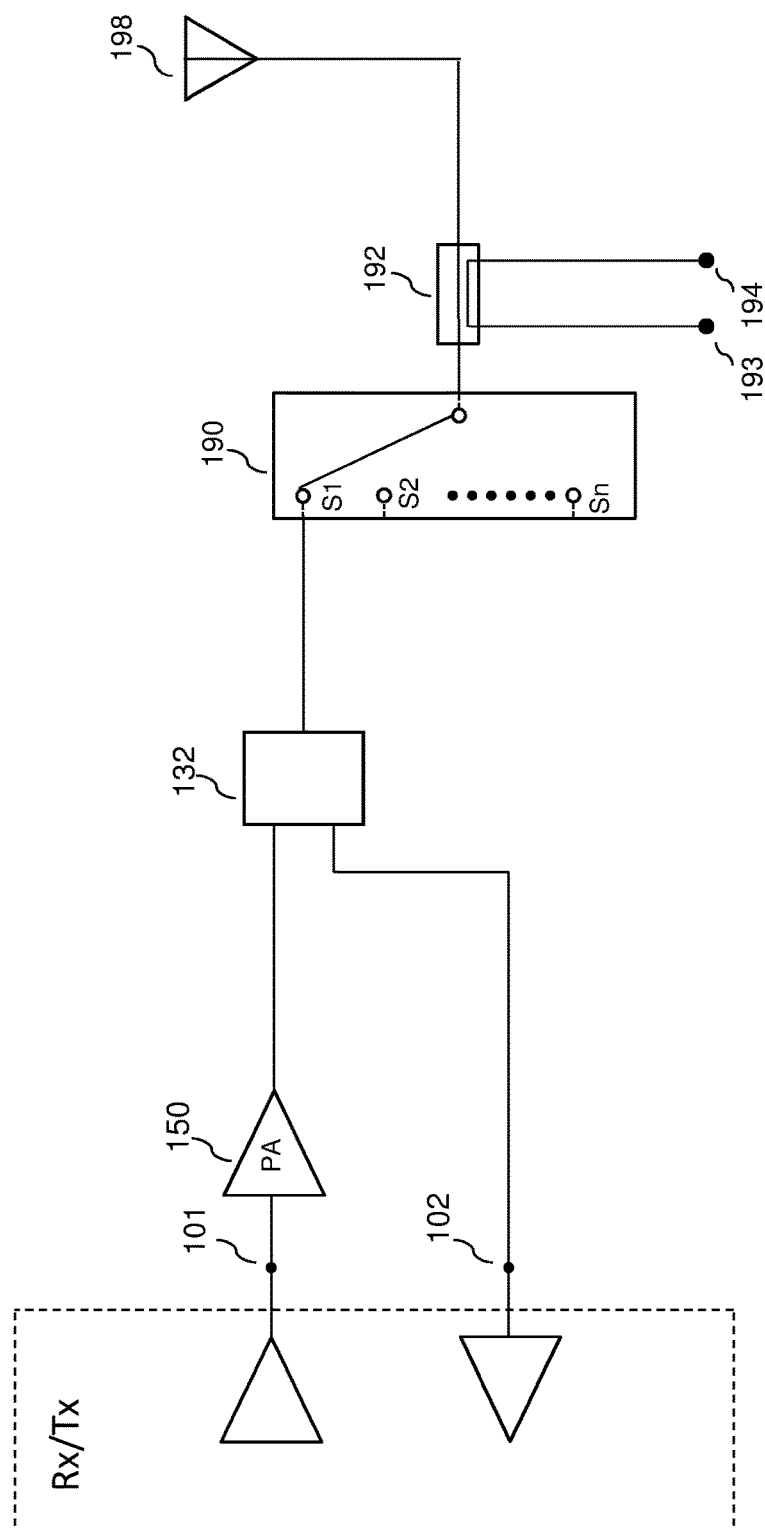
FIG. 1 shows a prior art radio frequency (RF) circuital arrangement wherein a dual directional coupler is used to detect a VSWR.

FIG. 1 shows a prior art circuital arrangement which can be part of an RF front-end stage of an RF device. In the circuital arrangement of FIG. 1, an RF signal at an input terminal (101) can be amplified by an amplifier (e.g. amplifier module) (150) and transmitted to antenna (198) through a transmit path which can include a duplexer unit (132). An antenna switch (190) can connect (e.g. switch in/out) a plurality of such transmit paths (e.g. comprising elements 150, 132) to the antenna (198). At the same time, a received RF signal at the antenna (198) can be routed to an input amplifier, such as a low noise amplifier (LNA) of a transceiver unit, via a receive path which can connect to the input amplifier at an input terminal (102) of the transceiver unit. Similar to the transmit case, a plurality of receive paths can be connected via the antenna switch (190) to a plurality of LNAs of a transceiver unit.

In the circuital arrangement of FIG. 1, a dual directional coupler (192) between the antenna (198) and the antenna switch (190) can be used to detect a mismatch in a transmit and/or receive path and therefore can allow tuning the transmit and/or a receive path of the circuit according to the detected mismatch. Upon detection of a transmitted and a reflected waveform at terminals (193) and (194) of the dual directional coupler (192), a VSWR at the antenna can be derived and a compensating action upon adjustable elements of the antenna or other adjustable elements within the transmit path or amplifier itself can be performed such as to tune the circuital arrangement for a reduction in VSWR. This is shown in the exemplary embodiment depicted in FIG. 2, wherein a tunable match network (230) can be coupled to the antenna (198) to tune the antenna for VSWR reduction. Alternatively or in addition, a similar tunable match (235) can be coupled to the amplifier (150) which can be used to reduce VSWR contributed by an impedance mismatch at the output of the amplifier. Using the same directional coupler (192) of FIG. 2, a VSWR of a received signal at the input of a tuning circuit (203) can be measured using transmitted and reflected waveforms at terminals (193) and (194) of the dual directional coupler (192), and reduced via adjustments to the tuning circuit (203).

Figure 2:
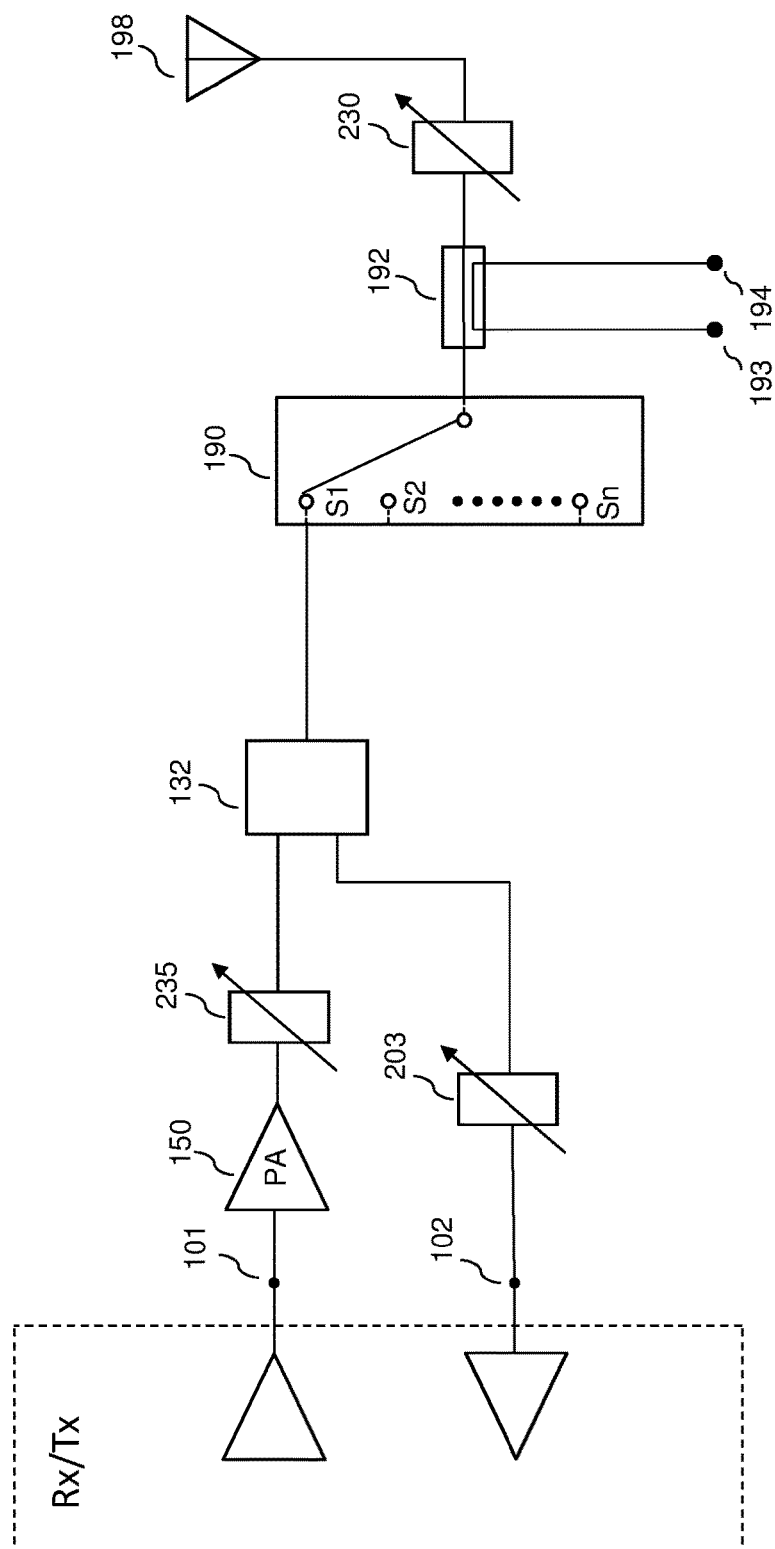
FIG. 2 shows an RF circuital arrangement wherein tuning elements within a transmit and/or receive RF path can be used to adjust characteristics of a path based on a VSWR signal detected by a dual directional coupler.

Although the dual directional coupler (192) of FIG. 2 can provide some information on the matching quality at the point where it is placed (e.g. between antenna and switch) and help in reducing (e.g. via match tuning) signal reflection at that point, it cannot provide information on the matching quality of the power amplifier module (150) to the tunable match circuit (235). As such, tuning of the matching at the antenna via the dual directional coupler (192) is performed irrespective of the quality of matching between the amplifier module (150) and the tunable match circuit (235). This shortcoming can be solved by placing an additional dual directional coupler at the vicinity of the power amplifier module and use it to locally detect a mismatch due to the amplifier output. However, such configuration can be impractical due to the size of such directional coupler and the added insertion loss it can provide. Furthermore, for a case where a transmit and/or receive path is used for several modes/channels (e.g. RF signals operating at various different center frequencies), more than one such dual directional coupler may be needed to support the wider range of frequencies being used, and therefore even higher insertion loss due to the usage of more couplers can be expected. It follows that the various teachings according to the present disclosure provide methods and devices to detect and reduce a mismatch at points in the transmit path without using a dual directional coupler. Such mismatch, which can contribute, for example, to a VSWR component, can be measured at any point within the transmit path and not restricted to a point a the vicinity of the antenna, as, for example, depicted in FIGS. 1-2. In this context, a mismatch can be defined by a deviation of an operating parameter value within a transmit and/or receive path from a desired value, such as measured, for example, by characteristic operating signal such as a voltage and/or a current at a given point of a corresponding circuit.

Figure 3A:
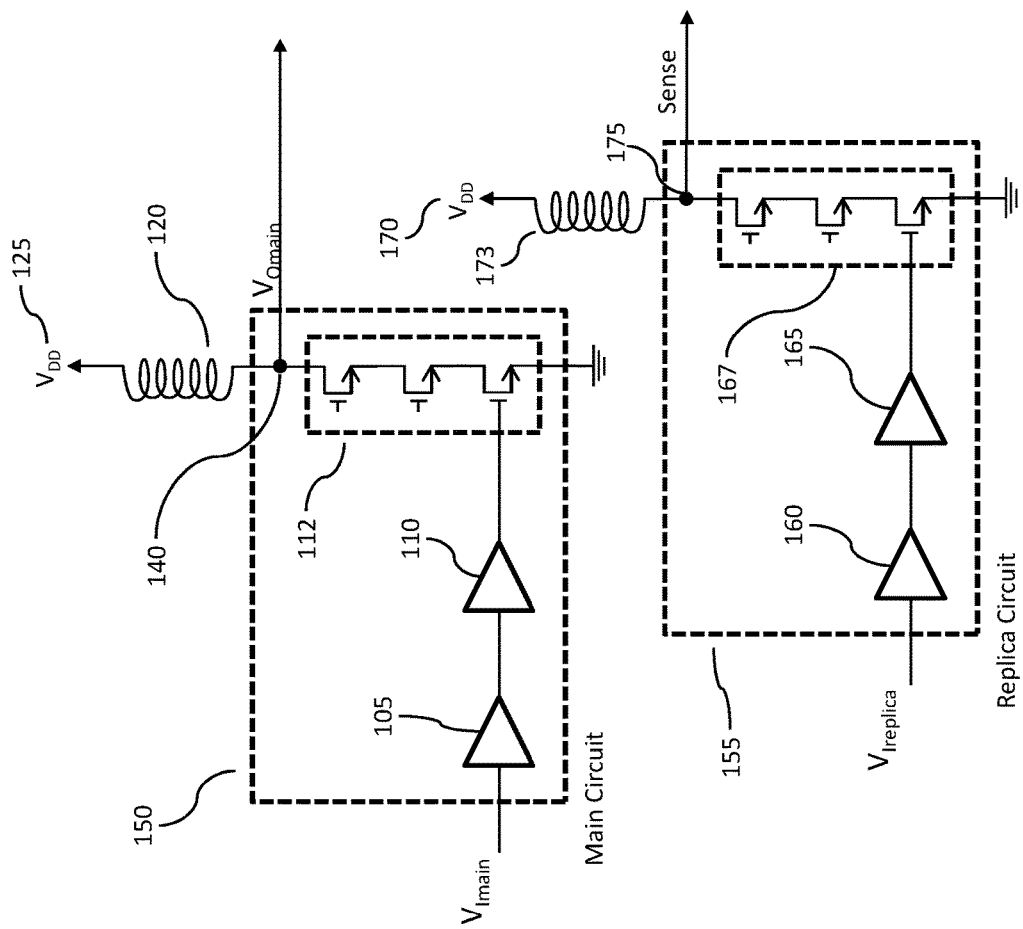
FIGS. 3A-3B show an RF circuital arrangement comprising a main circuit and a replica circuit, the replica circuit being a reduced size replica of the main circuit and capable of tracking a characteristic of the main circuit.
Figure 3B:
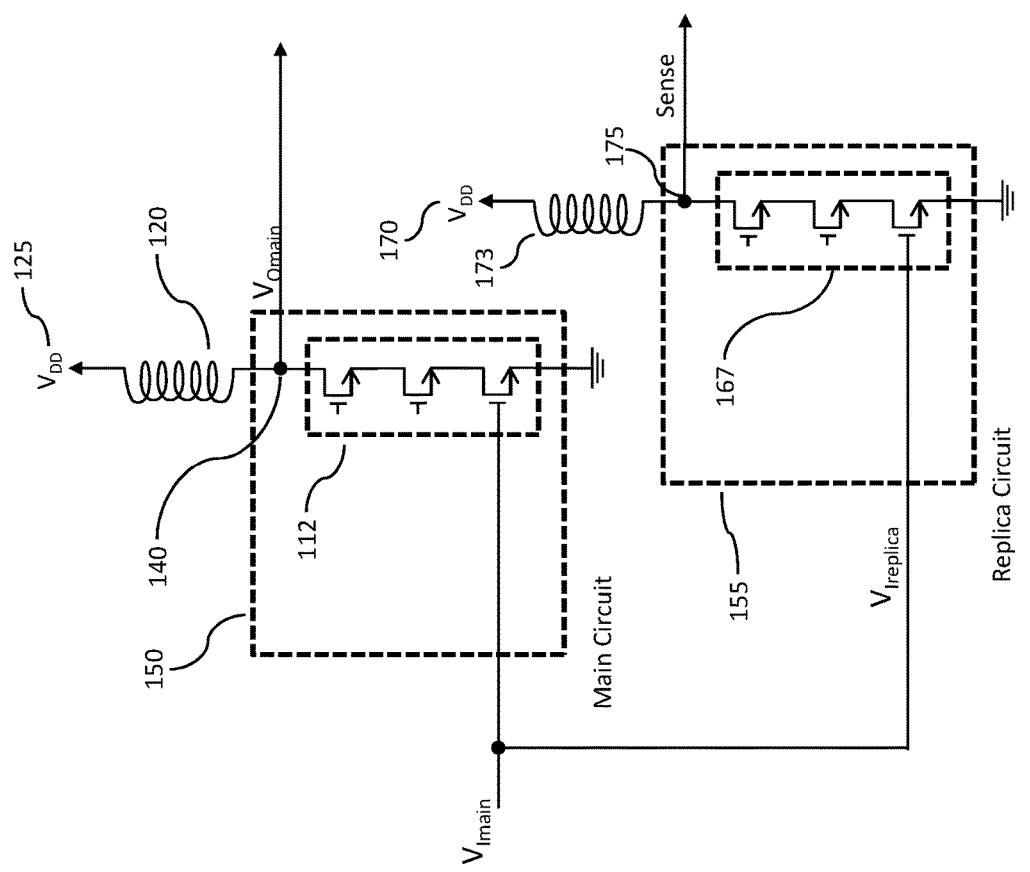
Figure 4:
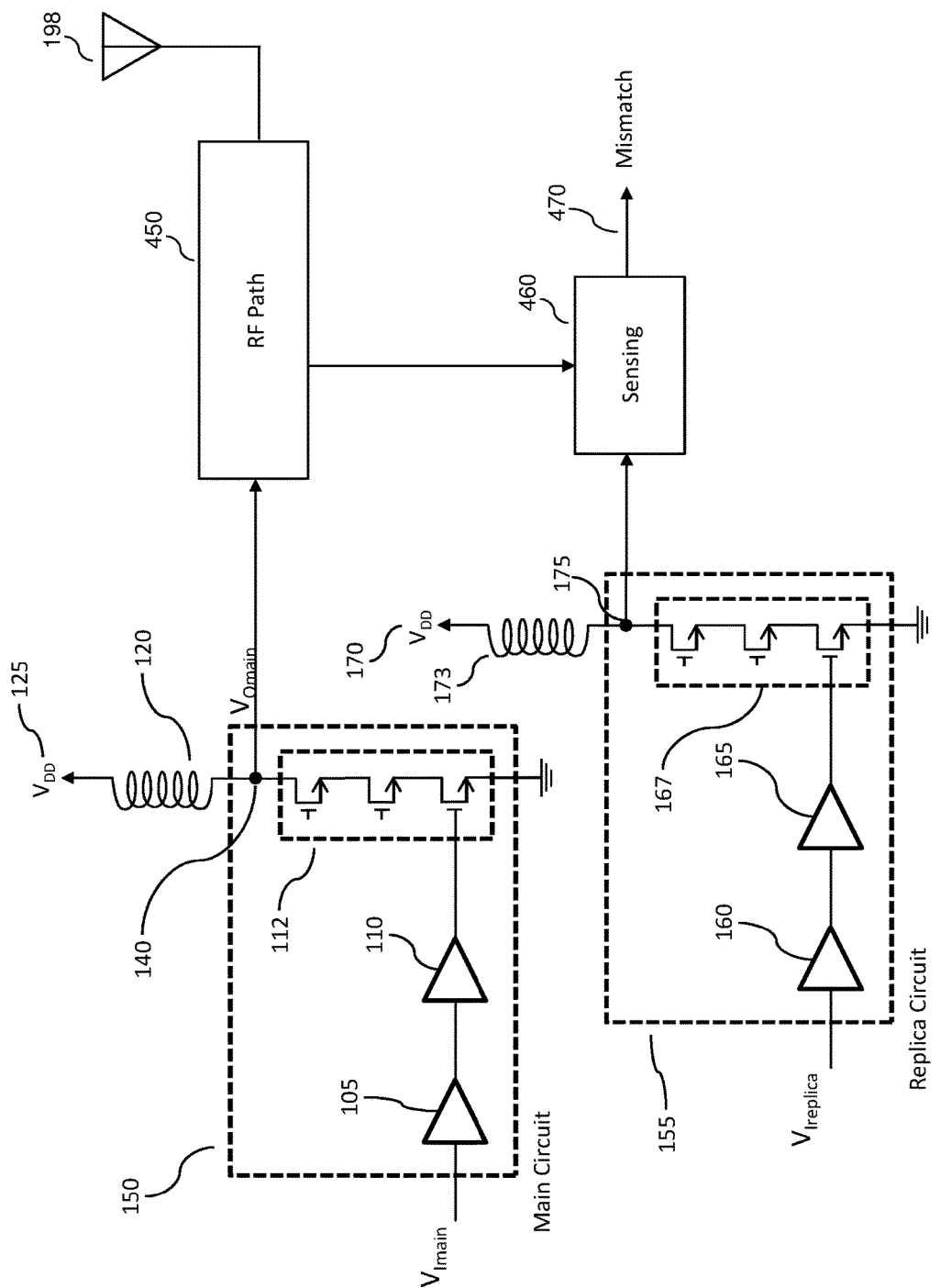
FIG. 4 shows an arrangement according to an embodiment of the present disclosure wherein a replica circuit is used as a reference circuit to detect a mismatch in an operating characteristic of a main circuit.

According to an aspect of the present disclosure, FIG. 3A shows a main circuit (150) which can be used as an RF amplification module in an RF transmit path, and a replica circuit (155) which can be used to detect a mismatch condition in the transmit path. An exemplary circuital arrangement for mismatch detection using the main circuit (150) and the replica circuit (155) (e.g. and without usage of a directional coupler) is shown in FIG. 4, and is described in ensuing sections of the present disclosure. The main circuit (150) (e.g. a power amplifier module) of FIG. 3A can comprise one or more amplifiers (e.g. 105, 110) followed by a final amplifier stage (112). In some other embodiments according to the present disclosure the main circuit (150) can comprise only the final amplifier stage (112) without the cascaded pre-drivers (105, 110), as depicted in FIG. 3B. A main circuit input voltage signal Vimain can be fed into the main circuit (150) to be amplified, beginning, for example, with amplifier (105). Biasing of the final amplifier stage (112) for a desired operation of the amplifier can be provided via bias voltage(s) fed to the gates of the various constituent transistors, and as described, for example, in the referenced U.S. Pat. No. 7,248,120 and U.S. application Ser. No. 13/829,946, both of which are incorporated herein by reference in their entirety. In the exemplary embodiment depicted in FIGS. 3A-3B, the final amplifier stage (112) can comprise a plurality of stacked amplifiers, although according to other embodiments according to the present disclosure the final amplifier stage can comprise a single transistor (e.g. stack height of one). An output node (140) of the main circuit (150) is connected through an inductor (120) to a supply voltage (125). An amplified RF output of the main circuit (150) can be observed at the output mode (140) which in a typical arrangement can be connected to some type of load and/or matching circuit as depicted in the various figures of the present disclosure.

Although the amplifier stage (112) of FIGS. 3A-3B is shown as comprising a plurality of stacked FET transistors (e.g. MOSFETs), the skilled person would also recognize that other types of transistors, whether stacked or single, such as, for example, bipolar junction transistors (BJTs) can be used instead or in combination with the N-type or P-type MOSFETs of the stack of (112). Also, as previously noted a stack height more than one, as depicted by (112) in FIGS. 3A-3B, is purely exemplary as teachings according to the present disclosure equally apply to stacks comprising a single transistor each. However, the person skilled in the art will appreciate some of the benefits provided by higher stack heights, such as a power handling capability greater than a power handling capability of a single transistor stack, because a voltage present across a single transistor may be sufficiently high to damage the one transistor, as opposed to dividing the voltage across the multiple transistors of a higher height stack. More information about stacked transistors of height greater than one can be found, for example, in U.S. Pat. No. 7,248,120, issued on Jul. 24, 2007, entitled "Stacked Transistor Method and Apparatus", which is incorporated herein by reference in its entirety. Although not shown in FIGS. 3A-3B, gate capacitors can be added to the gates of the cascode devices (e.g. FETs above the input FET) of the stack, such as to allow gate voltages (voltage across the respective gate capacitor) of the cascode devices (e.g. FETs), respectively, to float, that is let the gate voltages vary along with the RF signal at the drain of the corresponding FET of the stack, which consequently allow control (e.g. evenly distribute) of the voltage drop across the cascode devices for a more efficient operation of the transistor stacks. See for example, the referenced U.S. Pat. No. 7,248,120, whose disclosure is incorporated herein by reference in its entirety, for more information. Higher stack heights can, for example, be achieved when using non bulk-Silicon technology, such as insulated Silicon on Sapphire (SOS) technology and silicon on insulated (SOI) technology. In general, the various circuits used in the various embodiments of the present disclosure, such as the main circuit (150) and the replica circuit (155), when monolithically integrated, can be constructed using CMOS, silicon germanium (SiGe), gallium arsenide (GaAs), gallium nitride (GaN), bipolar transistors, or any other viable semiconductor technology and architecture known to the person skilled in the art.

An aspect in accordance with several embodiments of the present disclosure is to use a replica circuit (155), with input voltages and bias voltages similar (e.g. same or scaled) to the main circuit (150), that is smaller (e.g. with respect to operating power, current and also physical size) than the main circuit (150), and that is essentially impedance matched at its output, as a reference to an operating condition of the main circuit. In other words, the replica circuit being essentially impedance matched at its output is therefore configured to see at its output node (175), at all time and under all operating conditions, an impedance which represents a desired matched impedance at the output of the main circuit (150). Because the replica circuit (155) is essentially impedance matched, during operation the replica circuit (155) can be construed as an ideal version of the main circuit (150) under operation. Identical output characteristics, such as, for example, power, voltage, current, etc. . . . from both the main circuit (150) and the replica circuit (155), can indicate that the main circuit (150) is operating under ideal (e.g. desired) impedance matching conditions (e.g. essentially impedance matched), and therefore is not experiencing an impedance mismatch. A difference in an output characteristic (e.g. operating characteristic) observed between the output (140) of the main circuit (150) and the output (175) of the replica circuit (155) can indicate a deviation from ideal impedance matching conditions, and therefore indicate an impedance mismatch at the output (140) of the main circuit (150). A voltage signal, a current signal or a power signal can be exemplary output characteristics of the replica and main circuit. The person skilled in the art will understand that the input voltage to the replica circuit (155) need not be exactly the same as the input voltage to the main circuit (150), as a scaled voltage derived from the input voltage $V_{Imain}$ provided to the main circuit (150) can be provided to the replica circuit (155) as $V_{Ireplica}$, and still use the replica circuit as a reference. Similarly, the output characteristics (e.g. voltages, currents, power, etc. . . . ) from the two circuits need not be exactly the same to indicate an ideal match so long a known relationship between these characteristics indicating an ideal match is established, such as for example the case where a scaled input voltage is provided to the replica circuit, and/or the case where the gain of the replica circuit (155) is a scaled version of the gain of the main circuit (150).

According to one exemplary embodiment of the present disclosure, the replica circuit (155) can comprise an identical arrangement of components (e.g. with reduced size) to the arrangement of the main circuit (150). Accordingly and with further reference to FIG. 3A, the replica circuit (155) can comprise one or more amplifiers (160, 165) followed by a final amplifier stage (167), similar to an arrangement of the main circuit (150). In this embodiment, the final amplifier stage (167) can comprise a plurality of stacked amplifiers as depicted in FIG. 3A, but as previously noted alternative arrangements comprising a single amplifier comprising a stack height of one or more are also possible, as depicted in FIG. 3B. A replica circuit input voltage signal $V_{Ireplica}$ that can be identical or scaled to the main circuit input voltage signal $V_{Imain}$ can be fed into the replica circuit (155), beginning, for example, with amplifier (160). According to some embodiments of the present disclosure, the two inputs can be tied together to receive a same input signal, as depicted in FIG. 3B. An output node (175) of the replica circuit (155) can be connected through an inductor (173) to a supply voltage (170) of the replica circuit (155). The supply voltage (170) of the replica circuit (155) can provide voltage equal to that provided by the supply voltage (125) of the main circuit (150) (e.g. can be a same supply). As previously noted, biasing to the final stage (167) can also be same or a scaled version of biasing provided to final stage (112) of the main circuit.

According to an embodiment of the present disclosure, devices within the replica circuit (155) are smaller than devices within the main circuit (150). By way of example, and not of limitation, devices within the replica circuit (155) can be approximately $\frac{1}{100}^{th}$ the size of devices within the main circuit (150) so as to draw less current and use less power (e.g. about $\frac{1}{100}^{th}$ or less current and power usage) than the main circuit (150) and so that when monolithically integrated can consume less circuit die area. U.S. Patent Application No. (PER-097), which is incorporated herein by reference in its entirety, further describes a replica circuit of smaller size than a main circuit. According to other embodiments of the present disclosure, replica circuit size can be even smaller than $\frac{1}{100}^{th}$ and down to $\frac{1}{1000}^{th}$ or less the size of the main circuit for even less power consumption and more compact monolithic integration. According to a further embodiment of the present disclosure, by monolithically integrating the main circuit (150) and the replica circuit (155) on a same die, the two circuits can be matched in temperature and by fabricating the two circuits using a same technology (e.g. same device parameters), both circuits drift in a similar manner with respect to temperature. Therefore, a drift in operation of the main circuit (150) can cause a similar drift in operation of the replica circuit (155), in other words, the two circuits can track each other. By further monolithically integrating a load associated to the replica circuit, such as, for example, loads ($Z_1$, $Z_3$) of FIG. 5A and/or load (777) depicted in FIG. 7, both figures being later described, with the replica circuits (and main circuit), impedance matching between the replica circuit (155) and the load (777) can be maintained irrespective of a temperature drift. Therefore when the main circuit, replica circuit and the load are monolithically integrated and fabricated using a same fabrication technology, the combination of the replica circuit (155) and the load (777) can be used as a reference setup for matching of the main circuit (150) to the output load (735).

FIG. 4 shows an aspect of the present teachings using the replica circuit (155) as a reference circuit to the main circuit (150), to detect a mismatch condition in an RF path (450) coupled to the output node (140) of the main circuit (150). A sensing circuit (460) coupled at a sensing point of the RF path (450) and coupled to the replica circuit (155), can compare an actual operating characteristic (e.g. voltage, current, power, etc. . . . ) of the main circuit (150) to a desired (e.g. reference) operating characteristic of the replica circuit (155). The sensing circuit can be coupled at a point of the RF path defined by an expected impedance (e.g. at a given operating frequency) between the output of the main circuit and that point of the RF path. The sensing circuit can also provide a loading to the replica circuit (155) to match the expected loading provided to the main circuit (150) by the RF path (450) and therefore sense an operating characteristic of the replica circuit at a point equivalent to the sensing point at the RF path. By comparing an operating characteristic (at a sensing point) of the main circuit under an actual load to an operating characteristic of the replica circuit under a provided (e.g. by the sensing circuit) reference load, the reference load being, for example, a fixed load representing a desired actual load, a mismatch condition at the sensing point of the RF path can be detected. The mismatch can represent, for example, a VSWR condition at the sensing point of the RF path. The operating characteristic can be a voltage, a current, a power or any other characteristic defining operation of an amplification stage under load and a VSWR condition, for example, can be derived from an associated mismatch of the operating characteristic.

Figure 5A:
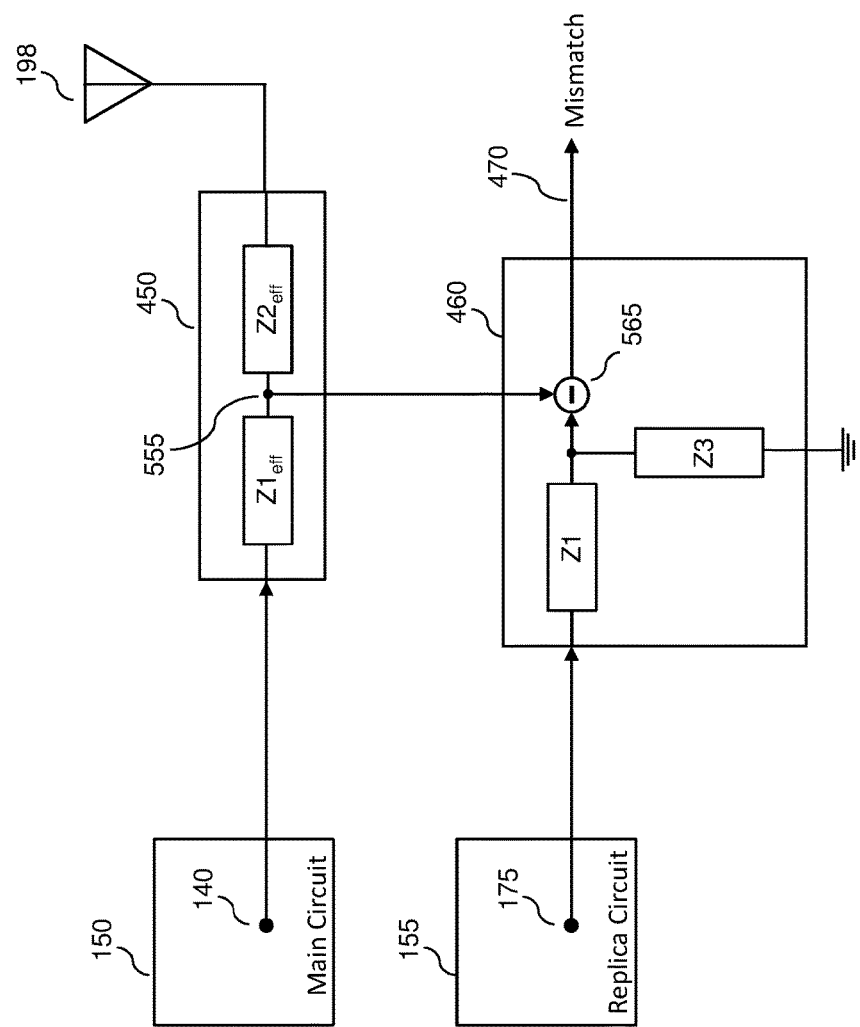
FIG. 5A shows some details of the output loading of the main circuit and the replica circuit of the arrangement represented in FIG. 4.

As depicted in FIG. 4, the sensing circuit can subsequent to a comparison of an operating characteristic of the main and the replica circuits provide a control signal at its output (470) to indicate a degree of mismatch, as measured, for example, by a difference in value between the two detected operating characteristics. For example, if the operating characteristic is a current, then the output signal at node (470) of the sensing circuit (460) can be, for example, a voltage representing the difference between a current output by the main circuit (150) and detected at the sensing point of the RF path (450), and a current output by the replica circuit (155) and detected at an equivalent point within an output load of the replica circuit, as depicted in FIG. 5A. According to some embodiments of the present disclosure, the degree of mismatch can be used to detect a fault in operation of the combined main circuit, RF path and associated load. For example, in a case where the degree of mismatch exceeds a reasonable threshold determined by various production and quality control tests of the circuital arrangement depicted in FIG. 4, then it would be reasonable to associate such a degree of mismatch to a fault in operation of the combined main circuit, RF path and associated load. The person skilled in the art readily understands that by virtue of its reduced size, lower power consumption and possible tight integration, the replica circuit and associated load can be less susceptible to damage resulting in an operational fault than the combined main circuit, RF path and associated load (e.g. antenna). More details with respect to fault detection using the replica circuit can be found in later paragraphs of the present disclosure.

FIG. 5A represents the circuital arrangement of FIG. 4 wherein the RF path (450) and the sensing circuit (460) are represented by exemplary equivalent impedances. For example, the RF path (450) can comprise two elements, represented by their equivalent effective operating impedances $Z_{1eff}$ and $Z_{2eff}$, followed by the antenna (198). On the other hand, the sensing circuit can be designed to comprise two impedances $Z_1$ and $Z_3$ representing equivalent impedances of the RF path (450) under desired (e.g. matching) operating conditions. For example, $Z_1$ can have a value representing a desired matching value for $Z_{1eff}$ and $Z_3$ can have a value representing a desired matching value of $Z_{2eff}$ in series with a desired matching value of the antenna impedance. As such, the load seen by the replica circuit (155) can be, under all operating conditions, a matched load for a desired operating performance of the main circuit (150). It should be noted that such (equivalent) impedances can be reactive and/or resistive depending on the design of the RF path (450). Additionally, FIG. 5A shows a sensing point (555) of the RF path (450) which is used to detect, by the sensing circuit (460), an operating characteristic of the main circuit under load (e.g. load provided by the RF path and antenna). A signal, such as for example a voltage, at operating point (555) is routed to a comparison circuit block (565) of the sensing circuit (460) which compares the signal at the operating point (555) with a reference signal at a point in the load provided to the replica circuit equivalent to the operating point (555).

Figure 5B:
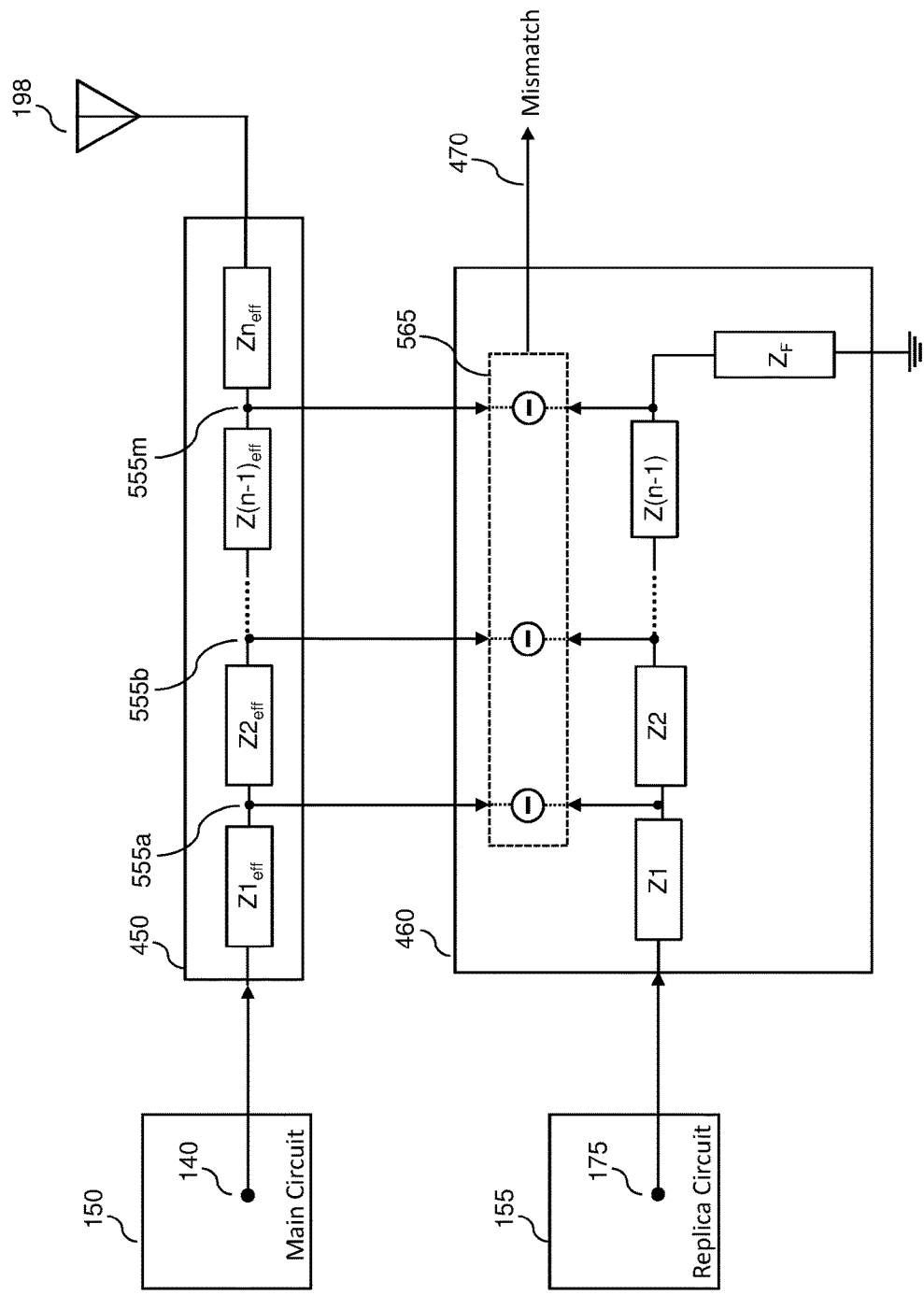
FIG. 5B shows a similar circuital representation as in FIG. 5A, for a case where the mismatch is detected for a plurality of operating points within an RF path coupled to the main circuit.

Although the exemplary embodiment according to the present disclosure and as depicted in FIG. 5A shows sensing one point within the RF path (450) and comparing to a reference point obtained via the replica circuit and a provided load which represents a desired matched load provided to the main circuit (150) via the RF path (450), the person skilled in the art will realize how this same concept can be extended to a plurality of different sensing points in the RF path (450), each sensing point having an equivalent point in an output path of the replica circuit and as provided by a design of the corresponding load and depicted in FIG. 5B.

According to a further embodiment of the present disclosure, FIG. 5B shows an exemplary implementation where a plurality of operating points (555a, 555b, . . . , 555m) in the RF path (450) coupled to the main circuit (150) are sensed by a sensing circuit (460) and compared, via a comparison circuit (565), to a set of reference operating points obtained via an impedance network ($Z_1, Z_2, \ldots, Z_{(n-1)}, Z_F$) coupled to the reference replica circuit (155). As described in the previous sections and referring to FIG. 5A, the impedance network ($Z_1, Z_2, \ldots, Z_{(n-1)}, Z_F$) is designed to provide a loading configuration to the replica circuit (155) equivalent to a matched loading provided to the main circuit (150) via the RF path (450), the matched loading providing a desired operating characteristics to the main circuit (150). According to the embodiment of the present disclosure depicted by FIG. 5B, the comparison circuit (565) senses and compares an actual operating point in the RF path with a reference operating point in the impedance network and outputs a signal representing the result of such sensing and comparison. Such signal can be output at the terminal (470) of the sensing circuit (460).

With further reference to FIG. 5B, since a plurality of operating points are sensed and compared, the output signal at the terminal (470) can comprise a plurality of signals, each corresponding to a comparison of one sensed operating point. Alternatively, and as within the ability of a person skilled in the art, other circuit implementations can be devised such as to provide the task of sensing and comparing. In one possible exemplary implementation, switches can be used to select and feed one operating point signal and a corresponding reference signal to a same sensing and comparison circuit. In yet another possible implementation, a single mismatch signal can be output at terminal (470) under control of a control signal which can select the corresponding operating point. Such single mismatch signal can be associated to a real time sensing and comparison performed as per the requested control signal, or can be associated to a location in memory wherein the sensing circuit (460) stores measured mismatches.

Figure 6A:
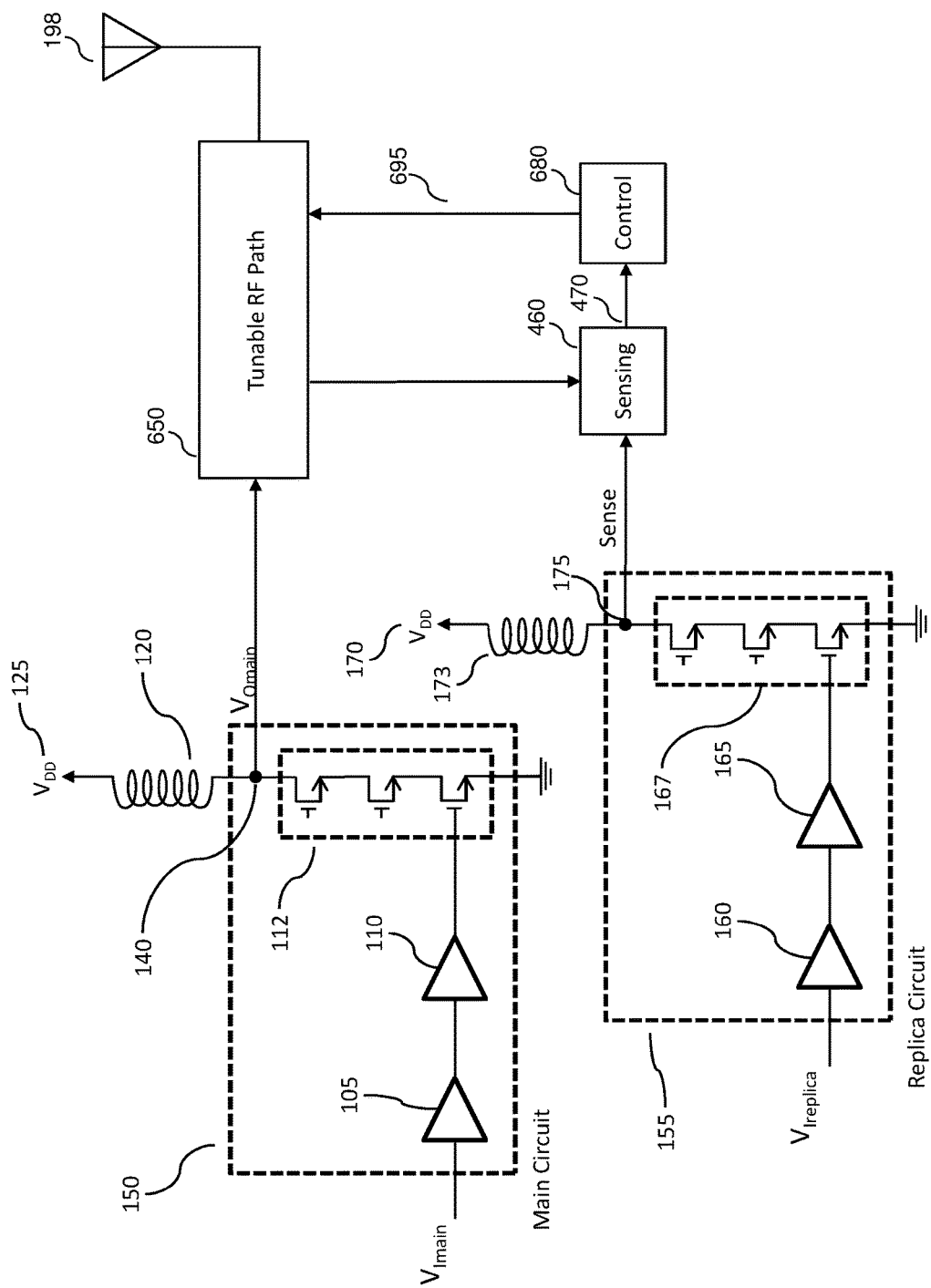
FIG. 6A shows an arrangement according to an embodiment of the present disclosure wherein a mismatch detected via the arrangement depicted in FIG. 4 is used to adjust a tunable RF path.

According to an embodiment of the present disclosure, by providing tunable elements in the RF path (450) of FIGS. 4, 5A-B, such tunable elements can be used to tune the RF path under control of one or more signals corresponding to the one or more mismatch signals provided at terminal (470), as depicted in FIG. 6A. As depicted in FIG. 6A, the one or more mismatch signals are provided to a control circuit (680) which in turn can scale (e.g. gain and/or offset) and/or further condition (e.g. A/D, D/A, V-I, I-V, etc. . . . ) the received signals and use to control the tunable elements of the tunable RF path (650). For a given operating point, such control can be performed in a single step wherein a one-time adjustment of one or more tuning elements affecting the given operating point is performed using one or more signals from (470), or multiple steps wherein an adjustment uses several consecutive such single steps, wherein each single step is followed by a subsequent sensing and comparison of the given operating point resulting in an updated set of measured mismatches reflecting changes in the given operating point due to the previous adjustment step, such as for example, per a feedback control scheme.

With further reference to the detection of a fault in operation of the combination of the main circuit, tunable RF path and associated output load, according to one embodiment of the present disclosure, the tunable RF path (650) can be tuned, for example during a factory test phase, to determine an ideal matching of the main circuit (150) to the output load (198). Based on such ideal matching, a loading impedance network ($Z_1, Z_2, \ldots, Z_{(n-1)}, Z_F$) to the replica circuit (155) is provided and an associated tuned configuration of the RF path can be stored (e.g. memory storage). Such tuned configuration can comprise all controlling/tuning values to the various tunable elements of the tunable RF path such as to enable restoring of the ideal matching condition obtained during the factory test. During a different phase, such as an end-product test phase, where the circuit is operative in an end-product (e.g. cellular phone), the stored tuned configuration can be restored (e.g. recalled) and a mismatch in operating characteristic between an operating point (e.g. 555a, 555b, . . . , 555m) in the RF path and an associated reference operating point in the loading impedance network ($Z_1, Z_2, \ldots, Z_{(n-1)}, Z_F$) of the replica circuit (155) can be detected. In such configuration a mismatch larger in amplitude (e.g. absolute value) than a certain factory preset value can be made to indicate a fault in the combination main circuit (150), tunable RF path (650) and output load (198). According to further embodiments, such mismatch can be checked over time to see if anything in the circuit degrades.

Figure 6B:
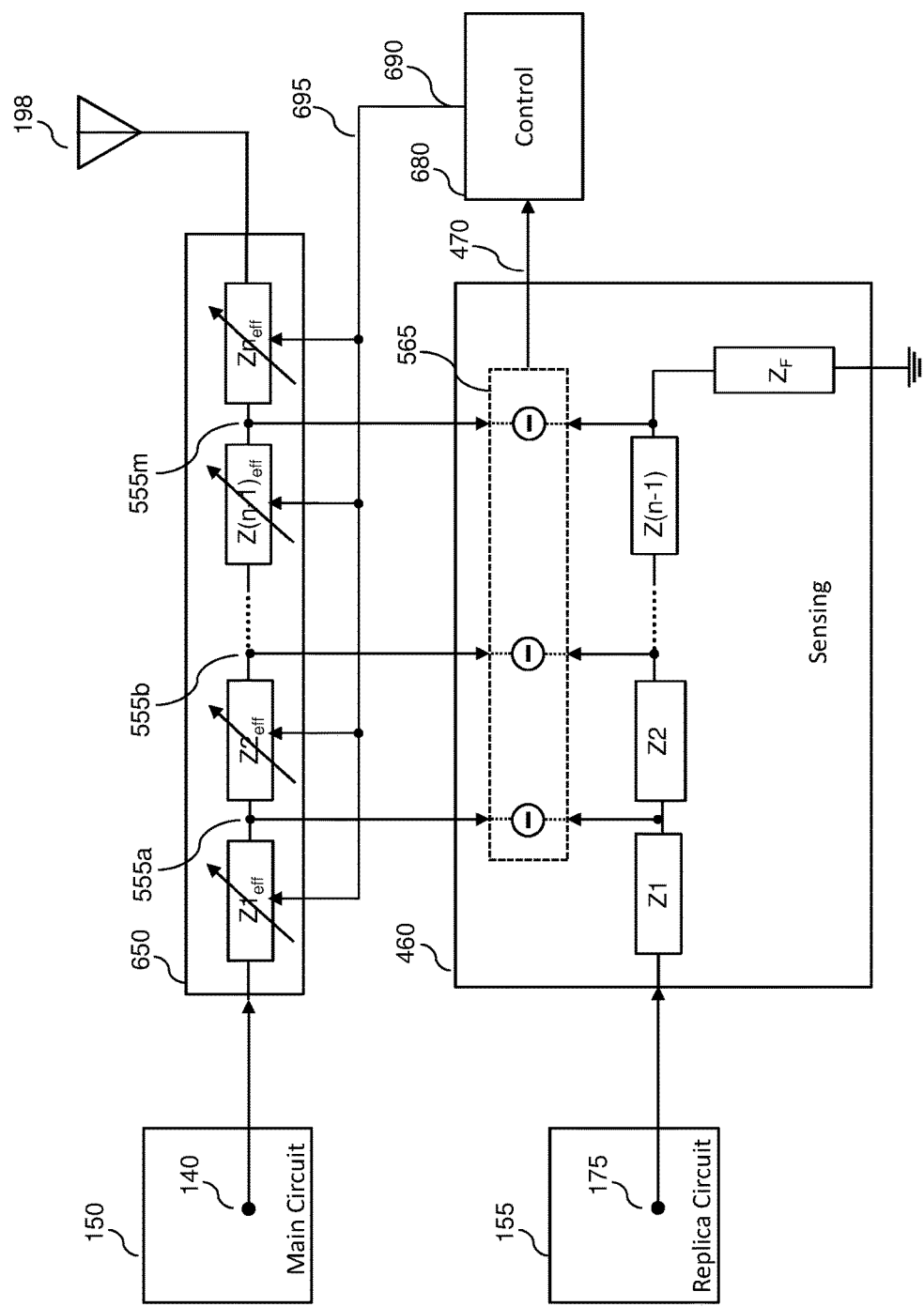
FIG. 6B shows more details of the tuning elements used in the arrangement of FIG. 6A.

FIG. 6B is an exemplary representation of the circuital arrangement of FIG. 6A, wherein some internal details of the tunable RF path (650) and the sensing circuit (460) are represented. As represented in the exemplary circuital representation of FIG. 6B, the tunable RF path (650) can comprise one or more tunable elements ($Z_{1eff}, Z_{2eff}, \ldots, Z_{neff}$) which can each be controlled via a control signal provided at terminal (690) of the control circuit (680). In a preferred implementation, the control circuit can adjust, either via a single step or a plurality of sequential steps, a tunable element ($Z_{1eff}, Z_{2eff}, \ldots, Z_{neff}$) of the tunable RF path (650) such as to minimize a difference (e.g. a difference signal) in operating characteristic between a sensed operating point (555a, 555b, . . . , 555m) of the tunable RF path (650) and a corresponding reference operating point of the replica circuit as provided by the loading network ($Z_1, Z_2, \ldots, Z_{(n-1)}, Z_F$), and thereby obtaining a desired matched (e.g. essentially matched) operating mode of the main circuit with respect to its load (650, 198).

Although not the focus of the teachings according to the present disclosure, the person skilled in the art will know how to devise a variety of tuning methods using the circuital arrangement of FIGS. 6A-6B. In cases where more than two tunable elements are to be tuned, one may choose to tune each tunable element in a sequence, starting from the closest to the main circuit (150), such as ($Z_{1eff}$) and ending with the furthest ($Z_{neff}$), or vice versa. In other embodiments, the tunable RF path (650) may be divided in various stages (e.g. segments), each stage comprising one or more sequential (tunable) elements, and isolating each stage via a switch and a dummy load (e.g. a terminating switch), such as to allow adjusting each stage independently from a next stage (or stages). According to some embodiments of the present disclosure, each dummy load can represent a matched (desired) load of the RF path (450, 650) seen by a previous stage. Such embodiment according to the present disclosure is depicted in FIG. 6D, where a terminating switch (630) inserted between two tunable elements (625, 635) of the tunable RF path (650) can be used to tune a segment (e.g. stage) of the RF path (650) based on a sensed signal at an operating point (555a) of the RF path. According to this embodiment, the terminating switch can provide an ideal termination (632a) (e.g. $Z_L$, which can be a resistive or a reactive load) of the RF path at the operating point (555a) while isolating a segment of the RF path starting from tunable element (635). Therefore, a mismatch detected via a difference signal based on the operating point (555a) can represent an adjustment to be provided to the tunable element (625) in order to tune the RF path. Although FIG. 6D shows a single terminating switch for simplicity of the drawing, the skilled person readily understands that such terminating switch can be placed at various operating points in the RF path (650), such as, for example, points (555a, 555b, ..., 555m), with a terminating load value according to the position of the switch within the RF path (650). Although not shown in FIG. 6D, in a case where the RF path is configured to operate according to different modes of operation (e.g. operating modes, see next section), the terminating load (632a) (e.g. of value $Z_L$) of the terminating switch can be made to be configurable and adapted to a selected mode of operation. More information about a terminating switch and related implementations in an RF circuit can be found, for example, in the above references US Patent Publication No. 2015/0326326-A1, whose disclosure is incorporated herein by reference in its entirety.

According to a further embodiment of the present disclosure, the terminating switch (630) can be used to detect a fault in operation of the combination main circuit (150), tunable RF path (650) and output load (198). Such switch can further pin point a segment of the combination where a fault in operation is occurring, the segment being delimited by the position of the terminating switch within the RF path. For example and with reference to FIG. 6D, the terminating switch (630) can provide an ideal matching condition, by terminating the RF path with load $Z_L$ at operating point (555a) of the RF path (650), and therefore a mismatch detected with respect to the operating point larger than the factory preset value when the tunable RF path is restored to the factory preset tuned configuration can indicate a fault in the segment of the RF path prior to the operating point (555a) or in the main circuit (150). Furthermore and according to further embodiments of the present disclosure, by inserting a plurality of terminating switches in the tunable RF path, as indicated in the prior section of the present disclosure, fault detection can be performed progressively such as to allow isolation of a fault within a segment of the RF path defined by two consecutive terminating switches. In a case where a terminating switch is placed between the antenna (198) and the RF path (650), fault detection with respect to the antenna can also be achieved (e.g. FIG. 6E, later described). For example, a reasonable mismatch (e.g. within factory preset value) with respect to operating point (555p) when the terminating switch is active (e.g. RF path terminated into load $Z_L$) and a mismatch larger than factory preset value when the terminating switch is inactive, can indicate a malfunction in the antenna circuitry (198).

According to some embodiment of the present disclosure, the main circuit (150) and the corresponding RF path (450, 650) can be configured to operate in a plurality of operating modes, wherein each mode can be associated with a different operating frequency and/or modulation scheme of a transmitted RF signal via the combination (150), (450, 650) and antenna (198). In such configuration, various tuning elements ($Z_{1eff}, Z_{2eff}, \ldots, Z_{neff}$) of the RF path (450, 650) are used to tune the RF path according to a desired/selected mode of operation. Similarly to the discussion presented above, each mode of operation can be associated with a desired matched load represented by the various elements of the RF path (450, 650) and which can be factory preset using the various tuning elements and a lookup table, or similar, storing configuration control data for each specific mode. These stored configuration data can be used to drive the control circuit (680), or similar, as default values for the tuning of the RF path (450) with respect to the selected mode of operation. In such configuration, further tuning of the RF path (450, 650) for better matching during operation can be obtained via the combination replica circuit (155) and sensing circuit (460) as explained in the previous sections of the present disclosure and as depicted in FIG. 6C.

Figure 6C:
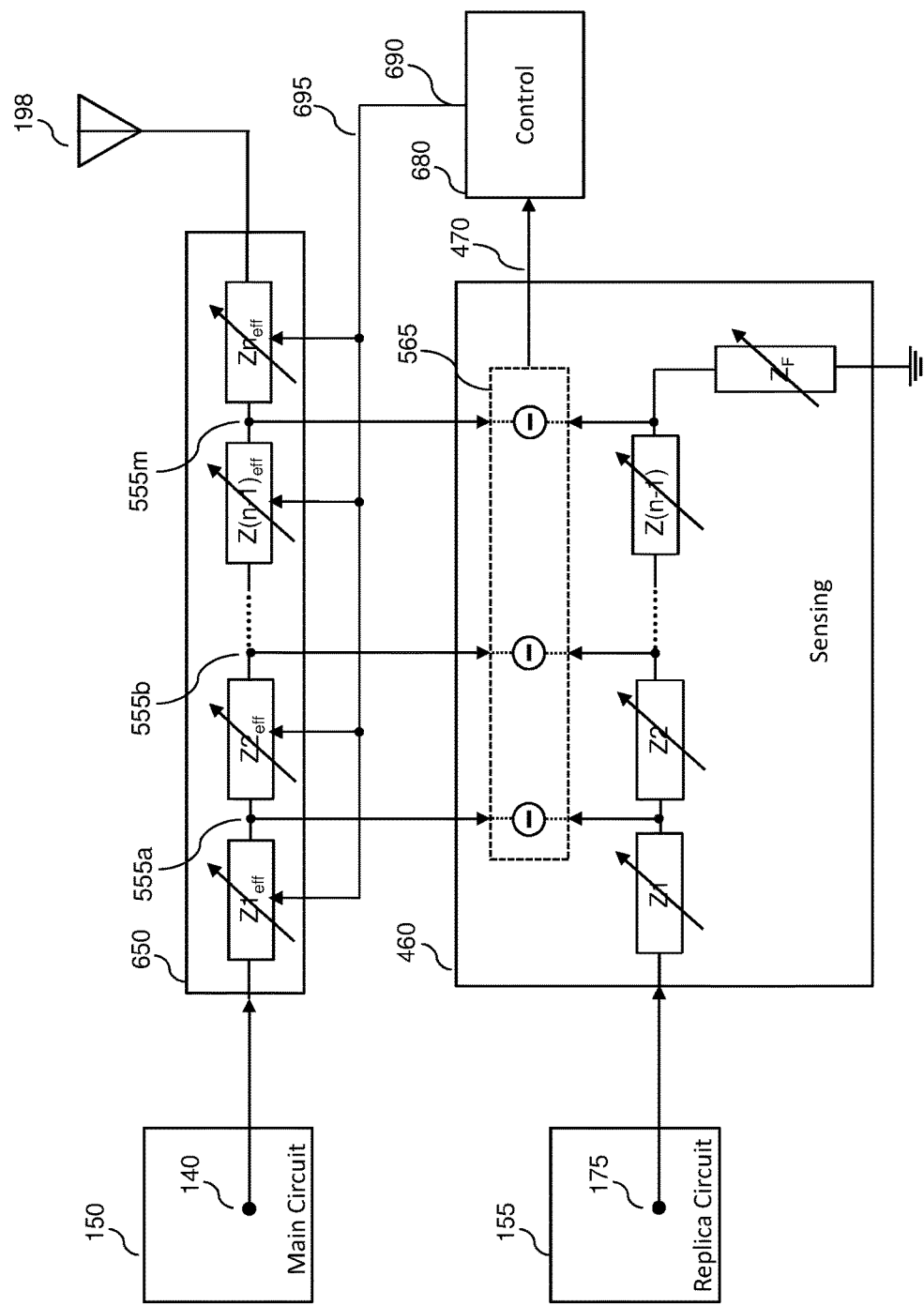
FIG. 6C shows an arrangement similar to one depicted in FIG. 6B wherein the arrangement is configured to operate at a plurality of modes of operation.
Figure 6D:
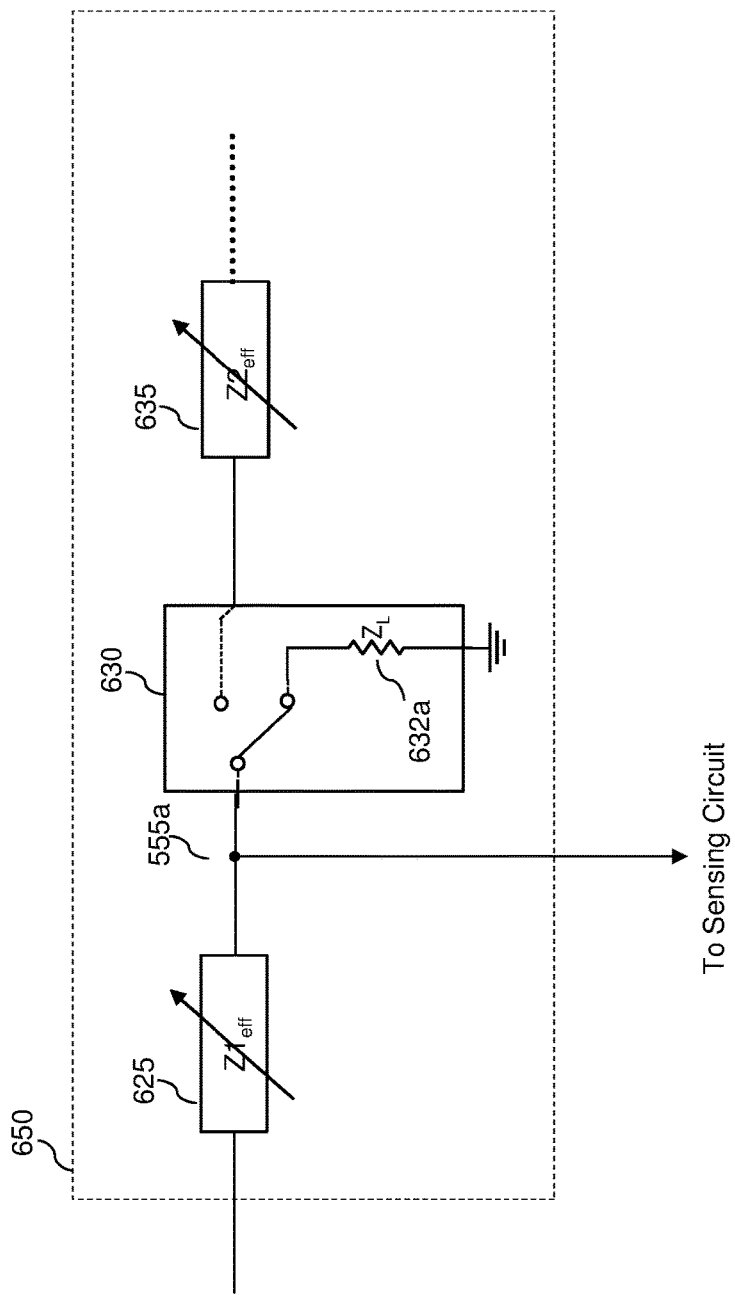
FIG. 6D shows a terminating switch which can be used to selectively tune a segment of a tunable RF path.

As depicted in FIG. 6C, the various loading elements ($Z_1, Z_2, \ldots, Z_{(n-1)}, Z_F$) provided to the replica circuit (155) via coupling to the sensing circuit (460) can be adjustable as to take values equal to (or representing) the factory preset matched values of ($Z_{1eff}, Z_{2eff}, \ldots, Z_{neff}$) for the various operating modes supported by the combination (150, 450, 198). As such, for a given selected mode of operation, the sensing circuit (460) is controlled to select a corresponding loading network configuration which can be used as a reference matching circuit to the replica circuit (155) for the selected mode of operation. This allows to further adjust the tuning of the RF path (650) with respect to its default configuration (e.g. provided by the default tuning values) using the tunable elements ($Z_{1eff}, Z_{2eff}, \ldots, Z_{neff}$) as per the various embodiments presented in the prior sections.

Figure 7:
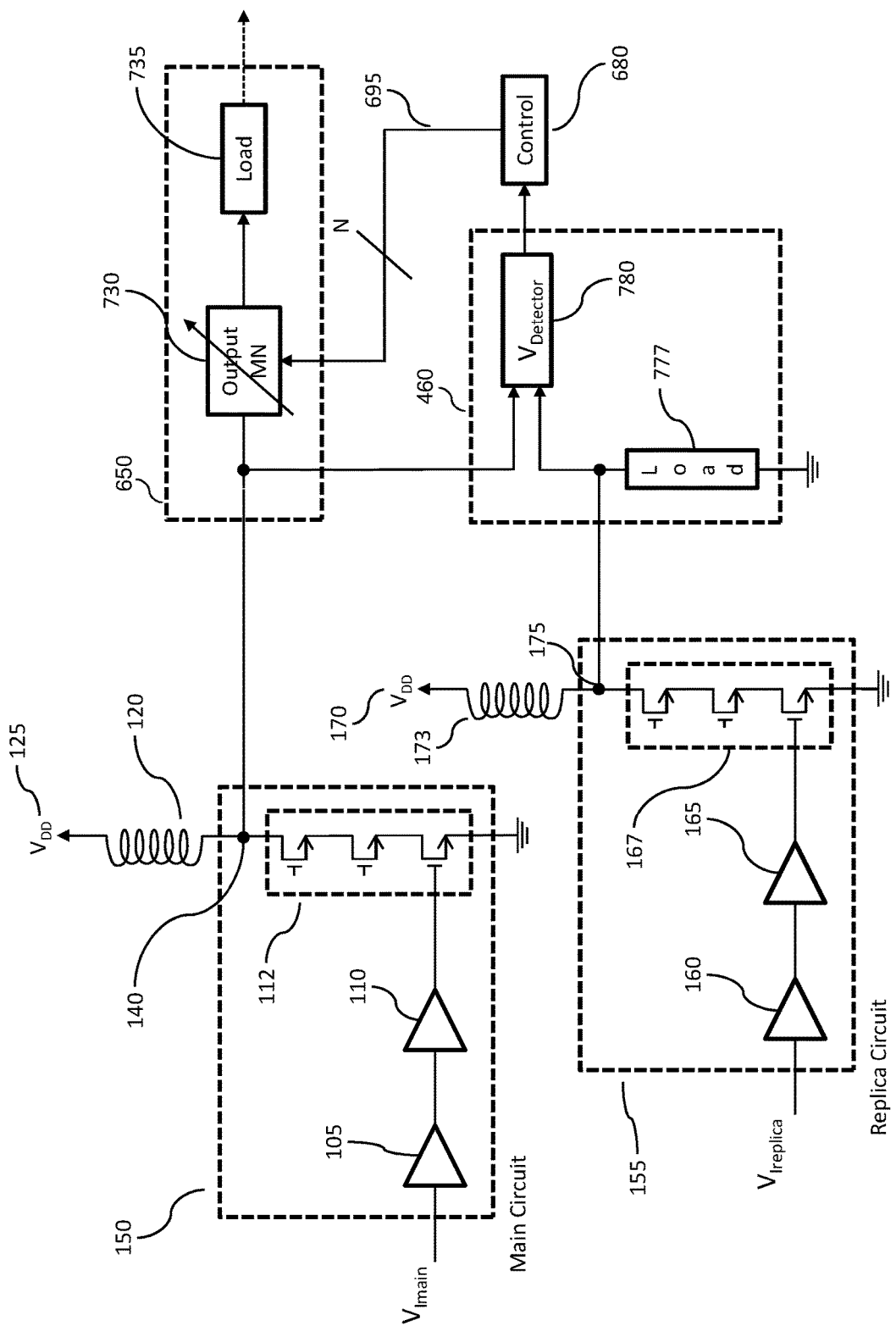
FIG. 7 shows an RF circuital arrangement capable of detecting an impedance mismatch, which can be used to derive a VSWR, according to an exemplary embodiment of the present disclosure.

FIG. 7 shows an exemplary implementation of the more general embodiments according to the present disclosure depicted in FIGS. 6A-6C. As previously noted ion the prior section of the present disclosure and as readily known to the person skilled in the art, the various elements comprised in the exemplary power amplifier module (150) of FIG. 7 do not necessary need to be as depicted, as many configurations for a power amplifier module are possible, such as a configuration comprising different number of amplifier stages (e.g. 105, 110, 112), such as one (e.g. 112 as per FIG. 3B) or two stages, or a configuration where the final amplifier stage (112) comprises a single RF transistor instead of the two or more stacked transistors depicted in FIG. 7. Configurations with two and more stacked RF transistors are described, for example, in U.S. Pat. No. 7,248,120, whose disclosure is incorporated herein by reference in its entirety. According to other exemplary embodiments, such amplifiers used in the amplifier module (150) can be configured for efficiency improvement operation, such as, for example, envelope tracking amplification as described in U.S. patent application Ser. No. 13/829,946, whose disclosure is incorporated herein by reference in its entirety, or other efficiency improvement schemes, such as, for example, average power tracking, Doherty, and linear amplification using nonlinear components (LINC). Scalable periphery amplifiers, as described, for example, in the referenced U.S. patent application Ser. No. 13/797,779, whose disclosure is incorporated herein by reference in its entirety, may also be used in the amplifier module (150). In a case where the amplifier module is a scalable periphery amplifier, comprising a plurality of parallel segments that can be selectively turned ON/OFF, the replica circuit may also comprise a reduced size scalable periphery amplifier with a plurality of reduced size parallel segments.

In the exemplary embodiment according to the present disclosure depicted in FIG. 7, the replica circuit (155) can be resistively loaded, but can also be inductively loaded in order to develop the same bias conditions and voltages as the main circuit (150). Load (777) represents the resistive or inductive load of the replica circuit (155). The replica circuit (155), the voltage detector (780), and the load (777) can be designed using standard techniques such that impedance of the output node (175) is matched to an impedance corresponding to a parallel combination of the second detected signal input terminal of the voltage detector (780) and the load (777). Alternatively, the voltage detector (780) can be designed such as to impact a loading to the node (175) in a reduced way and therefore design of the load (777) can be done with no consideration of the impact of the coupling to the voltage detector (780). According to some embodiments of the present disclosure, a load presented to the node (175) of the replica circuit (155), such as the load (777), can be same as a load presented to the node (140) of the main circuit (150) under the ideal matching condition (e.g. as derived, for example, during production testing of the circuit). Such load can therefore be inductive, capacitive or resistive. By designing the replica circuit (155) to have the same bias conditions (e.g. via a same device characteristics) and voltages as the main circuit (150) and impedance matching the output node (175) to the impedance of the second detected signal input terminal of the voltage detector (780), the replica circuit (155) can serve as a reference for comparison purposes to determine if an impedance mismatch is present at the output node (140) of the main circuit (150).

The main circuit (150) and the replica circuit (155) can be designed using techniques known to a person skilled in the art such that when the main circuit input voltage signal $V_{Imain}$ and the replica circuit input voltage signal $V_{Ireplica}$ are identical, such identical input voltages produce, by way of the main circuit (150) and the replica circuit (155), identical output voltages at output nodes (140, 175) under conditions of perfect impedance matching between the output node (140) and the load (735), latter load being coupled to the output node (140) via the tunable matching network (730). Also, according to the same embodiment, when the main circuit input voltage signal $V_{Imain}$ and the replica circuit input voltage signal $V_{Ireplica}$ are substantially identical, such identical input voltages produce substantially identical output voltages at output nodes (140, 175) under conditions of substantially matched impedance (e.g. substantially perfect impedance matching) between output node (140) and the load (735), such as, for example, to provide a desired operating characteristic of the combination main circuit (150) and the associated RF path (650). Impedance matching between the output node (140) and the load (735) can be performed by the tunable matching network (730) which couples the output node (140) to the load (735). As used herein, the term "substantially identical output voltages" can refer to output voltages which differ by a sufficiently small amount that circuit operation is not affected. As used herein, the term "substantially perfect impedance matching" or "essentially impedance matched" can refer to a situation where impedance mismatch (if any) is sufficiently small that circuit operation is not affected. According to some embodiments of the present disclosure, the term "substantially perfect impedance matching" or "essentially impedance matched" can refer to an impedance matching which generates a VSWR of not more than 1.5:1.

With continued reference to FIG. 7, the voltage detector (780) can calculate a difference between voltages $V_{Omain}$ and $V_{Oreplica}$, such difference hereafter referred to as "main-replica difference", in order to determine, for example, an associated VSWR. If there is no difference between voltages measured at the output nodes (140, 175), no impedance mismatch between the output node (140) of the main circuit (150) and the load (735) exists, indicating a VSWR of 1:1. A non-zero main-replica difference can indicate an impedance mismatch between the output node (140) and the load (735) and therefore a VSWR greater than 1:1.

As previously mentioned, the two circuits, main circuit (150) and replica circuit (155), can be designed to track each other by using scaled versions of input signals and devices of the circuits. In the case where the two circuits use scaling, output voltages at the output of each circuit can also be scaled and therefore an identical ideal matching condition for the two circuits can have different output voltages at each of the nodes (140) and (175). Such difference does not affect determination of the ideal condition so long as the scaling is known and the two circuits track each other.

According to one embodiment of the present disclosure, the main-replica difference drives control circuitry (680) of FIG. 7. In this embodiment, the control circuitry (680) adjusts impedance of the tunable matching network (730) via control signal(s) (695) in a manner so as to minimize the main-replica difference. The control signal(s) (695) can also be referred to as a controlling output and in a case where scaling is used, associated scaling parameters (e.g. offset and gain) describing the tracking relationship between the two circuits (e.g. 150, 155) can be built into the control circuit (680). By way of example, and not of limitation, design can be performed using control systems teachings where a feedback loop comprising the control circuitry (680) and the output matching network (730) accepts the main-replica difference, and treats the main-replica difference, including an offset and gain if necessary, as an error signal to be minimized by appropriate adjustment of the feedback loop. In particular, the feedback loop adjusts the tunable matching network (730) in order to minimize the error signal (main-replica difference).

Because the tunable matching network (730) can comprise one or more tunable components, the control circuitry (680) can produce one or more outputs (695), one to control each tunable component (e.g. DTC (digitally tunable capacitor), DTL (digitally tunable inductor)) in the tunable matching network (730). Potential multiplicity of control signal(s) (695) is indicated in FIG. 7 by a slash across the control circuitry output signal line (695) labeled "N", where N represents an integer greater than or equal to one. The control circuitry (680) can adjust the tunable matching network digitally, because tuning control is not necessarily a linear function. According to some embodiments of the present disclosure, a recursive search algorithm for minimizing the error signal (e.g. main-replica difference) can be implemented in the control circuitry (680) using the various tunable elements of the tunable matching circuit (730). Such search algorithm can look, for example, at an impact on the error signal of a step change in a value of one tunable element of the tunable match circuit (730) while considering a step change in value for each of the other tunable elements of the tunable match circuit. The person skilled in the art will know of various minimization search algorithms which can be used in conjunction with the various teachings of the present disclosure.

A tunable matching network, which can be used in the various embodiments of the present disclosure, is described, for example, in U.S. patent application Ser. No. 13/967,866, entitled "Tunable Impedance Matching Network", filed on Aug. 15, 2013, incorporated by reference herein in its entirety. According to one embodiment, the tunable matching network (730), and/or the various tunable impedance networks of FIGS. 5A-5B and 6A-6B, can comprise one or more tunable components (e.g. resistors, capacitors, and inductors), which can be adjusted in order to perform impedance matching for varying load conditions. The one or more tunable components can comprise digitally tunable capacitors (DTCs) and/or digitally tunable inductors (DTLs). Digitally tunable capacitors are described, for example, in International Application No. PCT/US2009/001358, entitled "Method and Apparatus for use in digitally tuning a capacitor in an integrated circuit device", filed on Mar. 2, 2009, the disclosure of which is incorporated by reference herein in its entirety. Digitally tunable inductors are described, for example, in to U.S. patent application Ser. No. 13/595,893, entitled "Methods and Apparatuses for Use in Tuning Reactance in a Circuit Device", filed on Aug. 27, 2012, the disclosure of which is incorporated herein by reference in its entirety.

Figure 6E:
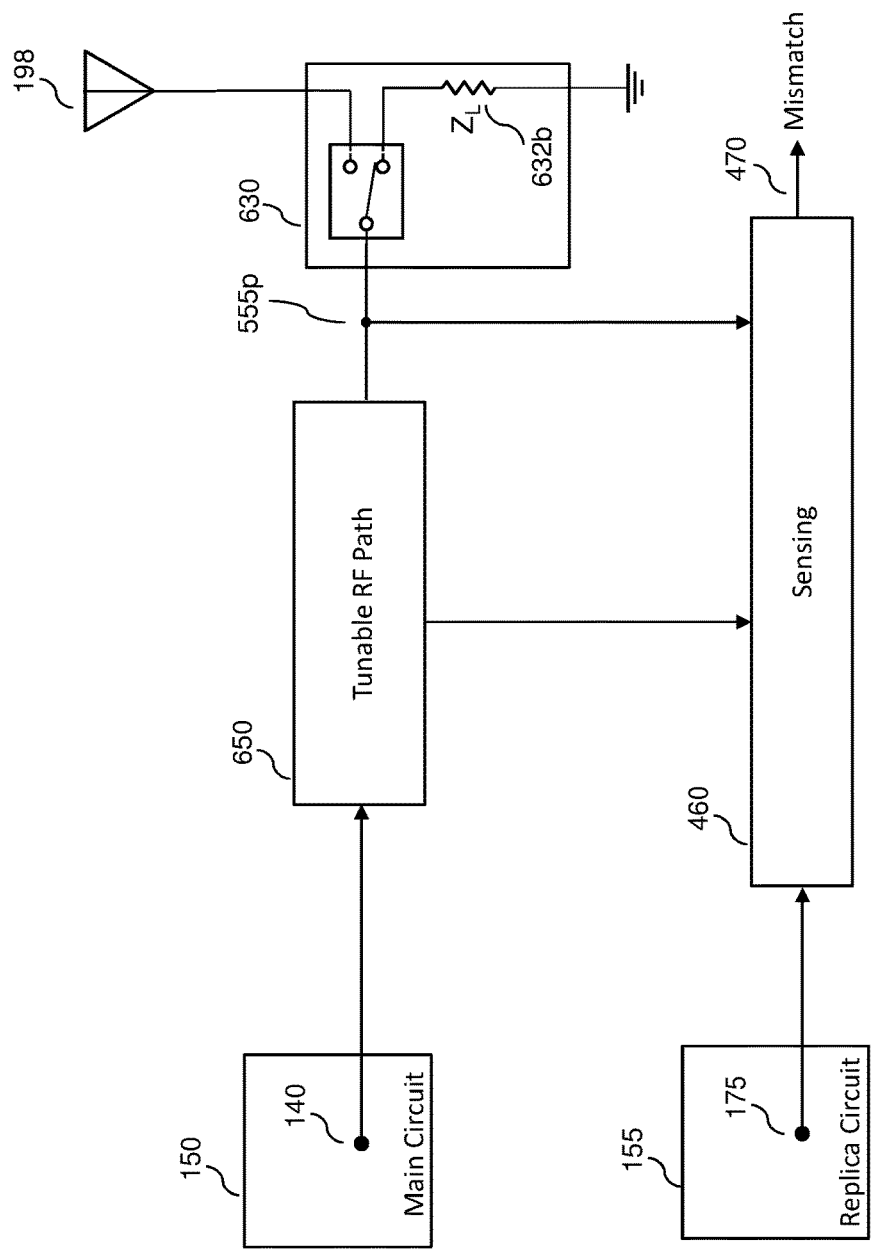
FIG. 6E shows a terminating switch which can be used to selectively provide an ideal matching load at the end of an RF path.

According to the embodiment shown in FIG. 7, the tunable matching network (730) is connected to a load (735). By way of example, and not of limitation, the load (735) could be a duplexer, a diplexer, an antenna or circuitry related to an antenna (e.g. an antenna switch), such as, for example, depicted in FIG. 1. As previously mentioned, at assembly time the antenna may have a particular surrounding environment, leading to a first value of antenna impedance. The main circuit (150) may be matched to the first value of the antenna impedance. If the environment surrounding the antenna changes, antenna impedance may change to a second value as a result of the environmental change. If the antenna is serving as a load (735) and antenna impedance changes, impedance of the load (735) would vary, causing impedance mismatch between the output node (140) of the main circuit (150) and the load (735). The tunable matching network (730) can be adjusted to perform impedance matching, thereby reducing mismatch between the impedance of the load (735) and impedance of the output node (140). Similarly, such matching may be performed at a certain temperature of the final stage amplifier (140) and the tunable match circuit (730) which can affect an output impedance of the final stage amplifier (140) and an input impedance of the tunable match circuit seen by the final stage amplifier, and therefore the matching between the two can drift as a function of an operating temperature. According to a further embodiment of the present disclosure as depicted in FIG. 6E, a terminating switch (630), as described in the prior sections of the present disclosure, can be provided at a point between the RF path (650) and the antenna (198), such as to further enabling fault detection due to a faulty antenna via the replica circuit. In such exemplary configuration, the terminating load (632b) presented by the terminating switch (630) can have an impedance value ($Z_L$) matching an ideal value of the antenna (198) as determined during design and/or testing/assembly phases of a corresponding system (e.g. cellular phone). By contrasting a mismatch between the sensing point (555p) and a corresponding reference point generated by the replica circuit (155) in the sensing circuit (460) for a case where terminating load at point (555p) is ($Z_L$) and a case where the terminating load at point (555p) is the antenna (198), a fault attributed to the antenna (198) can be detected. As described in the prior related sections of the present disclosure, main circuit to replica circuit mismatch can be determined while setting the tunable RF path (650) to its tuned configuration. The additional terminating switch (630) of FIG. 6E allows to provision of a tuned (e.g. ideal) end load to the RF path (650).

Furthermore and as previously noted according to various embodiments of the present disclosure, the main circuit (150) can be used to transmit a radio frequency (RF) signal according to one or more frequency bands and channels and therefore the tunable match circuit (730) can require a different matching according to a corresponding mode of operation (e.g. frequency band, channel). For each such mode of operation, the ideal matching can be determined during a production step of a device within which the circuital arrangement of FIG. 7 is used. In such case where various modes of operation are desired, the load (777) can be configurable (e.g. tunable) to reflect an ideal impedance as determined during the production step to provide an ideal match.

The above description used the exemplary case of compensating for a change in the VSWR as affected, for example, by an impedance mismatch coupled to the main circuit (150). Difference (i.e. mismatch) in RF signal magnitudes at sensing points of a main RF path (e.g. 450, 650) associated to the main circuit (150), and at reference sensing points of a reference RF path (e.g. impedance networks within 460) associated to the replica circuit (155), being used to generate control signals that affect the VSWR performance of the main RF path. The same concept as using a reference RF path to provide reference sensing points for comparison to corresponding sensing points of the main RF path can be expanded for compensation of other operating characteristics of the main RF path. Such operating characteristics, which may comprise, for example, a signal modulation characteristic, a signal linearity characteristic, a signal distortion characteristic, a signal magnitude characteristic, a signal phase characteristic, a transient response characteristic, a temperature characteristic, and other characteristics used as metrics to a performance of the main RF path, may be affected by operating variables to which the main RF path is subjected to. In turn, the operating variables can cause performance of the main RF path to deviate from a nominal performance. Such operating variables may comprise a load to the main RF path, a local temperature at the main RF path, specifically at the main amplifying circuit (150), hot carrier injection (HCI) and floating body effects of transistor devices of the main amplifying circuit (150), transient effects associated to transition from idle/inactive to normal/active modes of operation of the main RF path, different operating modes of the main RF path (e.g. different air standards), different frequencies of operation of the main RF path, etc. Similar to the case of the VSWR performance metric, direct measurements of the operating characteristic of the main RF path may not be possible, but rather be derived from sensed signals at the sensing points of the main RF path and, in some cases, comparison of such sensed signals to signals sensed at the reference sensing points of the reference RF path. A person skilled in the art would understand that the sensed signals may comprise any of a voltage signal, a current signal and a power signal. Furthermore, and as described in the following paragraphs, evaluation and/or comparison of the sensed signals may be used to generate control signals to control configurable blocks (e.g. 150, 850a, 850b, 850c of FIG. 8B and FIG. 8G) of the main RF path, such as, for example, bias control, impedance match control, signal filtering control, signal attenuation control, etc. Finally, it should be noted that in the present disclosure, the terms "mismatch" and "difference" may be used interchangeably, as they both may relate to a sensed variation in operating characteristics of the main RF path with respect to the reference RF path.

FIG. 8A represents a block diagram, according to an embodiment of the present disclosure, where a performance of a main RF path (850) is sensed through one or more sensing points (555a, . . . , 555n) of the main RF path (850) coupled to a sensing circuit (860). Such sensing points (555a, . . . , 555n) may be coupled at any point of the main RF path (850), which includes the main amplifying circuit (150), and may be used to determine an absolute or relative value of one or more operating characteristics of the main RF path. In the same fashion, a reference RF path (855) is sensed through one or more reference sensing points (575a, . . . , 575n) coupled to the sensing circuit (860). According to an embodiment of the present disclosure, the sensing circuit may process (e.g. compare, subtract, include gain, include offset, other) the values at the sensed points, (555a, ..., 555n) and (575a, ..., 575n), and thereby determine a difference in operating characteristics of the main RF path (850) and operating characteristics of the reference RF path (855). Such difference in operating characteristics may be output at the terminal (870) of the sensing circuit (860) for processing by a subsequent circuit block. The crossed output line from the terminal (870 is indicative of one or more physical signal connections output at the terminal (870), each representative of a difference signal associated to a different operating characteristic. A person skilled in the art would know that there are many possible implementations of a physical/logical interface provided at the terminal (870), some of which may include a single physical connection.

With further reference to FIG. 8A, the main RF path (850) may be coupled to a subsequent RF stage (830) and an antenna (198). The RF stage (830) may in turn comprise one or more elements (830a, ..., 830m). The RF stage (830) and/or the antenna (198) may be part of the operating variables that affect the operating characteristics of the main RF path (850), as they both influence an impedance seen at an output of the main RF path (850). In contrast, the reference RF path (855) can be terminated in an impedance (880) of known value and performance, which therefore removes effects of a varying impedance on an operating characteristic of the reference RF path (855). The person skilled in the art would understand that by controllably isolating parts of the reference RF path (855) from some of the operating variables that affect the operating characteristics of the main RF path (850), the reference RF path (855) may be used as a reference to determine a deviation of the operating characteristics of the main RF path (850). FIG. 8A shows an exemplary embodiment according to the present disclosure where the reference RF path (855) is isolated from a load variation, and can therefore be used as a reference to determine an indication of a deviation of the combined load (830+198) to the main RF path (850). Teachings according to the present disclosure, isolate the reference RF path from none, any or all of the operating variables affecting performance (operating characteristics) of the main RF path. It should be noted that monolithic integration of the main RF path and the reference RF path allows for matching of performances of the two RF paths and/or precisely control operating variables that affect one or more of the performances of the reference RF path. With a monolithic integration of the two RF paths, one can make use of the matching between devices of the two RF paths to track and adjust variations in performance due to the operating variables in ways that can't be supported across multiple ICs and possibly multiple technologies. Furthermore, monolithic integration means that RF signals through the two RF paths will be matched and the amplitude/phase response across components of the RF paths will be well controlled. Keeping such RF signals on chip preserves integrity of the signals and minimizes parasitic effects that can load down the signals, shift the phase of the signals, and introduce cross-talk or signal isolation concerns. Through such integration and the benefits of device and passive element matching across an IC, one can decide how to single out a parameter or variable so that the replica circuit provides an indication of that parameter or variable, or the difference between the main and reference RF paths can provide an indication of relative differences in that parameter or variable. Likewise, by design, one can control the relative signals at the input and/or output of the main and reference RF paths to isolate, or highlight, a particular performance parameter or variable. The reference RF path (855), by way of its replica circuit (155), offers a somewhat ideal proxy for the main RF path (e.g. main circuit 150).

Figure 8B:
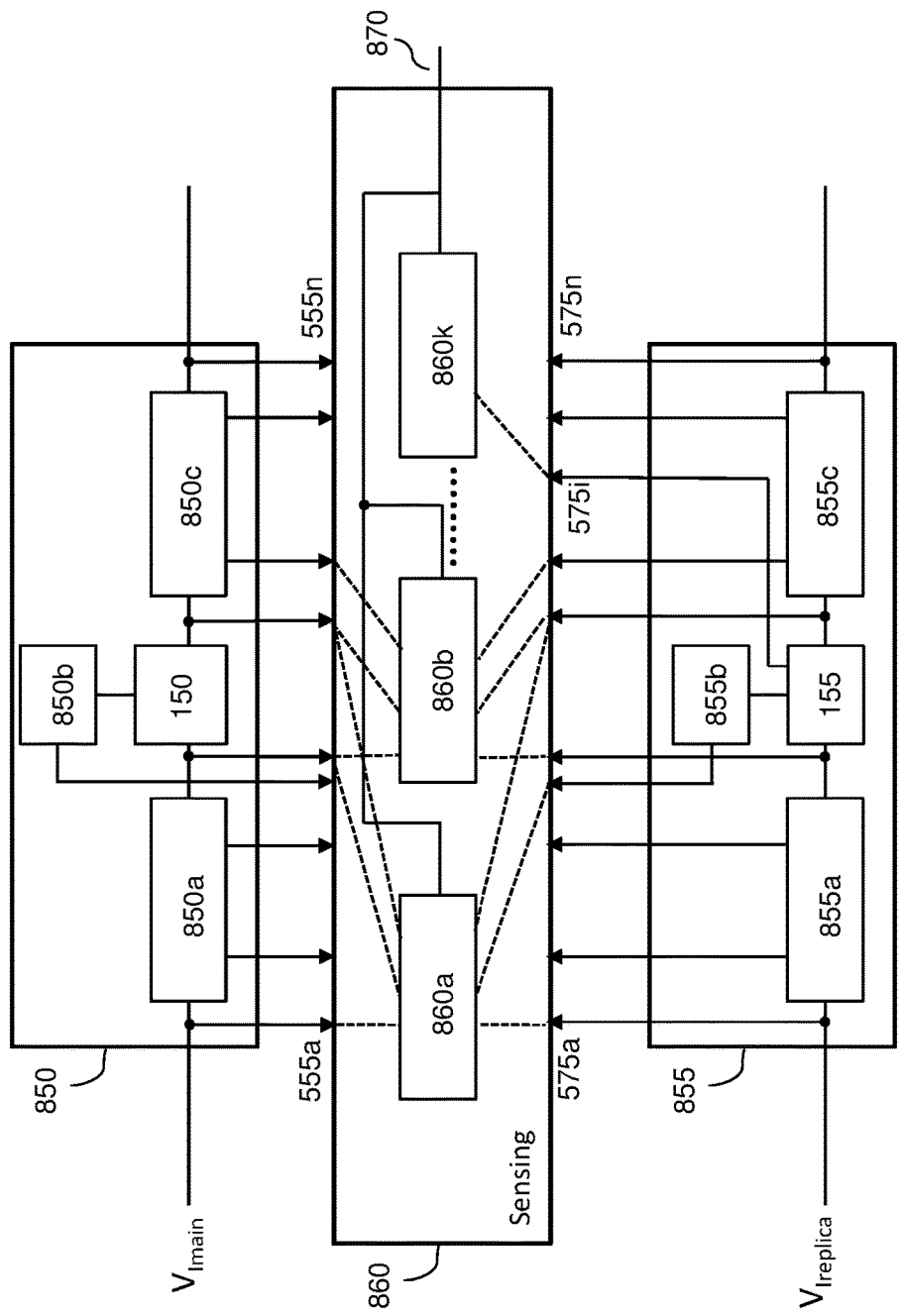
FIG. 8B shows more details on coupling between the main RF path, the reference RF path and the sensing circuit depicted in FIG. 8A.

FIG. 8B shows more details of the main RF path (850) and the reference RF path (855), including coupling to the sensing circuit (860). As can be seen in FIG. 8B, the main RF path (850) may comprise the main amplifying circuit (150), an amplifier biasing circuit (850b) coupled to the main amplifying circuit (150), a pre-processing circuit (850a) coupled to an input of the main amplifying circuit (150), and a post-processing circuit (850c) coupled to an output of the main amplifying circuit (150). The amplifier biasing circuit (850b) may include circuits to provide biasing to (stacked) transistors of the amplifying circuit, as well as biasing a drain of an output transistor of the amplifier (150). Such biasing may include voltage biasing and/or current biasing. According to some exemplary embodiments, the amplifier biasing circuit (850b) can provide biasing according to the various efficiency improvement schemes previously mentioned, and may include a controllable power supply, such as, for example, a DC/DC converter or a low dropout (LDO) regulator. More information on some biasing circuits can be found, for example, in the above referenced U.S. Pat. No. 9,413,298 and U.S. Pat. No. 7,248,120, the disclosures of which are incorporated herein by reference in their entirety. As can be seen in FIG. 8B, and understood by a person skilled in the art, the reference RF path (855) comprises elements (155, 855a, 855b, 855c) equivalent to the elements (150, 850a, 850b, 850c) described with reference to the main RF path (850).

Figure 15A:
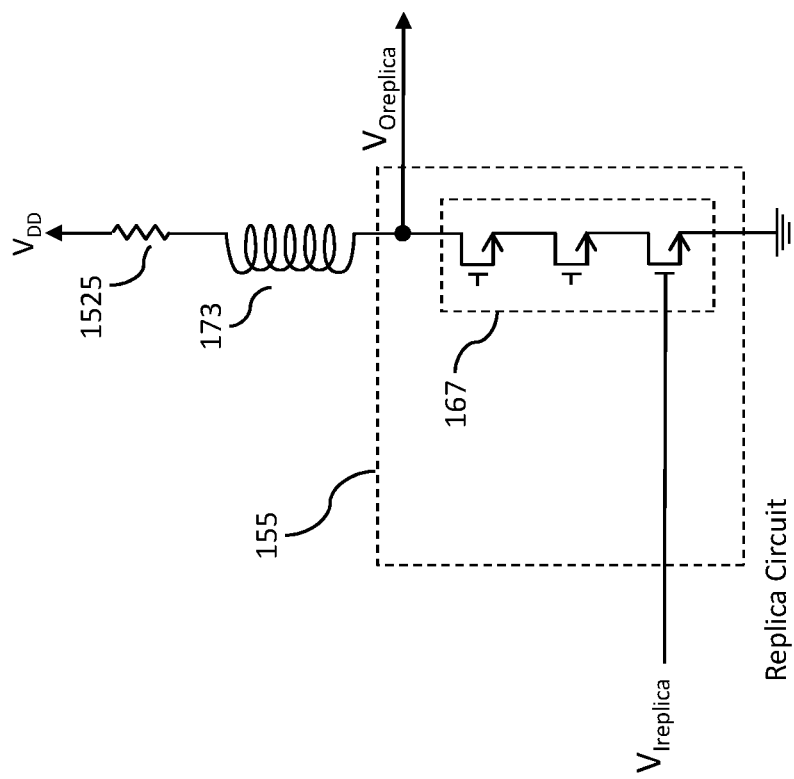
FIGS. 15A and 15B show embodiments according to the present disclosure, where current sensing resistors are used in a conduction path of the replica circuit of the reference path.
Figure 15B:
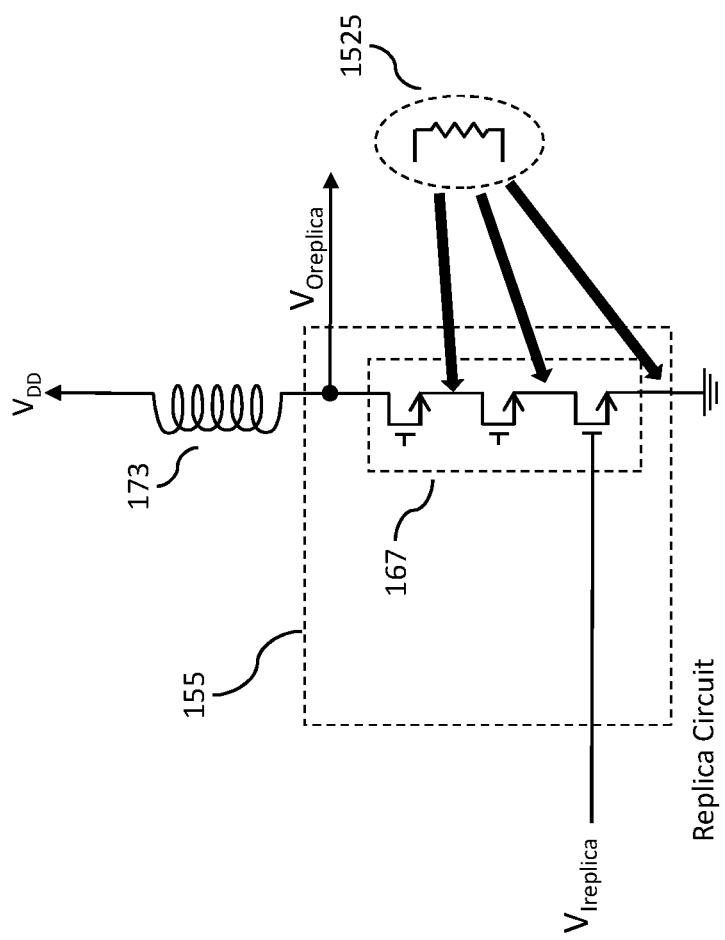

With further reference to FIG. 8B, the sensing points (555a, ..., 555n) may be coupled to any point of the main RF path (850), and the reference sensing points (575a, ..., 575n) may be coupled to any point of the reference RF path (855). It should be noted that sensing points may also be coupled to internal circuitry of the main amplifying circuit (150) (as shown in FIG. 8G, later described) and to internal circuitry of the replica amplifying circuit (155) (e.g. through reference sensing point 575i), although extra care may be needed in coupling to the main amplifying circuit (155). Also, as shown in the FIG. 8B, it should be noted that the sensing circuit (860) may include different sensing sub-circuits (860a, ..., 860k) to determine difference in different operating characteristics of the two RF paths. For example, the sensing circuit (860) may include a peak amplitude detector (860a) for detecting a signal modulation characteristic and a phase detector circuit (860b) for detecting a signal phase characteristic, where the detector circuits (860a, 860b) may use common (as shown in FIG. 8B) or separate sensing points of the main and the reference RF paths. In this case, each detector may be coupled to one or more sensing points of the main RF path (850), and corresponding reference sensing points of the reference RF path (855). Finally, a person skilled in the art would understand that in some cases, the sensing circuit (860) may sense only a reference sensing signal (e.g. 575i) from the reference RF path (855) which may not have a corresponding sensing point in the main RF path (850), as shown with respect to the sensing sub-circuit (860k). FIG. 15B, later described, shows a replica amplifying circuit which includes a current sensor which may be used to sense a current through a conduction path of the replica amplifying circuit (155). An equivalent sensing point in the main RF path (850) would be undesirable as it could negatively affect operation of the main amplifying circuit (150).

Figure 8C:
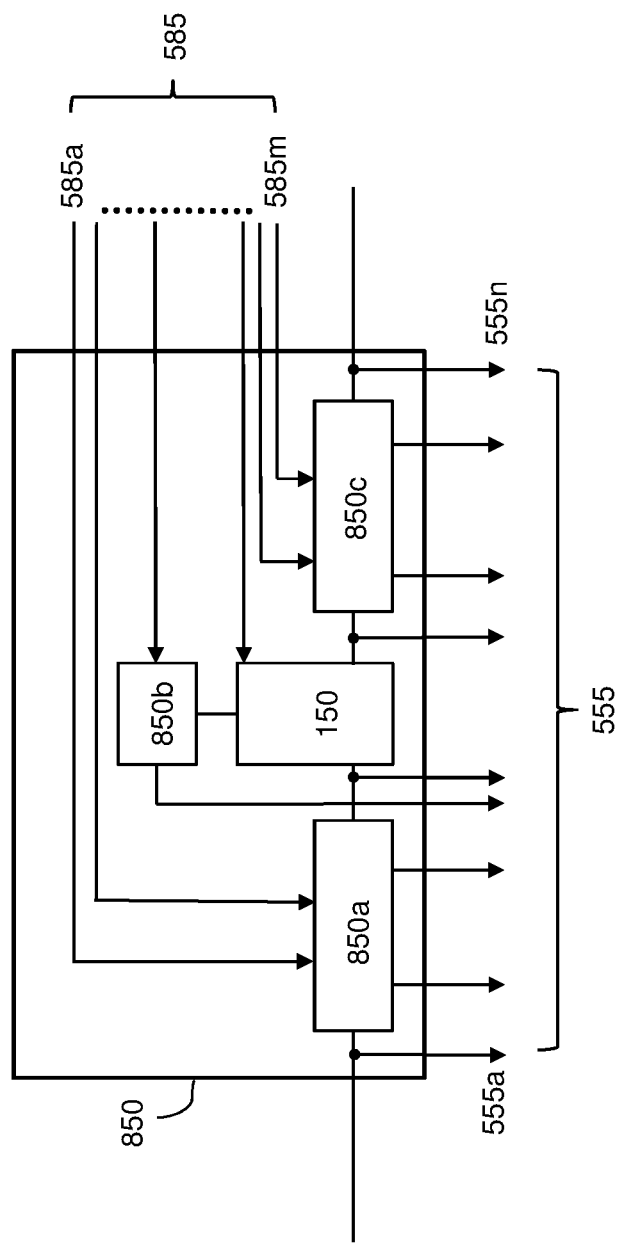
FIG. 8C shows control inputs to the main RF path to allow configuration control of the main RF path. Similar control inputs may be provided to the reference RF path.
Figure 8D:
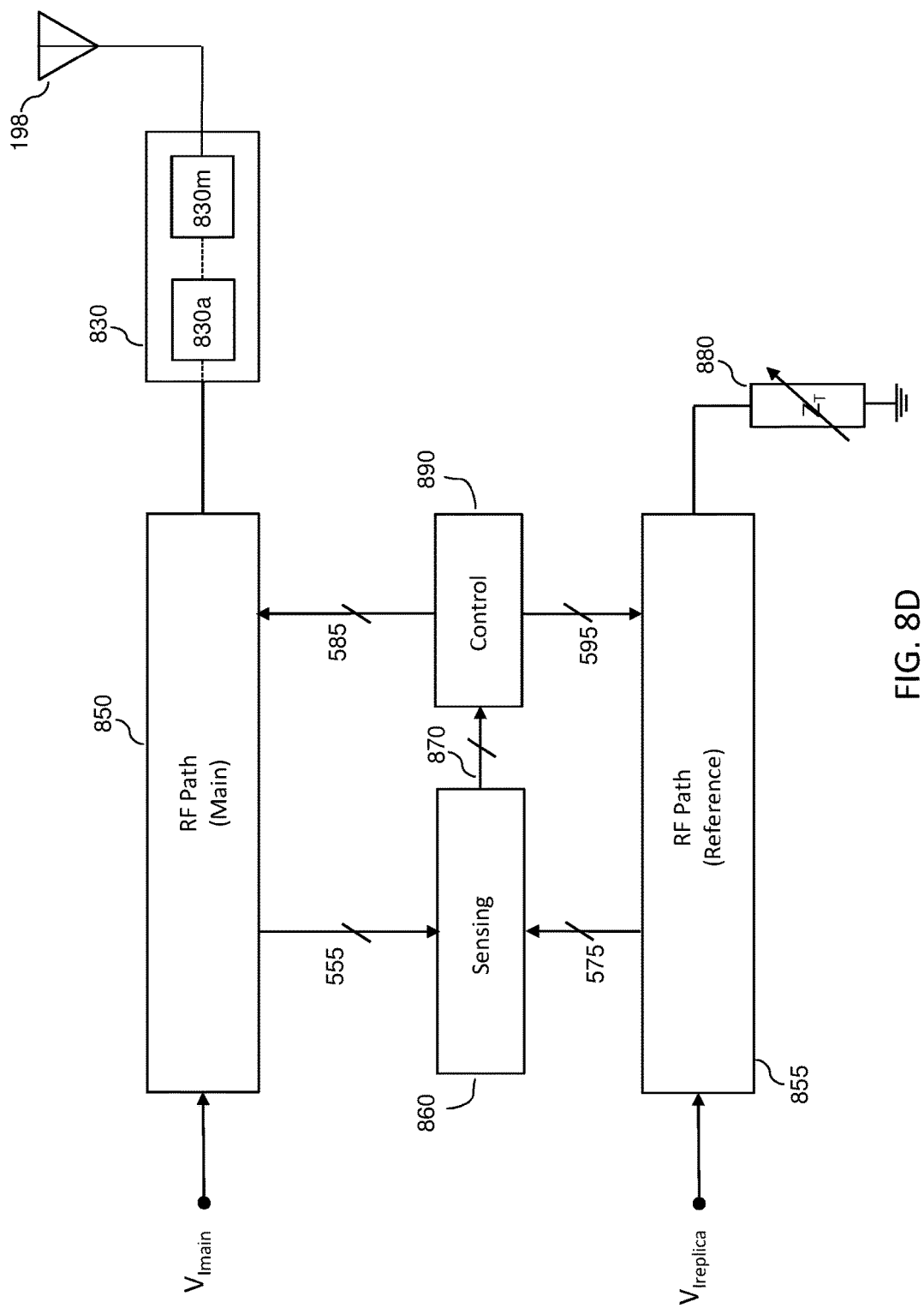
FIG. 8D shows the RF system of FIG. 8A with the addition of a control circuit that allows configuration control of the main and/or the reference RF paths.
Figure 8E:
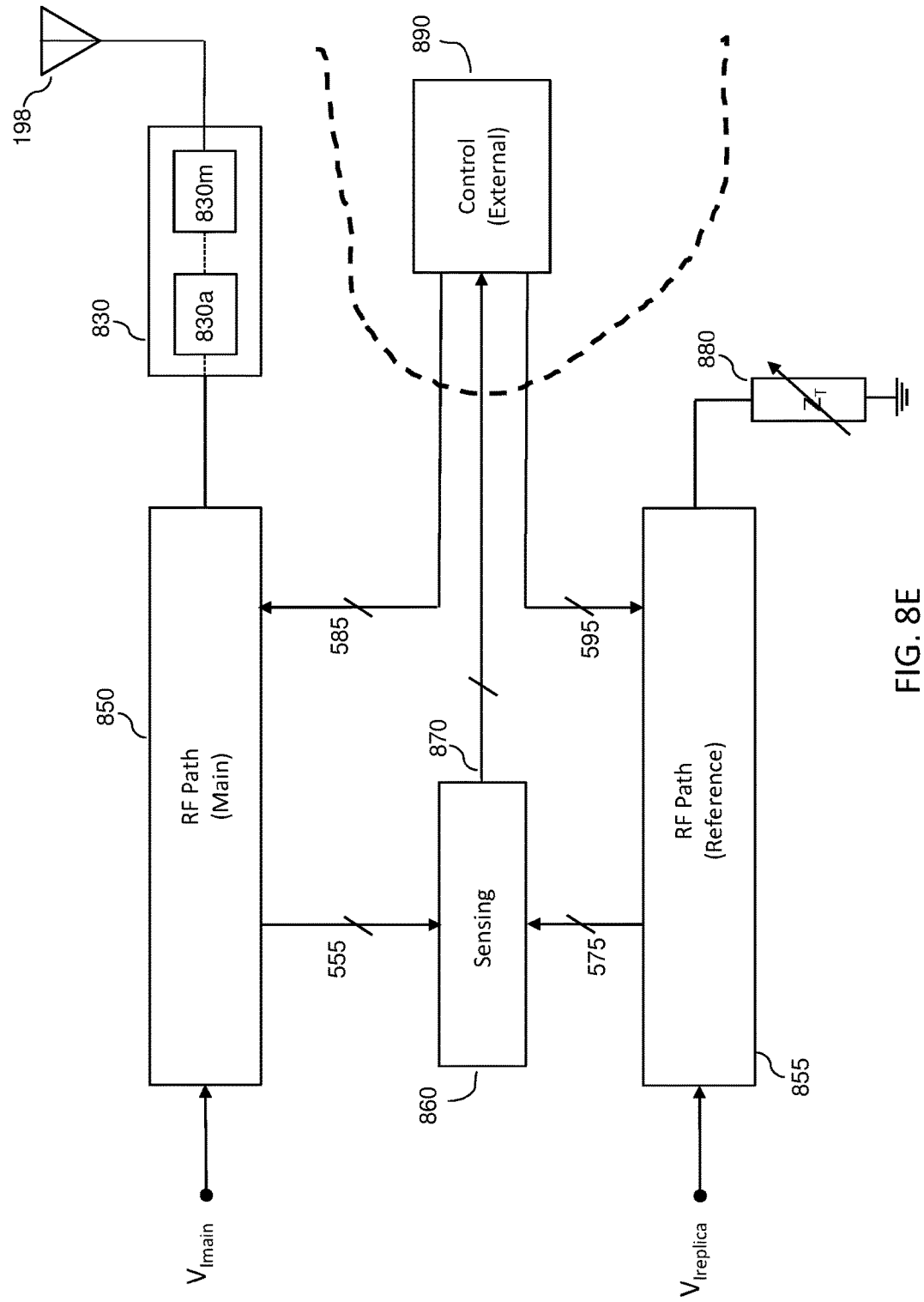
FIG. 8E shows an alternative embodiment of the RF system of FIG. 8D, where the control circuit is part of a separate integrated circuit.

As shown in FIG. 8C, the main RF path (850) may be a tunable RF path by way of tuning elements of the RF path. Any one or all the elements (150, 850a, 850b, 850c) of the main RF path may be tuned (e.g. adjusted, controlled, configured) via one or more input control signals (585). Any one or all such control signals may be based on the mismatch signals provided by the sensing circuit (860), which therefore allows the main RF path (850) to be tuned (e.g. adjusted, controlled, configured) based on difference in operating characteristics between the main RF path (850) and the reference RF path (855). Such control signals may each be fed in a continuous or a discrete fashion, and may each be an analog or a digital signal. In a similar fashion, the reference RF path (855) may be a tunable RF path via elements (155, 855*a*, 855*b*, 855*c*) configured to be tuned via one or more control signals (e.g. 595 as shown in FIG. 8D). It should be noted that in some embodiment according to the present disclosure, control of the reference RF path (855) may be independent of a determined difference in operating characteristics between the main and the reference RF paths, but rather dependent on desired operating modes and/or operating frequencies of the RF paths. Controlling of the reference RF path (855) can therefore allow isolation of the reference RF path from effects of different operating modes and/or different frequencies of operation. For example, the terminating load (880) of FIG. 8A coupled at the output of the reference RF path (855) may be a broadband load which may need to be adjusted based on a frequency of operation of the RF paths. It should be noted that the terminating load (880) can substantially absorb a total RF power output by the reference RF path (855). As can be seen in FIG. 8A, the output of the reference RF path (855) is isolated from the output of the main RF path (850), and therefore the output of the reference RF path (855) is also isolated from the RF stage (830) and the antenna (198). FIG. 8G, later described, shows a further embodiment according to the present disclosure where outputs of the two RF paths are combined.

The input control signals (585) to the main RF path (850) may be provided by a control circuit (890) as shown in FIG. 8D. The control circuit (890) may also provide input control signals (595) to the reference RF path (855). As described above, some or all control signals (585) may be based on the output of the sensing circuit (860). Some control signals (595) may be based on a high level system configuration control, such as provided, for example, by a signal aware controller (e.g. transceiver). Such signal aware controller knows of a desired mode and/or frequency of operation of the main RF path (850). It should be noted that connection to the signal aware controller is not shown in FIG. 8D, as such connection may be through the control circuit (890) or directly to the two RF paths (850, 855) bypassing the control circuit.

With further reference to FIG. 8D, the control circuit (890) in combination with the sensing circuit (860), the main RF path (850), and the reference RF path (855), may implement a closed loop control system that controls operating characteristics of the main RF path (850). As known to a person skilled in the art, such control system may include offset and gain parameters that combine with the sensed signals at the sensing points (555) and at the reference sensing points (575). Alternatively, the offset and gain parameters may be used in an open loop fashion. Offset and gain parameters may be implemented through a lookup table, a parametric mapping function, or any other means known to person skilled in the art.

According to an embodiment of the present disclosure, the control circuit (890) may be monolithically integrated on a same integrated circuit with the main RF path (850), the reference RF path (855) and the sensing circuit (860). According to another exemplary embodiment of the present disclosure, the control circuit (890) may be part of a separate integrated circuit, as shown in FIG. 8E.

Figure 8F:
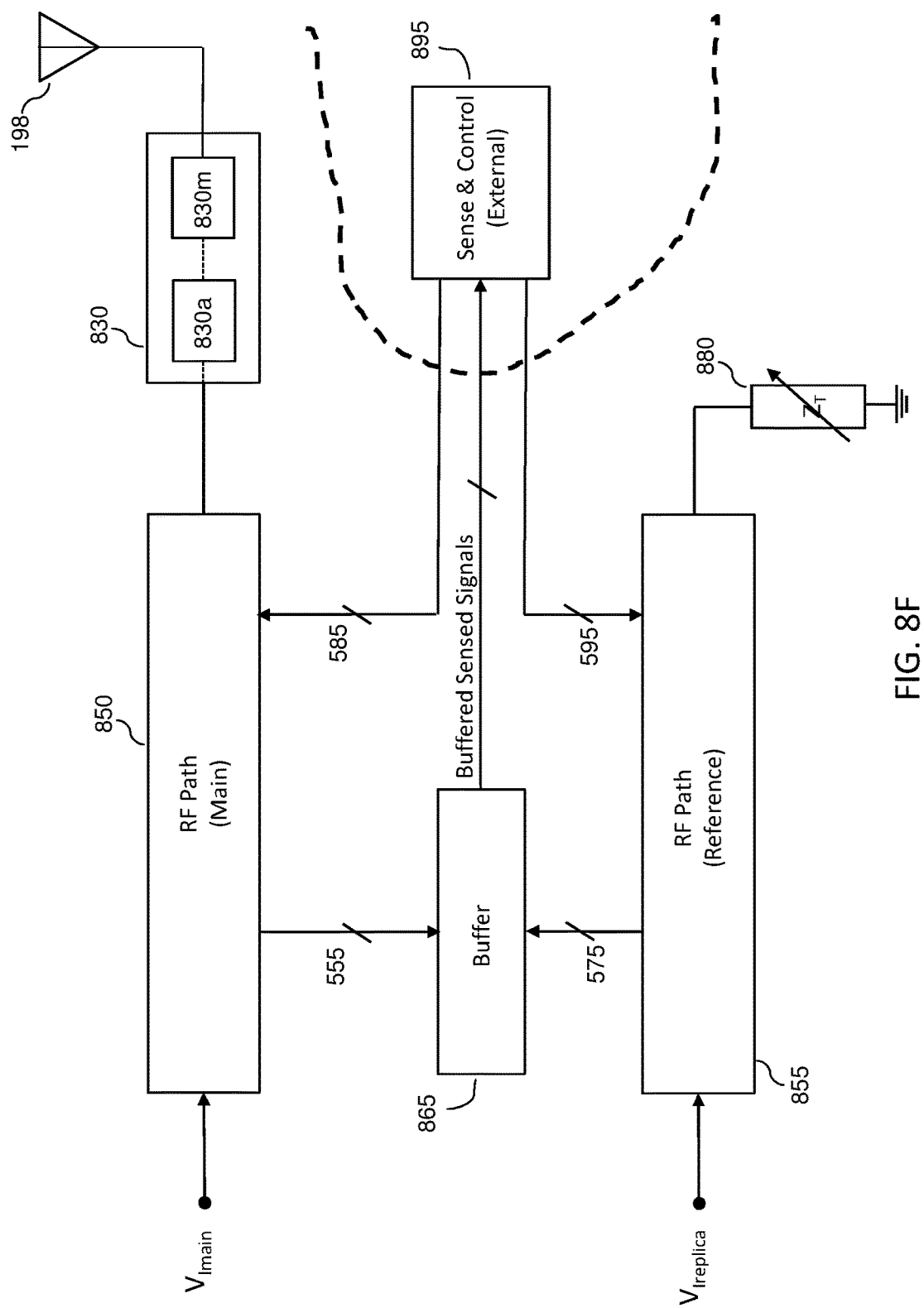
FIG. 8F shows an alternative embodiment of the RF system of FIG. 8D, where the control circuit and the sensing circuit are part of a separate integrated circuit.
Figure 8G:
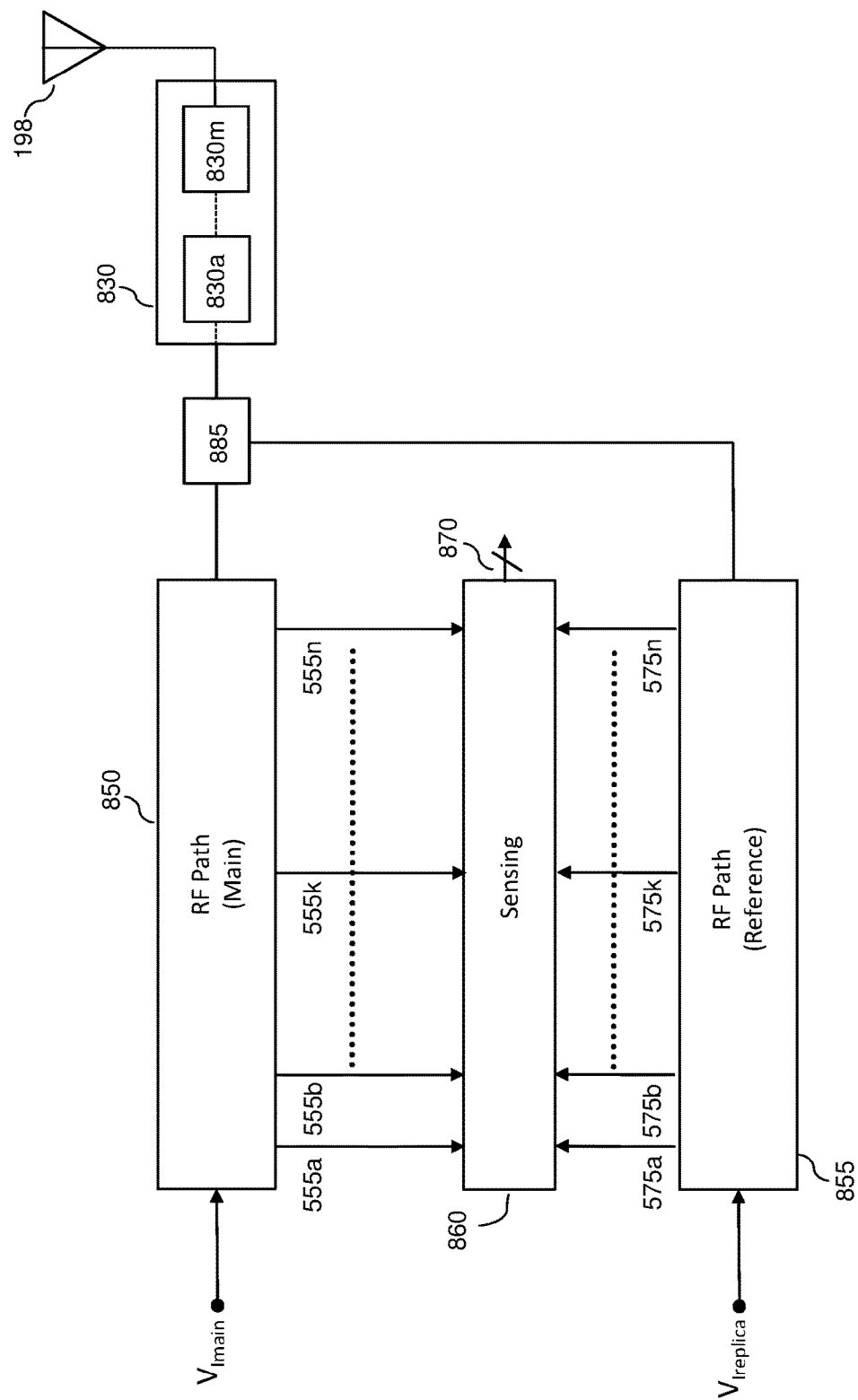
FIG. 8G shows an alternative embodiment of the RF system of FIG. 8A, where an output of the reference RF path is combined with an output of the main RF path.

According to yet another embodiment of the present disclosure, the sensed signals at the sensing points (555) and at the reference sensing points (575) may be buffered through a buffer circuit (865) and sent to a separate circuit (895), as shown in FIG. 8F. The separate circuit (895) may combine the function of translating the sensed signals into operating characteristics (e.g. detection) and generate the control signals (585, 595). As shown in FIGS. 8D, 8E and 8F, the various tasks of sensing, translating the sensed signals to operating characteristics or differences in operating characteristics, and deriving the control signals from the translated sensed signals, may be partitioned in different ways. A person skilled in the art would know how to use the present teachings according to a multitude of different partitioning schemes in view of desired design and integration goals.

According to a further embodiment of the present disclosure, outputs of the main RF path (850) and the reference RF path (855) may be combined through a combiner circuit (885), as shown in FIG. 8G. A person skilled in the art would know of many design implementations of the combiner circuit (885), details of which are outside the scope of the present application. In this exemplary embodiment, both RF paths may be affected by same variations of the RF blocks (830, 198), and therefore the reference RF block (855) may provide indications of required adjustments with respect to other operating variables to the main RF path (850) under a same loading condition.

Figure 17:
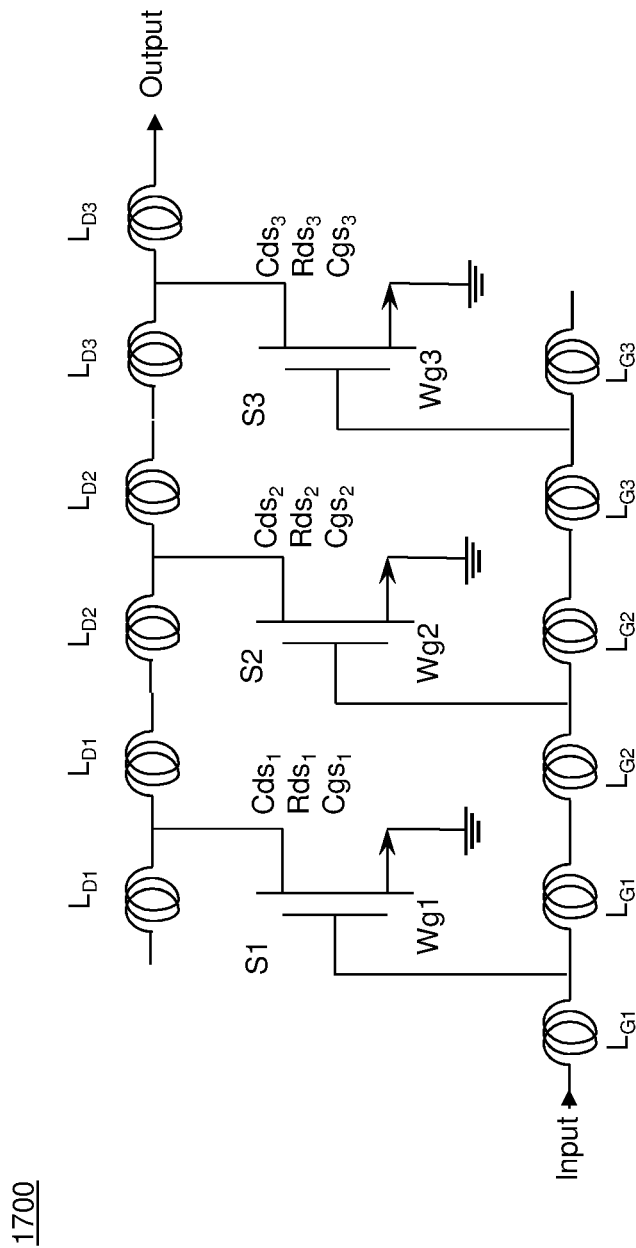
FIG. 17 shows an exemplary case where the main circuit is a distributed amplifier. A reduced replica circuit of such distributed amplifier may be used to track performance of the main circuit according to an embodiment of the present disclosure.

As noted above, with respect to for example FIG. 8B, the sensing points (555*a*, . . . , 555*n*) may be coupled to any point of the main RF path (850), including the main amplifying circuit (150). This is shown with greater details in FIG. 8H, where exemplary sensing points (555*e*, . . . , 555*j*) of the main RF path (850) are coupled to the main amplifying circuit (150). As can be seen in the exploded view of the main amplifying circuit (150) at the bottom, region of FIG. 8H, sensing points (555*e*, 555*f*, 555*g*) are coupled to gate nodes of the transistors of the stack (112) of the main amplifying circuit (150), and sensing points (555*h*, 555*i*, 555*j*) are coupled to drain nodes of the transistors of the stack (112) of the main amplifying circuit (150). It should be noted that the reference RF path (855) may include sensing points coupled to similar nodes of the replica amplifying circuit (155) as shown with respect of the main amplifying circuit (150) in FIG. 8H. A person skilled in the art would understand that as the main RF path (850) may comprise a main circuit (having active transistor devices) that differ in structure with the exemplary amplifying circuit (150) shown in FIG. 8H, sensing points different than ones shown in FIG. 8H may be coupled to the main circuit. Such main circuit, may be part of a variety of RF and analog applications such as mixers, VCOs, charge pumps, LNAs, and other circuits comprising one or more transistors forming a main circuit of the main RF path. A person skilled in the art would know how to use the present teachings to design in view of such other applications by using a reduced size replica circuit of the main circuit. Scaling of the reduced size replica circuit may be provided according to any of the various embodiments described in the present disclosure. In one exemplary case, the main circuit may be a distributed amplifier as shown in FIG. 17, later described.

The various embodiments according to the present disclosure presented above use a scaled replica of a transistor-based RF block (also referred to as a "path" or "circuit") to track a reference behavior of the larger main transistor-based RF block that may experience different operating variables. The different operating variables experienced by the main RF path can cause that path to deviate from its desired operating characteristics. The reference (replica) path operating under ideal or controlled operating conditions creates a scaled version of the desired signal (e.g. reference signal), thereby enabling correcting the performance of the main RF path or adjusting the main RF path to a desired result.

A person skilled in the art would know that scaling of the replica amplifying circuit (155) can be accomplished by scaling physical dimensions such as, for example, operating biases (both voltage and current), input or control signals, and passive support circuitry (e.g. 850a, 850b). In an exemplary case where the RF paths comprise FET transistors, such as CMOS transistors, a person skilled in the art would know that scaling the width, W, of the transistor-based RF path is one technique used to scale such a circuit. In general, one may consider the entire reference RF path (855) as a scaled version, or a reduce size replica version, of the main RF path (850), and therefore, in the present disclosure, the expressions "replica RF path", "replica path", "reference RF path", "reference path", "scaled RF path", "scaled path", and combinations thereof, may be used interchangeably, where such path includes the reduced size amplifying circuit (155).

Figure 9B:
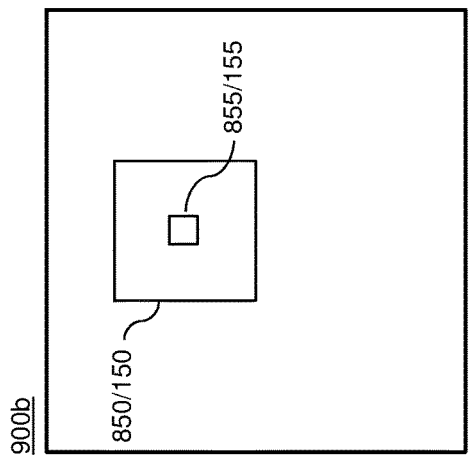
FIGS. 9A, 9B, and 9C show different exemplary IC layouts of the RF system according to the present disclosure, where different relative placements of the main RF path and the reference RF path allow to thermally couple or thermally isolate the RF paths.
Figure 9D:
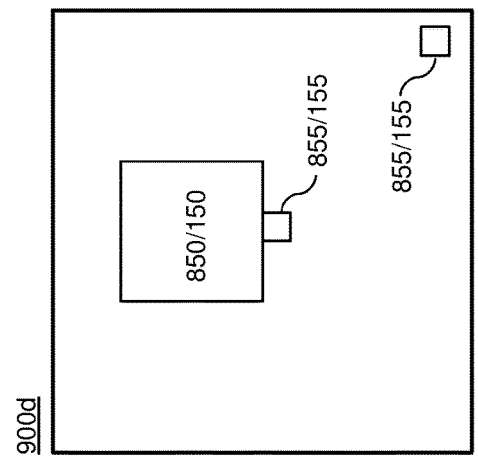
FIG. 9D show an exemplary IC layout of the RF system according to the present disclosure, where two reference RF paths are used, one thermally coupled to the main RF path, and the other thermally decoupled from the main RF path.
Figure 9A:
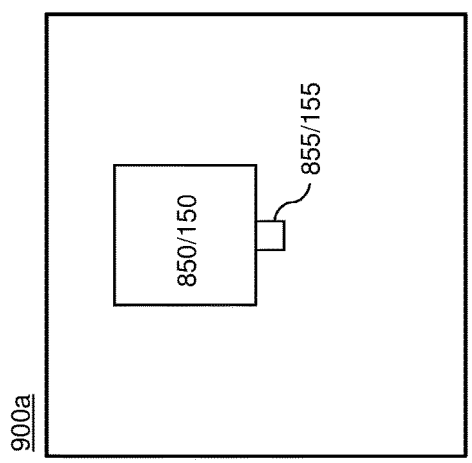
Figure 9C:
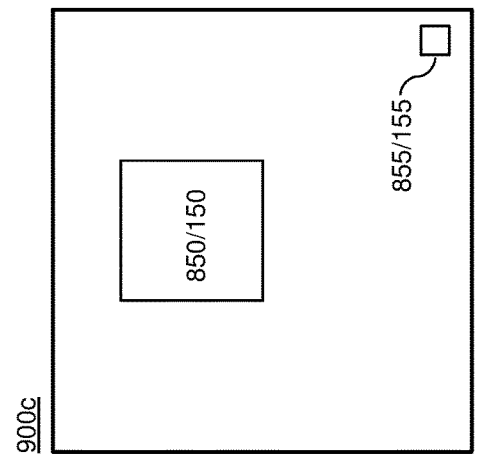

FIGS. 9A, 9B and 9C depict exemplary IC layout arrangements (900a, 900b, 900c) for control of thermal effects affecting the operating characteristics of the main RF path (850) that includes the main amplifying circuit (150). A person skilled in the art would know that virtually all transistors and many passive components vary due to temperature changes. In many cases, such temperature changes may be caused by the main amplifying circuit (150) itself. For example, an RF power amplifier (PA) loose efficiency and can cause distortion as a function of its temperature. Furthermore, a PA can exhibit less than 100% efficiency, with a corresponding wasted DC power being converted into heat, thereby causing the PA to be one of the hottest circuits in any wireless or RF system, such as the main RF path (850). As efficiency is often reduced by a higher temperature, rising temperatures can have the feedback effect of increasing wasted power, and therefore causing even higher temperatures. In extreme examples, a phenomenon known as thermal runaway can cause catastrophic results.

The scaled replica circuit shown in FIGS. 9A, 9B, and 9C, can be used to control the temperature effects or to provide interruption of the main amplifying circuit (150) operation under thermal runaway conditions. In the exemplary embodiment depicted in FIG. 9A, the reference RF path (855), including the replica amplifying circuit (155), is in close proximity to the main RF path (850), that includes the heat generating main amplifying circuit (150). Because of their close proximity, the main RF path (850) and the reference RF path (855) are thermally coupled, and therefore, temperature of the reference RF path (855), including the replica amplifying circuit (155), can be considered to be substantially same as the temperature of the main RF path (850) dominated by the temperature of the main amplifying circuit (150). It should be noted that the IC layout (900a) may be representative of a relative physical placement of the two RF paths (850, 855), or only of the two amplifying circuits (150, 155), as components of the RF paths (850, 855) other than the amplifying circuits (150, 155) may be placed at a further distance within the IC layout (900a). Similarly, in the exemplary IC layout (900b), the two RF paths (850, 855) are thermally coupled as the replica RF path (855) is placed within an area of the main RF path (850). In particular, according to an embodiment of the present disclosure, the replica amplifying circuit (155) may be placed within an area of the main amplifying circuit (150) for an increased thermal coupling between the two amplifiers.

According to some embodiments of the present disclosure, it may be desirable to isolate the reference RF path (855) and/or the replica amplifier (155) from thermal effects of a thermal effect of the main RF path (850), as shown in the exemplary IC layout (900c) of FIG. 9C. In the exemplary IC layout (900c), the two RF paths (or amplifiers) are placed at a sufficiently large relative distance such as to provide thermal isolation between the two RF paths (850, 855) and/or the two amplifiers (150, 155).

According to an embodiment of the present disclosure, the IC layout (900c) can be used to control pure thermal effects, by comparing performance characteristics of the two RF paths (850, 855) and adjusting the main RF path (850) accordingly. For example, in one embodiment, the output from the replica amplifying circuit (155) may be compared to an output of the main amplifying circuit (150) with the sensed difference being used to adjust, for example, bias conditions on the main amplifying circuit (150). Such adjustment may continue until a desired behavior (e.g. operating characteristic) of the main amplifying circuit (155) is achieved. As previously described, the adjustment may be part of a closed loop feedback system that maintains operating characteristics of the main RF path (e.g. amplifier 150) within a desired range. The reference path (855) being thermally isolated from the main RF path (850) allows comparing pure thermal effects on the operating characteristics of the two paths and adjusting accordingly.

According to an embodiment of the present disclosure, the IC layout (900a) may be used to control operating characteristics of the main RF path (850) independently of a temperature of operation of the main RF path (850), as the replica amplifying circuit (155) may be at approximately the same temperature of operation as the main amplifying circuit (150). Since the replica amplifying circuit (155) may be at the same temperature as the main amplifying circuit (150), its thermal characteristics can match those of the main amplifying circuit. Therefore, any difference in operating characteristics sensed between the main amplifying circuit (150) and the replica amplifying circuit (155) is independent of the temperature change. A person skilled in the art would recognize that the location of the reference RF path (855) (and/or replica amplifier 155) can follow the temperature effects of the main amplifying circuit (150) and thereby can allow to identify other, smaller difference caused by other operating variables.

In real world RF systems, it is common to have multiple operating variables experience changes and it can be difficult to separate out each of their causes. In the above example depicted in FIG. 9A and FIG. 9B, potentially large temperature effects over operating characteristics of the main and reference RF paths can removed as a so-called common-mode signal, allowing the replica amplifying circuit (155) to provide clear control information on a second effect, for example, a mismatched load or a low battery voltage, in the presence of high temperature operation.

As discussed later with reference to FIG. 16, more than one reference RF paths (855) can be used as references for comparison of operating characteristics with the main RF path (850), where the reference RF paths (e.g. 855a of FIG. 16) can each be isolated from different operating variables that affect performance of the main RF path (850). One such exemplary embodiment according to the present disclosure is shown in the IC layout (900d) of FIG. 9D, where two reference RF paths (855) are shown, one thermally coupled to the main RF path (850) and the other substantially thermally isolated from the main RF path (850). Again, the IC layout (900*d*) can equally apply to relative placement of the entire RF paths (850, 855), or of the corresponding amplifier circuits (150, 155). In this embodiment, an operating characteristic of the replica amplifying circuit (155) that is thermally coupled to the main RF path (850) may be sensed and compared to a corresponding sensed operating characteristic of the replica amplifying circuit that is thermally isolated from the main RF path (850), thereby providing additional information and feedback control to the main RF path (850) and/or the main amplifying circuit (150).

Figure 10:
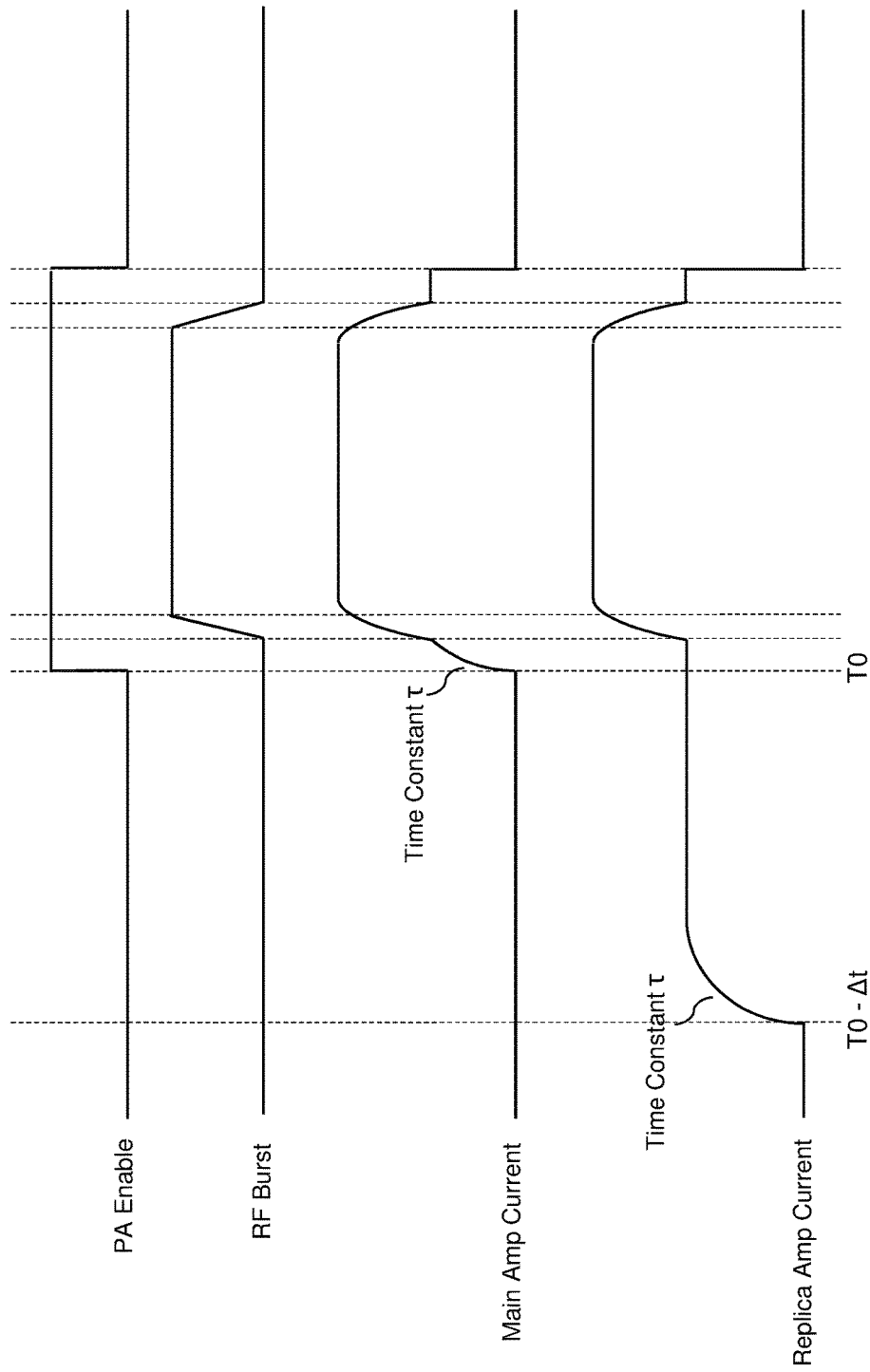
FIG. 10 shows a timing diagram of a pulsed amplifier used as the main circuit in the main RF path, and a replica of the pulsed amplifier used in the reference RF path to improve a transient response of the main RF path.

FIG. 10 shows timing diagrams associated to another exemplary embodiment according to the present disclosure where a reference RF path comprising a replica amplifying circuit is used to control operating characteristics of a main RF path that is affected by certain operating variables. It should be noted that the use of a reference RF path, or a replica RF circuit, according to the various embodiments of the present disclosure, can equally be applied to other RF and analog applications such as mixers, VCOs, charge pumps, LNAs, and other circuits comprising one or more transistors forming a main circuit of the main RF path. A person skilled in the art would know how to use the present teachings to design in view of such other applications by using a reduced size replica circuit of the main circuit. Scaling of the reduced size replica circuit may be provided according to any of the various embodiments described in the present disclosure.

FIG. 10 shows a timing diagram of a pulsed amplifier (e.g. power amplifier) signal. A person skilled in the art readily knows that many RF systems rely on pulsed transmission as part of their modulation. In such systems, the turning ON and OFF the amplifier is often a complex and difficult part of the amplifier specification, especially with variable operating conditions, such as, for example, temperature or power supply, as discussed above. A key issue with the pulsed amplifier is that as the amplifier ramps up its power (denoted main amp current in FIG. 10), it may be transitioning from an unpowered state (e.g. unbiased, idle/inactive state) to a desired bias condition (active state) designed for the main transmission pulse. A leading edge transition of the main amp current, corresponding to the start of the ramp up, is shown in FIG. 10. As can be seen in FIG. 10, the main amp current initially ramps according to two different step ups in bias current, where a first of the two step ups, denoted by its time constant T, has a relatively long time constant due to the size and internal capacitance of the amplifier, as well as possible slow biasing time constants associated with the transistor devices of the amplifier (e.g. floating body effects).

With continued reference to the timing diagram of FIG. 10, after the first step up in bias current of the amplifier is reached, the amplifier is expected to be near its proper bias point and then the RF input power is controllably ramped up (via the RF burst signal) to meet various system specifications, especially distortion and spurious transmissions that can degrade other radios in the vicinity. However, due to the relatively long time constant T with respect to the timing between the start of the RF burst signal and the start of the PA enable signal, it may be possible that the amplifier is not at its proper bias point when it starts to ramp up the power (start of RF burst), thereby causing violation of system specification (e.g. as regulated by local entities) and possible output signal distortion. It follows that, according to an embodiment of the present disclosure, a scaled replica amplifier is used to ramp up to its bias condition (replica amp current graph of FIG. 10) in such a way that the scaled replica amplifier operates at its (steady state) bias condition before the first step up in bias current of the main amplifier, as shown in FIG. 10. By using the replica amplifier as a reference for the biasing of the main amplifier during the time window between the start of the PA enable and the start of the RF burst signals, biasing correction to the main amplifier based on a sensed difference in biasing between the two amplifiers can be provided.

Although FIG. 10 indicates that the replica amplifier is enabled at a fixed time, Δt, before the enabling of the main amplifier, according to an alternative embodiment of the present disclosure, the replica amplifier may always remain active and therefore be at its intended operating bias condition at all time. The exemplary embodiment according to FIG. 10 isolates the replica amplifier (reference RF path) with respect to transient effects of the main amplifier (main RF path) to allow controlling of the biasing of the main amplifier, where the replica amplifier may use much less power (by the scaling factor) than the main amplifier.

With further reference to the timing diagram of FIG. 10, the replica amplifier being a scaled version of the main amplifier, it consumes substantially less power than the main amplifier, and therefore can be turned on early enough to reach its own steady state conditions without burning the power that would be used if the main amplifier were turned on that early. Bias control circuits (e.g. 850*b* of FIG. 8B) and the control circuit (e.g. 890, 895 of FIGS. 8D, 8E, 8F) that controls the main amplifier (e.g. 150) based on the replica amplifier (e.g. 155) can be designed to have a fast time constant relative to the time constant T of FIG. 10, to allow for fast correction and settling of the biasing of the main amplifier within said time window between the start of the PA enable and the RF burst signals. A person skilled in the art readily knows that such fast time constant is a mere design parameter. This is contrasted with some time constants in the transistor devices of the amplifiers, for example, that may not be able to be controlled (e.g. floating body effects, internal capacitance, etc.). By turning the replica circuit ON early, the replica settles to its proper bias levels, and then control circuitry works to quickly get the main amp to the desired bias level when activated, to provide a desired power ramp us responsive to the RF burst signal. By being in final, steady-state conditions prior to introduction of the RF input signal, cleaner output signals may result as well as saving power consumption and heat loads. Additionally, parameters such as gain and output power may be more constant over the RF burst.

A person skilled in the art would appreciate the flexibility provided by the present teachings, as a reference RF path may be isolated from one or more operating variables, or alternatively, different reference RF paths may be used, each isolated from one or more different operating variables. For example, embodiments described with respect to FIGS. 9A-9D may be combined with the embodiment described with respect to FIG. 10. For example, if the (power) amplifier operates at a 50% duty cycle, it may have an elevated temperature, even during its OFF period. By combining the temperature comparison, described with respect to FIGS. 9A-9D, with the ramp up control, described with respect to FIG. 10, temperature compensated bias conditions can be set for the turn-on phase of the main amplifier.

Figure 11A:
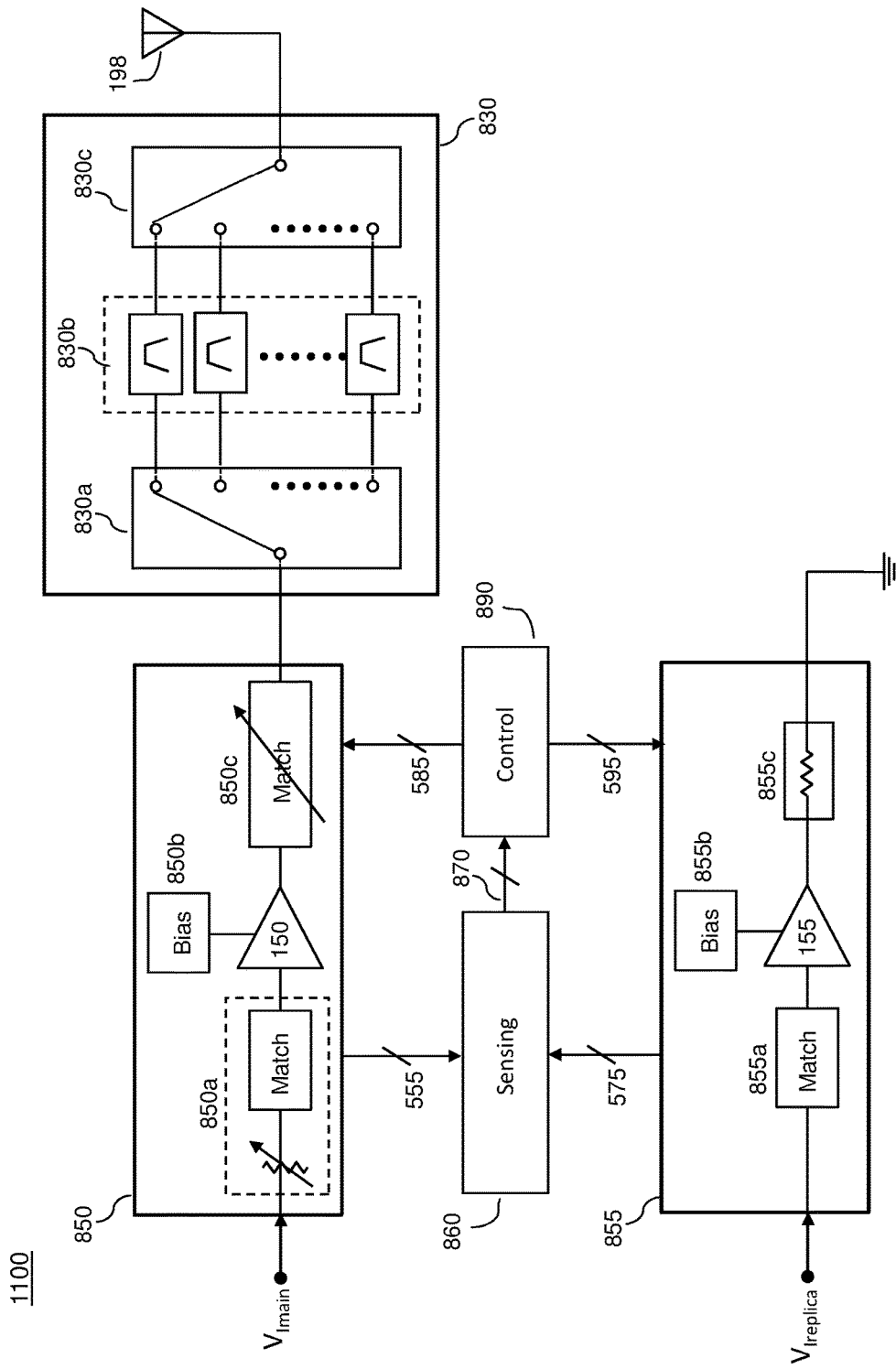
FIG. 11A shows an embodiment according to the present disclosure, where the reference RF path is used to improve frequency response of the main RF path.

FIG. 11A shows a further embodiment according to the present disclosure where a reference RF path (855) is used to improve frequency response of an RF system (1100) comprising a main RF path (855). The main RF path (850) comprising an amplifying circuit (150), and the reference RF path (855) comprising a reduced size replica (155) of the main amplifying circuit (150). As can be seen in FIG. 11A, the main RF path (850) comprises an output match (850c) which couples to RF path to subsequent RF blocks, including RF block (830) and antenna (198). The RF block (830) may comprise one or more filters (830b) which can be selectively coupled in and out of a conduction path between the main RF path (850) and the antenna (198) via one or more switches (830a, 830c). The filter (830b) may be a bandpass filter, although any other type of filter, such as, for example, a notch filter, a passband filter, a band reject, a low pass filter, and a high pass, may also be possible.

Figure 11E:
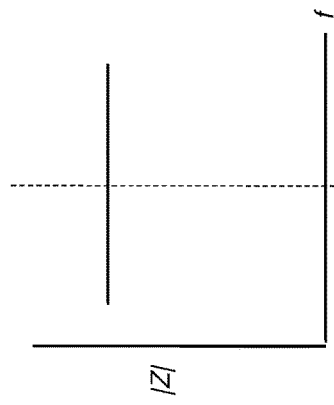
FIGS. 11B, 11C, 11D, 11E and 11F show exemplary frequency response curves of RF elements coupled to the main and the reference RF paths.
Figure 11F:
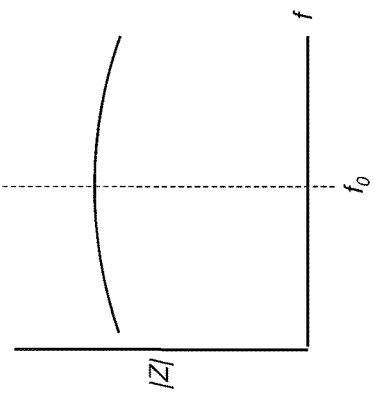
Figure 11B:
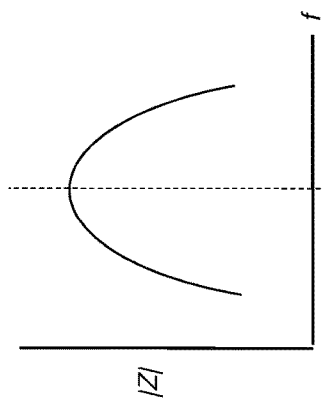
Figure 11C:
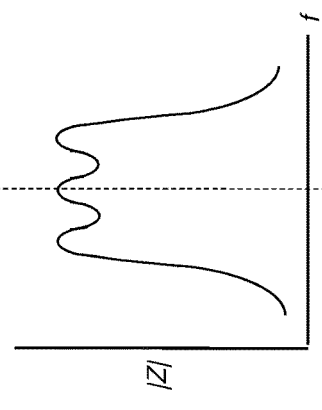
Figure 11D:
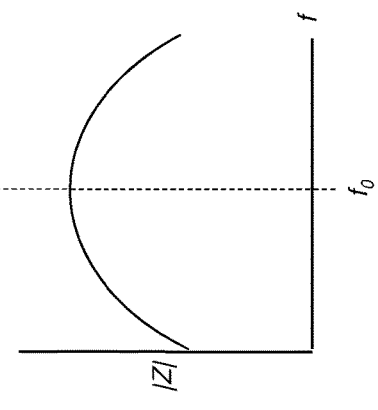

With further reference to FIG. 11A, the frequency response curves shown in FIGS. 11B, 11C and 11D respectively show exemplary responses of the impedance match (850c), the band pass filter (830b), and the antenna (198). It should be noted that the impedance of the antenna (198) may also vary over time as a function of an environment of the antenna, and therefore, the exemplary frequency response shown in FIG. 11D may be considered at the frequency response of the antenna at a fixed location and environment. The main amplifying circuit (150) sees an output match impedance that is set by the output matching network (850c) as desired, but also included effects of the impedances of the RF blocks (830, 198) that follow it. The resulting variations in amplifier output matching may result in undesired gain, power, or power added efficiency (PAE) of the main RF path (850). As person skilled in the art would know, it may be difficult to anticipate all of the external effects of the coupling of the RF blocks (830, 198) over a performance of the main RF path (850) and design for them in advance. The person skilled in the art would therefore appreciate benefits provided by the reference RF path according to the present disclosure, which through its reduced size replica amplifying circuit (155), can provide a more ideal reference for correction of performance variations in the main RF path.

FIG. 11E shows a frequency response of an ideal resistive load (855c) coupled to an output of the replica amplifying circuit (155) of FIG. 11A. By sensing the main RF path (850) and comparing to the results from the replica RF path (855), a difference signal (870) may be detected and used to tune the main RF path (850) at any of the variable RF circuit blocks (850a, 850b, 850c) of the main RF path (850). In particular, and with further reference to FIG. 11A, the (pre-processing) RF block (850a) may comprise a variable attenuator coupled to an input matching circuit, the (post-processing) RF block (850c) may comprise a variable output match circuit, and the biasing circuit (850b) may be a variable bias system, all of which can be adjusted to control the main RF path (850) output to achieve a desired broad band output achieved by the ideally-terminated reference RF path (855). In this example, a person skilled in the art would understand that gain may be adjusted through the bias circuit (850b) or the output matching circuit (850c), while output power may be adjusted through the input attenuation circuit of the RF block (850a).

FIG. 11F shows another exemplary embodiment of a frequency response of a termination load (855c) to the replica amplifying circuit (155) of FIG. 11A. In this embodiment, the termination of the replica amplifying circuit (155) can be chosen to mimic a broadband match that may either be desired (lower gain at the edges of the bandwidth, as shown in FIG. 11F) or may be representative of a realistic frequency response achievable. In the latter case, the replica amplifying circuit (155) provides reference signals (575) to generate control signals (585) that drive the main RF path (850) to achieve a better performance. It should be noted that while this example illustrates the application of the present teachings to correct for output match variation, it can equally be applied to the input match, matching of other stages, or other elements within the main RF path (850).

Figure 12:
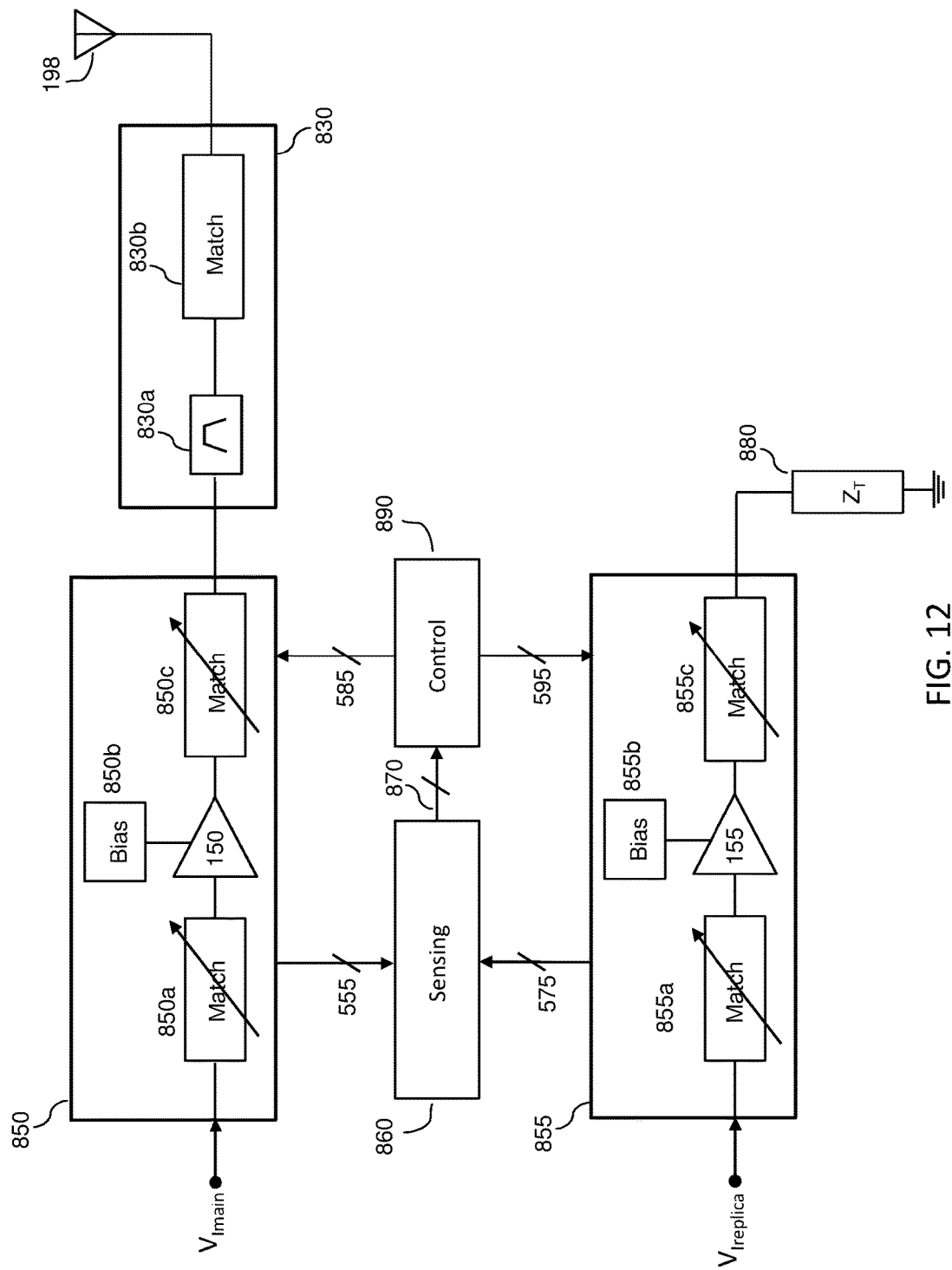
FIG. 12 shows a variation of the embodiment of FIG. 11A, where a bandwidth of the reference RF path can be increased by way of provision of variable match conditions, which in turn can allow improvement in controlling the frequency response of the main RF path.

FIG. 12 shows an embodiment according to the present disclosure which is an extension of the embodiment described with respect to FIGS. 11A-11F. As shown in FIG. 12, variable match conditions (855a, 855c) can be included to the replica amplifying circuit (155) of the reference RF path (855) to extend a bandwidth of the replica amplifying circuit (155) (and therefore of the reference RF path 855) beyond a native bandwidth. Extending the bandwidth of the replica amplifying circuit (155) can enable generation of control signals (585) that can drive the main RF path (850) to a broader bandwidth than a bandwidth possible from the implementation described with respect to FIGS. 11A-11F. Settings of the variable match conditions (855a, 855c) for providing the extended bandwidth replica amplifying circuit (155) of FIG. 12, may be generated through a calibration step or may be done by comparing various settings of the extended bandwidth replica amplifying circuit (155) to a second scaled replica amplifying circuit with an ideal match having a broad band frequency response (e.g. per FIGS. 11E, 11F).

Figure 13A:
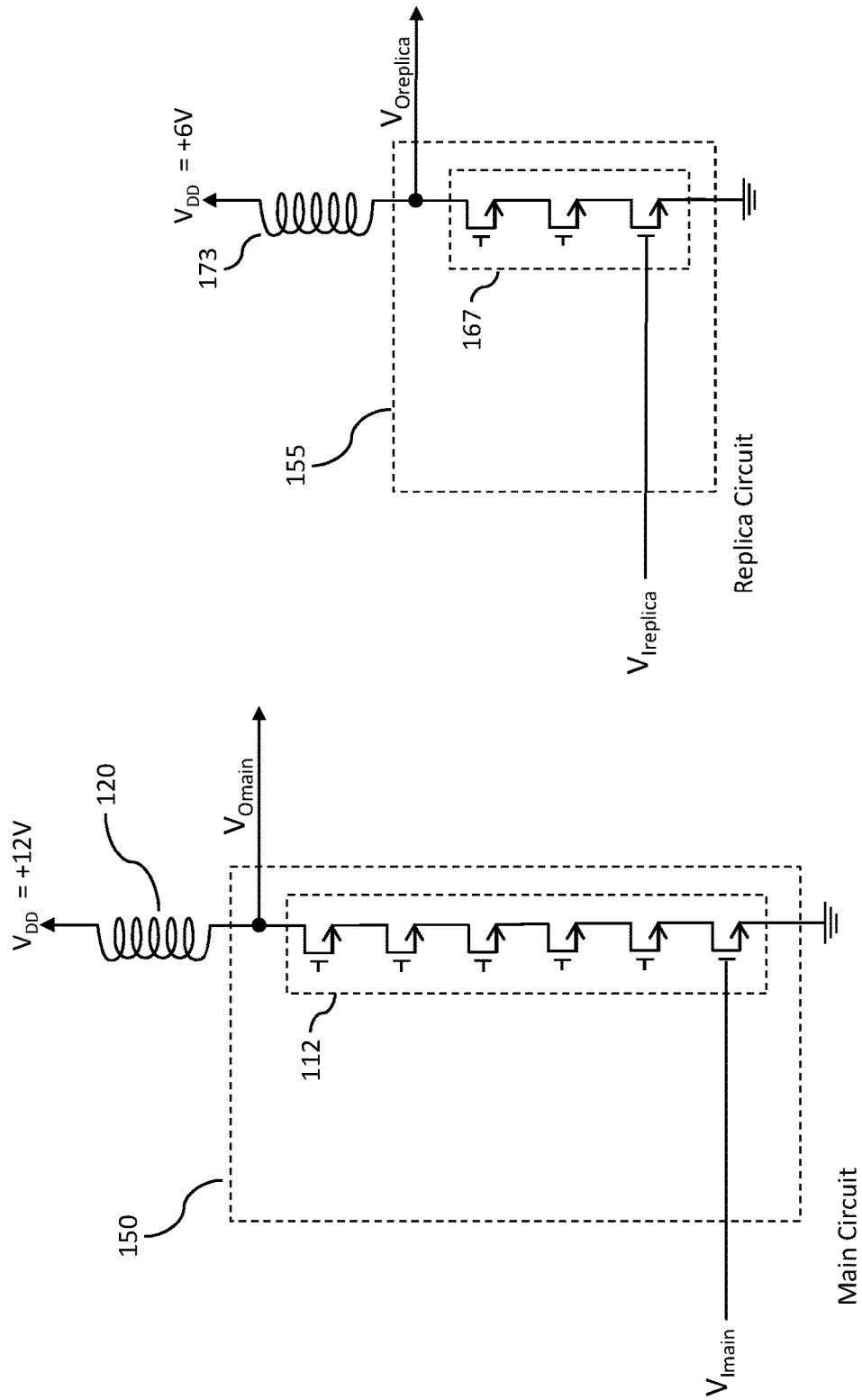
FIGS. 13A, 13B and 13C show various methods for scaling the replica circuit with respect to the main circuit.
Figure 13B:
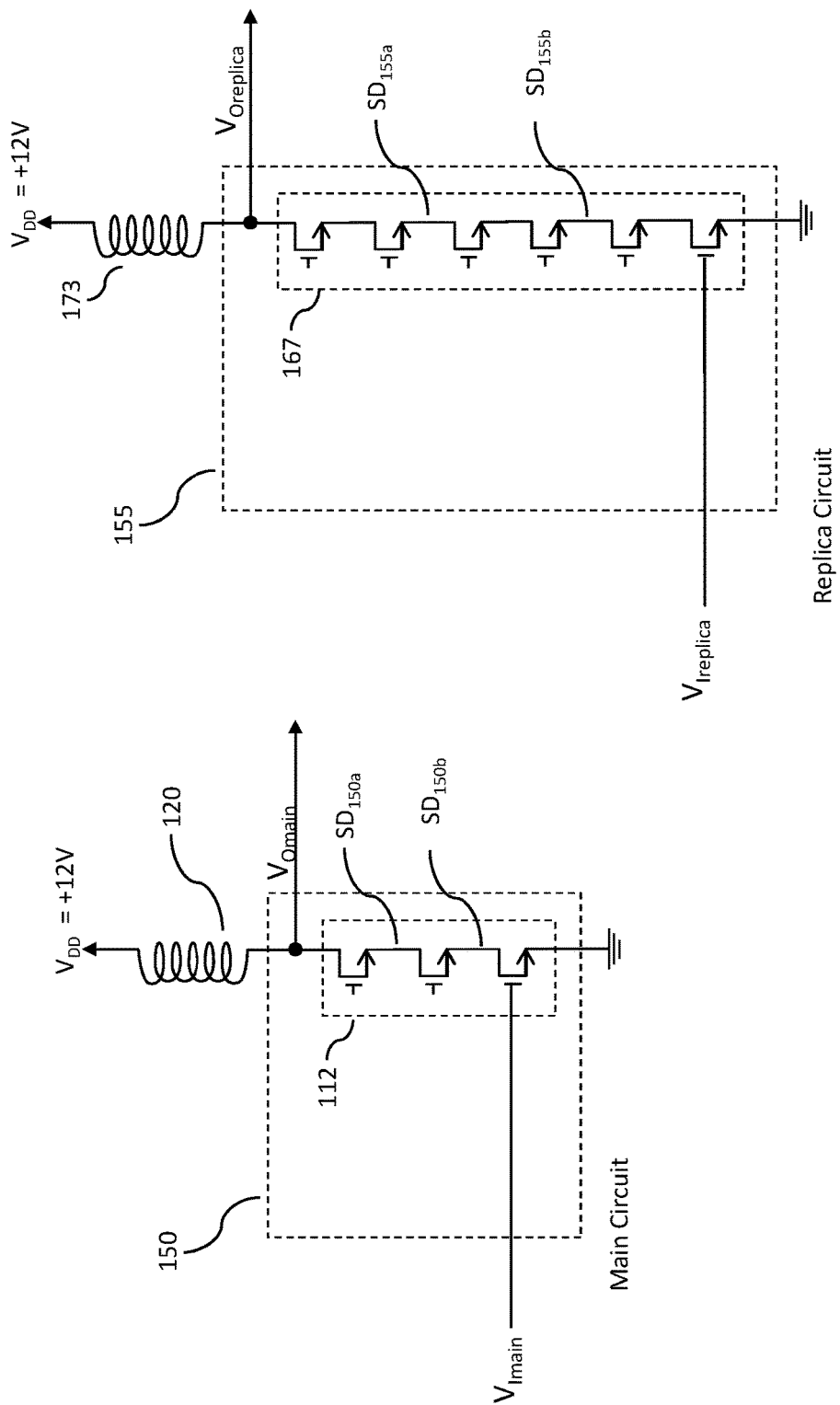
Figure 13C:
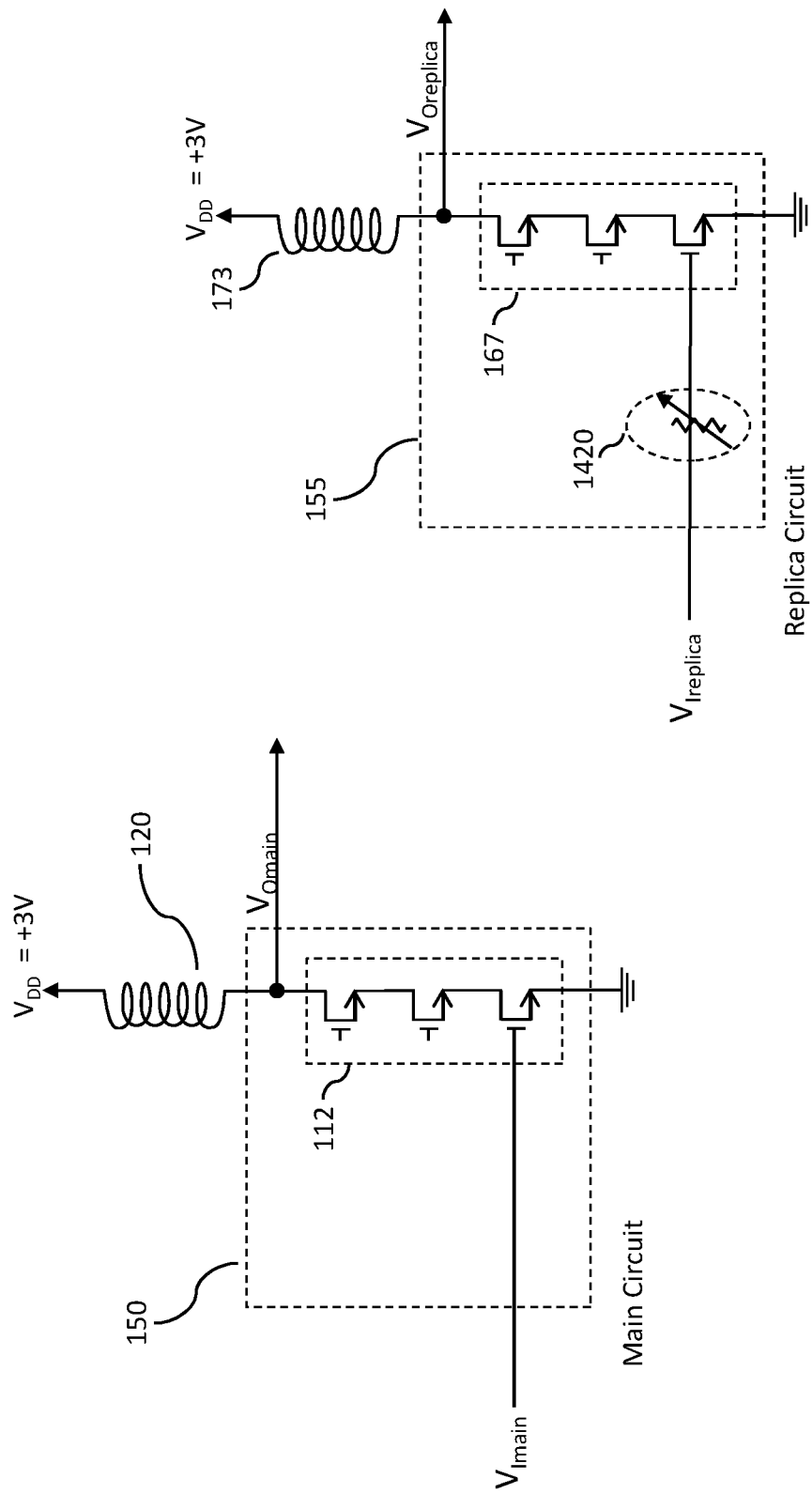

As previously described, scaling of the width, W, of the replica amplifying circuit (155) by a factor, for example 1:100, to the width of the main amplifying circuit (150) can be an effective, but not unique, way to scale the replica circuit to the main circuit. FIGS. 13A-13C show additional exemplary scaling techniques that are particularly suitable for CMOS technology, and further suitable for isolated CMOS technology such as SOI, SOS, or bulk Si, that enable individual transistors to be stacking in series. Stacking of CMOS FETs enables the stack to handle higher voltages (and therefore RF power) than any single FET. More information on stacking CMOS FETs can be found, for example, in the above referenced U.S. Pat. No. 7,248,120, and U.S. Pat. No. 9,413,298, whose disclosures are incorporated herein by reference in their entirety. It should be noted that although in the above description the primary active elements of the main and the reference RF paths (850, 855) are described as amplifying circuits (150, 155), a person skilled in the art would understand that the present teachings should not be considered limited to such exemplary amplifying circuits, as such teachings can equally be applied to any RF circuit comprising active transistor devices whose performance can be affected by a set of operating variables. Accordingly, the replica circuit may include a scaled version of the active transistor devices to provide a replica (reference) circuit of the main circuit with operating characteristics that can be mapped to the operating characteristics of the main circuit. A person skilled in the art would understand that such mapping may be represented by any deterministic function that can provide a one to one relationship between operating characteristic of the main and the reference circuits. Accordingly, the present teachings can be applied to RF paths comprising mixers, VCOs, charge pumps, LNAs, and other.

FIG. 13A shows a main circuit (150) comprising series connected transistors arranged as a stack (112), and a replica circuit (155) that is a scaled version of the main circuit (150), the replica circuit (155) also comprising series connected transistors arranged as a stack (167). As can be seen in FIG. 13A, number of series connected transistors (stack height) of the two stacks (112, 167) are scaled. In the exemplary embodiment depicted in FIG. 13A, the main circuit (150) has a stack height of 6 transistors while the scaled replica circuit (155) has a stack height of 3 transistors. In this example, the applied bias (supply voltage) is also scaled by 2:1, meaning transistors in both the main circuit (150) and the replica circuit (155) can experience the same DC bias, as the applied bias is distributed across the number of transistors of the stacks. Such a design can enable the scaled replica circuit (155) to track an ideal operating condition of the main circuit (150) but with smaller physical area. This approach may also have benefits such as allowing other RF blocks of an associated reference RF path (855) of the replica circuit (155) to operate from a lower supply voltage (e.g. 6V versus 12V) which may be easier to accommodate.

With further reference to FIG. 13A, a person skilled in the art would understand that the ratio of the stack heights could be according to a higher stack height on the scaled replica circuit (155) than on the main circuit (150) (with much lower device width to keep the scaled replica stack small), as shown in FIG. 13B. In the exemplary embodiment depicted in FIG. 13B, assuming equal bias voltages on each stack (e.g. 12V), each transistor in the stack (167) of the replica circuit (155) may experience half the DC bias as compared to each transistor in the stack (112) of the main circuit (150). However, the bias points experienced at the nodes ($SD_{155a}$, $SD_{155b}$) between pairs of transistors in the stack (167) of the replica circuit (155) have same conditions as the bias points experienced at the nodes ($SD_{150a}$, $SD_{150b}$) between pairs of transistors in the stack (122) of the main circuit (150). Such condition means that each transistor in the stack (167) of the replica circuit (155) may have exponentially lower stress effects (such as hot carrier injection, HCI, in a DC biased RF power amplifier). Such an arrangement of scaling the stack heights, as shown in FIG. 13B, can enable HCI effects in the main amplifier circuit (150) to be compensated for by the scaled replica circuit (155).

As known to a person skilled in the art, active devices (e.g. transistors) can be stressed by their operating conditions. This stress can reduce the operating lifetime or reliability of the device. Examples of stress for a CMOS device include Hot Carrier Injection (HCI) and Time Dependent Dielectric Breakdown (TDDB). TDDB is a voltage stress on the gate oxide which results in a conduction path forming through the gate oxide. It is primarily a function of the stressing voltage, time, and temperature. It can be affected by DC and RF conditions. HCI results from carriers with high kinetic energy from the electric field being injected into regions such as the gate oxide. These trapped carriers then affect device parameters such as the threshold voltage, which lead to a change in current conduction. The effects are cumulative. HCI is a function of the voltage and current conditions that result from DC and RF operation.

FIG. 13C shows a further exemplary embodiment of a scaling technique in which the replica circuit (155) has a same stack height and supply voltage as the main circuit (155), but with an RF attenuator (1420) on its input. The transistor devices in the stack (167) of the replica circuit (155) may experience less device degradation from a high power RF input signal (at node $V_{Ireplica}$) to the replica circuit (155), or from high power RF output signal (at node $V_{Oreplica}$) from the replica circuit (155). A person skilled in the art would recognize that the scaled replica circuit (155) of FIG. 13C may be used in conjunction with additional scaled replica circuits, each of the scaled replica circuits designed to control different, potentially independent, operating variables.

With further reference back to FIG. 12, the replica amplifying circuit (155) of the reference RF path (855) may be used to drive the main amplifying circuit (150) of the main RF path (850) in ways that the feed forward path of the main amplifying circuit (150) would not ordinarily achieve. The embodiment of the present teachings presented in relation to FIG. 10 is an example in which the replica amplifying circuit (155) is designed to anticipate and correct an issue (ramp up profile) in the main amplifying circuit (150). In the embodiment of the present disclosure depicted in FIG. 12, the replica amplifying circuit (155) not only corrects for issues related to operating variables, such as temperature, but also provides a pre-conditioning function that reduces effects on performance by inherent characteristics of the main amplifying circuit (150) (slow ramp up time). Therefore, in the exemplary embodiment according to the present disclosure depicted in FIG. 12, the reference RF path (855) may be used as a driver of the primary performance of main RF path (850) in addition to being used to compensate for the performance of the main RF path (850) in response to operating variables. Many traditional RF functions could be performed in this manner such as modulation, feed forward compensation, phase or amplitude correction, etc. An advantage of using the replica amplifying circuit (155) in the reference RF path (855) is that it is fundamentally smaller, and therefore contains lower parasitics and coupling.

Figure 14:
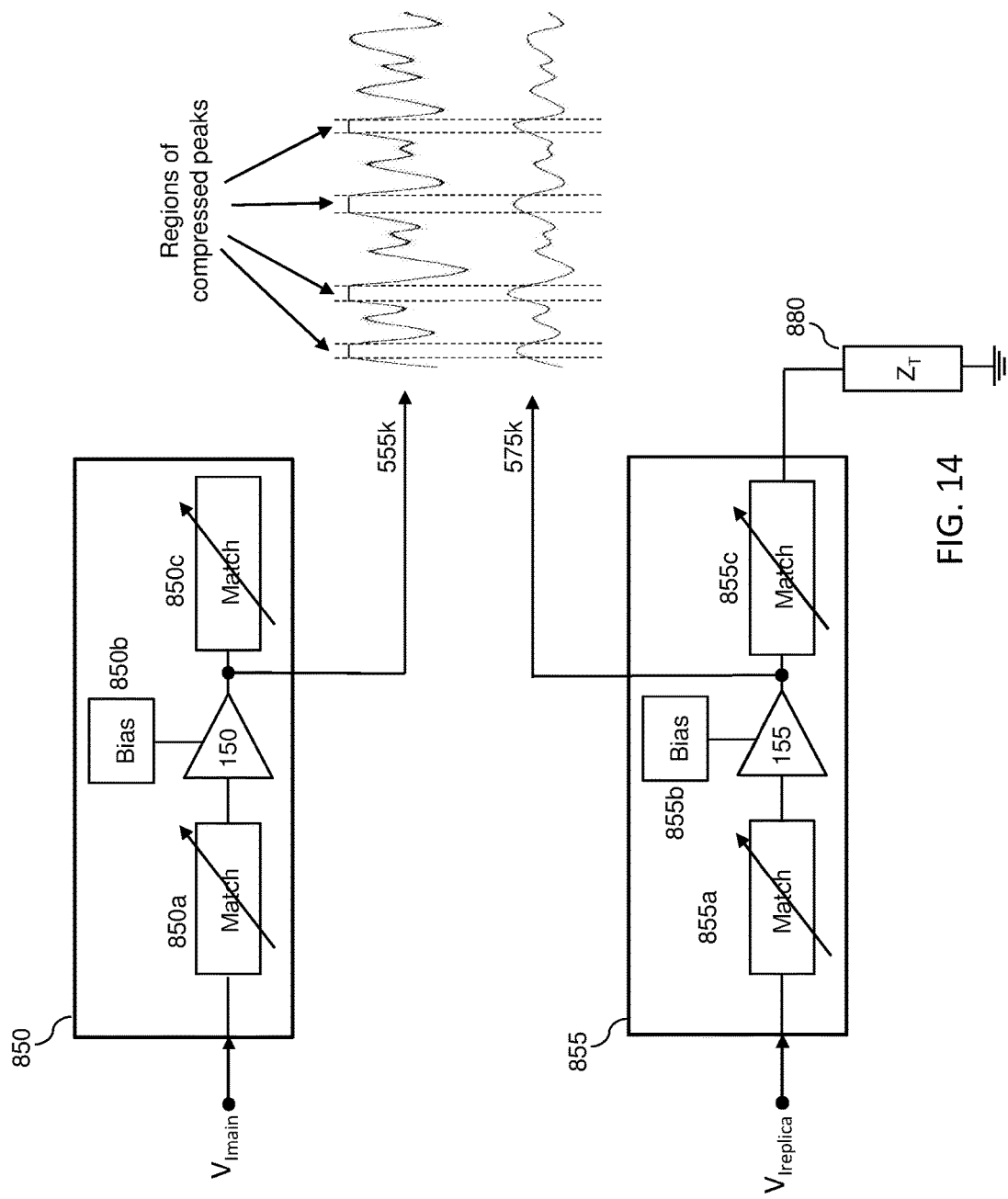
FIG. 14 shows an embodiment according to the present disclosure, where the reference RF path is used to improve distortion due to signal compression in the main RF path.

A further embodiment according to the present disclosure is shown in FIG. 14, in which a specific well-known issue, compression, can be detected and corrected. In this example, the envelope of an output signal, sensed at a sensing point (555k), of the main RF path (850) is compressed. This may be due, for example, to a case where the envelope amplitude at an output signal of the main amplifying circuit (150) exceeds a linear range of the amplifying circuit (150), and therefore cannot deliver a desired peak voltage. As shown in FIG. 14, the peak value of the output signal from the main RF path (850), sensed at the sensing point (555k), flattens as compared to its desired level. In this case, as can be seen in the sensed envelope signal of the replica amplifying circuit sensed at the sensing point (575k), the replica amplifying circuit (155) of the reference RF path (855) has not compressed, so the reference RF path (855) may provide an accurate peak level, in real time, that can be compared to the sensed envelope of the output of the main circuit (155) or the output of the main RF path (850). It should be noted that although FIG. 14 shows the sensing points to be at the amplifying circuits, other sensing points, whether within the amplifying circuits or in subsequent RF blocks (e.g. 850c, 855c) may also be envisioned.

With further reference to FIG. 14, a person skilled in the art would recognize that there are several ways to detect and compare the peak value of the envelope, including a peak detector, op amp comparison of the demodulated envelope, direct conversion with an A/D converter and others. Key to this embodiment is that an accurate representation of a desired signal at the main RF path (850) may be available in real time from the reference RF path (855). The replica amplifying circuit (155) can be designed to have excess operating headroom, possibly by choice of bias setting or match impedance, so that it does not distort (compress) on the signal peaks that main amplifying circuit (150) distorts. Accordingly, based on a sensed envelope signal from the reference RF path (855) and comparison to a sensed envelope signal from the main RF path (850), distortion in the main RF path (850) may be corrected. Such correction may include changing parameters of the main RF path (850), such as, for example, bias conditions (850b of FIG. 14) or match impedances (850a, 850c of FIG. 14).

As known to a person skilled in the art, one or more small resistors may be added in a series connection with a conduction path of the main RF amplifier, such as in series connection with stacked transistors of the amplifier, to measure a current passing through the amplifier. Such monitoring resistors in series in high current paths, such as those in RF power amplifiers, may dissipate substantial power in proportion to the square of the current and may therefore not be desirable. However, due to the reduced size of the replica amplifying circuit (155) of the present teachings, as shown in FIG. 15A, and corresponding reduced current through a corresponding transistor stack (167), a sensing resistor (1525) in series connection with the stack (167) becomes a viable means for measuring a reference current, through the stack (167), at much lower power. As shown in FIG. 15A, such current sensing resistor (1525) may be placed between a supply voltage $V_{DD}$ node and an inductor (173) coupled to the output of the replica amplifying circuit (155). Alternatively, or in addition, one or more sensing resistors (1525) may be placed within the stack (167), in series connection with the transistors of the stack (167), as shown in FIG. 15B. Such sensing resistors may be fixed and therefore always in series connection with the transistors of the stack (167), or may be selectively placed in series connection, via, for example, one or more switches. A person skilled in the art would know of many ways to achieve this.

With further reference to FIGS. 15A, 15B, if the scaling factor of the replica amplifying circuit (155) with respect to current is 1:100, then the current flowing through the replica amplifying circuit (155) is 1% of that flowing through the main amplifying circuit (150). Therefore, the power dissipated in the sensing resistor (1525) is $1/10^4$ of the power that may be dissipated in a resistor placed in the main amplifying circuit (150). In addition to saving power, the replica current measurement provided by the embodiments depicted in FIGS. 15A, 15B, can also be used to correct or drive the main RF path (850) in accordance with the control teaching described above. Such current measurement may also be combined with a voltage measurement to calculate power generated. By means of circuitry known to a person skilled in the art, either DC power or RF power may be measured and used to control the main RF path (850).

Figure 16:
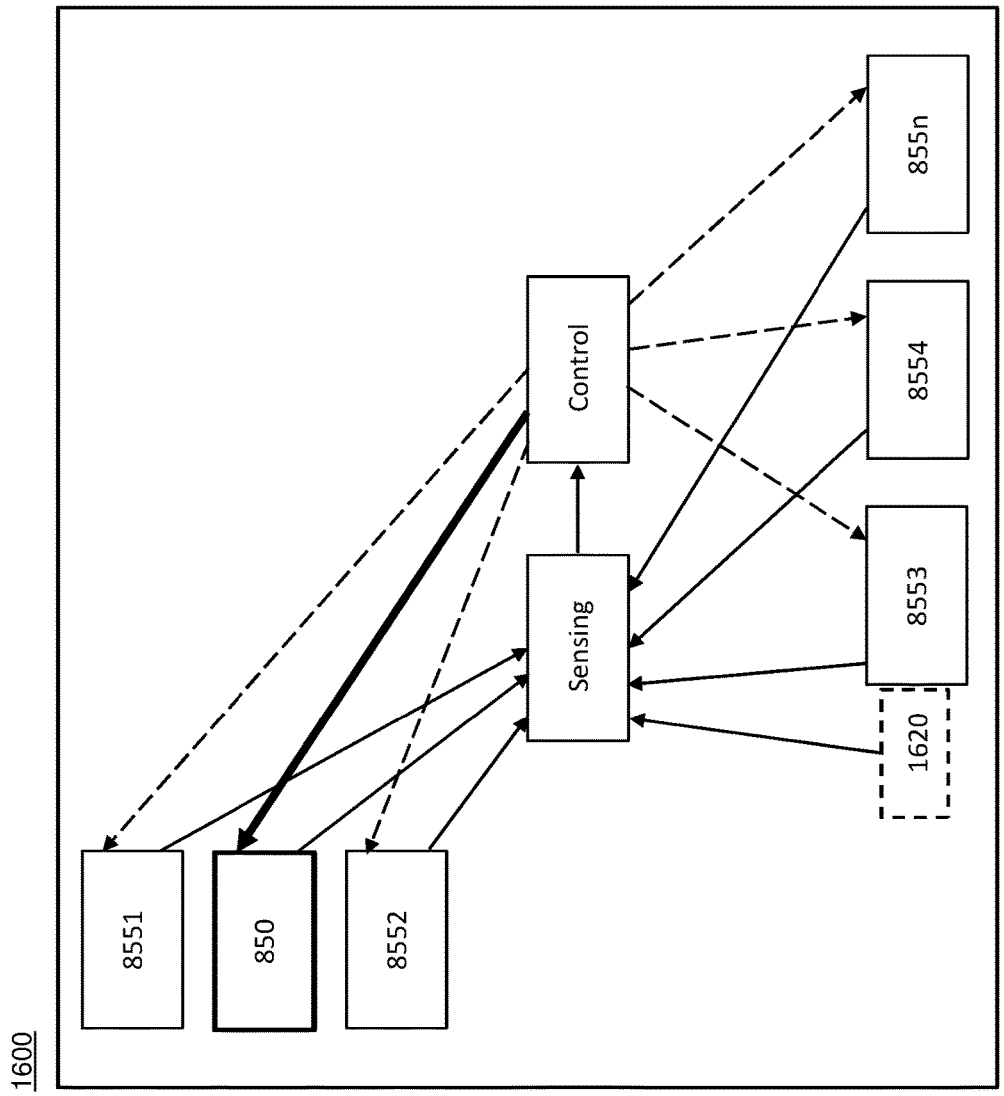
FIG. 16 shows an embodiment according to the present disclosure, where a plurality of reference RF paths are used to improve different operating characteristics of the main RF path, where the plurality of reference RF paths can each be isolated from one or more operating variables affecting the operating characteristics.

In a further embodiment according to the present disclosure depicted in FIG. 16, an exemplary RF system (1600) is shown where multiple reference RF paths (8551, 8552, ..., 855n), are each configured to provide a reference with respect to one or more operating characteristics of the main RF path (850). Each RF path (8551, 8552, ..., 855n) of FIG. 16 can be configured according to any of the embodiments described in the present disclosure, and accordingly can be isolated from any, all or none of the operating variables that affect the performance of the main RF path (850). Sensing points of the different reference RF paths (8551, 8552, ..., 855n) can be used to sense differences in operating characteristics of such paths with respect to operating characteristics of the main RF path (850), and control/adjust the main RF path (850) accordingly.

With further reference to the RF system (1660) of FIG. 16, according to an exemplary embodiment of the present disclosure, two or more reference RF paths (8551, 8552, ..., 855n) may be used to correct one or more operating characteristics of the main RF path (850). For example, a first reference RF path (8552) may be thermally coupled to the main RF path (850), a second reference RF path (8554) may be thermally isolated from the main RF path (850), and a difference in sensed currents between the first and the second reference RF paths (8552, 8554) may be used to adjust for any operating characteristic of the main RF path (850) using, for example, a mapping function that maps the difference in current though the reference RF paths (855b, 855d) to correction control signals (585) that correct for a corresponding expected drift in operating characteristics of the main RF path (850) when applied to configurable RF blocks (e.g. 850a, 850b, 850c) of the main RF path (850).

The plurality of reference RF paths (8551, 8552, ..., 855n) shown in FIG. 16 can be used to provide control or feedback on many different operating variables. This may be particularly useful when multiple operating variables may have co-dependencies (such as temperature and battery voltage) that can be separated from each other with this cost-effective solution.

A person skilled in the art would know how to use the teachings according to the present disclosure in view of desired design goals and performance, and accordingly complement the present teachings. For example, in one case it may be desirable to use a reference RF path (8553 of FIG. 16) that is not only thermally isolated from the main RF path (850), but that is also thermally compensated for any drift in local temperature of the reference RF path (8553). The person skilled in the art may achieve this by introducing a temperature sensor (1620) to the RF system (1600) in proximity to the reference RF path (8553), as shown in FIG. 16, where the RF reference RF path (8553) is placed at a distance from the main RF path (850) that is sufficient for substantially thermally decoupling the two RF paths. The sensing circuit (860) may sense the temperature at the reference RF path (855c) via the temperature sensor (1620), and the control circuit (890) may adjust the configurable block (855a, 855b, 855c) of the reference RF path (8553) to correct for at least one or more reference characteristics for which the reference RF path (8553) is used.

As discussed above, the main circuit (150) of the main RF path (850) may be other than the exemplary amplifying circuit (150) shown, for example, in FIGS. 13A-13C. According to one exemplary embodiment of the present disclosure, the main circuit may be a distributed amplifier (1700) as shown in FIG. 17. A person skilled in the art would know the principle of operation of such circuit, detailed description of which is beyond the scope of the present disclosure. As can be seen in the amplifier representation of FIG. 17, the distributed amplifier (1700) comprises a plurality of cascaded stages (S1, S2, ..., S3) that are inductively coupled. Inductances ($L_{G1}$, $L_{G2}$, ..., $L_{G3}$) couple an input signal at an Input port of the distributed amplifier (1700) to input nodes of each amplification stage (S1, S2, ..., S3), and inductances ($L_{D1}$, $L_{D2}$, ..., $L_{D3}$) couple output of each amplification stage (S1, S2, ..., S3) to an Output port of the distributed amplifier (1700). Such inductances are designed to control phase of the inputs to each amplification stage (S1, S2, S3) with respect to the input signal at the Input port of the distributed amplifier (1700), as well as to control phase of the outputs of the amplification stages (S1, S2, ..., S3) to provide the output signal at the Output port of the distributed amplifier (1700). In the exemplary embodiment depicted in FIG. 17, each amplification stage (S1, S2, ..., S3) is shown as a transistor, which may have associated transistor characteristics, denoted by: Wg (gate periphery), Cds (drain-source capacitance), Rds (drain-source resistance), and Cgs (gate-source capacitance). Accordingly, inputs to the amplification stages (S1, S2, ..., S3) are shown as gate nodes, and outputs of the amplification stages (S1, S2, ..., S3) are shown as drain nodes. A person skilled in the art would understand that each amplification stage (S1, S2, ..., S3) may in turn comprise a transistor stack (as per FIGS. 13A-13C) as well corresponding biasing (not shown in FIG. 17). A person skilled in the art would also recognize that the inductors ($L_{G1}$, $L_{G2}$, $L_{G3}$) and ($L_{D1}$, $L_{D2}$, ..., $L_{D3}$) could be implemented as either discrete, distributed or a combination of discrete and distributed. The distributed amplifier (1700) depicted in FIG. 17 is for illustrative purposes only and is not intended to be a full treatment/representation of the well documented subject.

With continued reference to FIG. 17, a person skilled in the art would understand that provision of the coupling inductances can be made according to a design optimization process that tightly controls input/output phase relationships of the amplification stages (S1, S2, ..., S3) in view of the transistor characteristics and circuit layout. As the transistor characteristics may deviate/drift in view of operating variables of the distributed amplifier (1700), performance of the distributed amplifier can be degraded (e.g. output signal distortion). It follows that according to an embodiment of the present disclosure, a replica circuit of the distributed amplifier may be used to track characteristics of the main circuit (1700) and use such tracking to compensate for any performance degradation of the main circuit (1700). In other words, the replica circuit may be used as a proxy to the main circuit (1700) to monitor performance of the main circuit and compensate accordingly. As described above, monolithic integration can allow precise tracking of performance of the main circuit (1700) via the (reduced size) replica circuit with accuracies not possible otherwise. Such tracking may indicate, for example, a change in the Cgs (gate-source capacitance), or a change in a bias point, of an amplification stage (S, S2, ..., S3) of the main circuit (1700).

With further reference to FIG. 17, a corresponding replica circuit may be used, for example, to track and detect (e.g. via sensing circuit 860) a deviation of the Cgs of the main amplification stage S1, and accordingly the control circuit (890), may adjust a gate periphery size of a corresponding amplification stage of the replica circuit to arrive at a desired Cgs value and use such adjustment to adjust the gate periphery of the amplification stage S1 of the main circuit (1700). A person skilled in the art would know that adjustment of a gate periphery may be provided in a scalable periphery structure, where a main structure is composed of a plurality of smaller parallel structures. More information on a scalable periphery structure can be found, for example, in the referenced U.S. patent application Ser. No. 13/797,779, whose disclosure is incorporated herein by reference in its entirety. According to an exemplary embodiment of the present disclosure, the sensing circuit (860) may sense a change in the Cgs of the corresponding S1 amplification stage of the replica circuit by directly measuring the Cgs of the replica circuit, by measuring a resonance frequency of the replica circuit, or by measuring a frequency response of the replica circuit. A person skilled in the art would understand that adjustments to the main circuit (1700) may be based on an overall performance shift of the replica circuit, or based on individual shifts of the corresponding amplification stages (S1, S2, ..., S3) of the replica circuit. Based on detected shifts of the replica circuit, the control circuit (890) may adjust, for example, a gate periphery and/or bias points of the main circuit (1700). Selectable capacitance may also be used to change Cgs of the amplification stages, where the selectable capacitance is coupled, via switches, between gates and sources of transistors of each stage (S1, S2, ..., S3) to control an effective capacitance Cgs. In some embodiments, such selectable capacitance may be a DTC as described in, for example, the above referenced International Application No. PCT/US2009/0013581, whose disclosure is incorporated herein in its entirety by reference.

The devices according to the present disclosure can also be used, by way of example, and not of limitation, with power amplifiers present in amplitude modulators, such as those found in EDGE type GSM radios.

Accordingly, what has been shown are devices and methods for mismatch detection of an operating characteristic of a main circuit using a replica circuit, which in turn can be used to derive, for example, a corresponding control signal to adjust the main circuit. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the standby voltage condition for fast RF amplifier bias recovery of the present disclosure, and are not intended to limit the scope of what the applicant considers to be the invention. Such embodiments may be, for example, used within mobile handsets for current communication systems (e.g. WCMDA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

What is claimed is:

1. A circuital arrangement, comprising:
   a sensing circuit;
   a first radio frequency (RF) path coupled, through one or more sensing points of the first RF path, to the sensing circuit, the first RF path comprising a first active circuit; and
   at least one second RF path coupled, through one or more sensing points of the second RF path in correspondence of the one or more sensing points of the first RF path, to the sensing circuit, the second RF path comprising a second active circuit, the second active circuit being a reduced size replica of the first active circuit,
   wherein the sensing circuit is adapted to sense a difference between one or more operating characteristics of the first RF path, sensed at the one or more sensing points of the first RF path, and one or more reference operating characteristics of the second RF path, sensed at corresponding one or more sensing points of the second RF path.

2. The circuital arrangement according to claim 1, wherein:
   the one or more operating characteristics of the first RF path are affected by a set of operating variables, and
   the second RF path is configured so that one or more reference operating characteristics of the second RF path are affected by a subset of the operating variables.

3. The circuital arrangement according to claim 2, wherein the set of operating variables comprises one or more of: a) a load to the first/second RF paths, b) a local temperature at the first/second active circuits, c) hot carrier injection (HCI) effect on devices of the first/second active circuits, d) transient effects on the first/second active circuits, e) floating body effects on devices of the first/second active circuits, f) different operating modes of the first/second RF paths, and g) different frequencies of operation of the first/second RF paths.

4. The circuital arrangement according to claim 2, wherein the operating characteristics of the first active circuit and the operating characteristics of the second active circuit are related according to a known mapping function over the set of operating variables.

5. The circuital arrangement according to claim 2, wherein the one or more operating characteristics comprise one or more of: a) a signal modulation characteristic, b) a signal linearity characteristic, c) a signal distortion characteristic, d) a signal magnitude characteristic, e) a signal phase characteristic, f) a transient response characteristic, g) a temperature characteristic, and e) bias conditions, including bias voltages and bias currents.

6. The circuital arrangement according to claim 2, wherein:
   the first RF path is configured to transmit an RF signal at an output node of the first RF path through a matching impedance coupled to the output node of the first RF path, and
   the second RF path is configured to terminate an RF signal at an output node of the second RF path through a terminating impedance coupled to the output node of the second RF path.

7. The circuital arrangement according to claim 2, wherein the sensing circuit senses signals at the one or more sensing points of the first RF path in correspondence of the one or more operating characteristics of the first RF path, and senses signals at the one or more sensing points of the second RF path in correspondence of the one or more reference operating characteristics of the second RF path.

8. The circuital arrangement according to claim 7, wherein the sensed signals are one or more of: a) a voltage signal, b) a current signal, and c) a power signal.

9. The circuital arrangement according to claim 7, wherein the first RF path and the second RF path further comprise control inputs configured to receive control signals to affect the one or more operating characteristics.

10. The circuital arrangement according to claim 9, wherein the control signals are based on the sensed signals.

11. The circuital arrangement according to claim 1, wherein the reduced size of the second active circuit is about $1/100^{th}$ or less a size of the first active circuit, such as a current flow and a power consumption of the second active circuit is about $1/100^{th}$ or less of a current flow and a power consumption of the first active circuit.

12. The circuital arrangement according to claim 1, wherein the first RF path and the second RF path each further comprise an output signal processing circuit coupled to a respective output node of the first active circuit and the second active circuit.

13. The circuital arrangement according to claim 12, wherein the first RF path and the second RF path each further comprise an input signal processing circuit coupled to a respective input node of the first active circuit and the second active circuit.

14. The circuital arrangement according to claim 13, wherein the input signal processing circuit and the output signal processing circuit are configured to affect one or more of: a) a signal amplitude, b) a signal phase, and c) an impedance presented to the respective input node and output node.

15. The circuital arrangement according to claim 14, wherein the input signal processing circuit and the output signal processing circuit each comprise one or more of: a) a tunable match circuit, b) a fixed match, c) a variable attenuator, d) a fixed attenuator, e) a variable phase shifter circuit, and f) a filter.

16. The circuital arrangement according to claim 1, wherein the first RF path and the second RF path each comprises a biasing circuit configured to bias a respective one of the first active circuit and the second active circuit.

17. The circuital arrangement according to claim 16, wherein the biasing circuit comprises a DC/DC converter or a low dropout (LDO) regulator configured to provide power to the respective one of the first active circuit and the second active circuit.

18. The circuital arrangement according to claim 1, wherein the circuital arrangement is monolithically integrated in an integrated circuit either partially or in its entirety, according to a CMOS process comprising one of: a) a silicon-on-insulator (SOI) process, b) a silicon-on-sapphire process (SOS), and c) a bulk-silicon process.

19. The circuital arrangement according to claim 2, wherein the at least one second RF path comprises a plurality of second RF paths, each configured so that respective one or more reference operating characteristics are affected by a different subset of the operating variables.

20. The circuital arrangement according to claim 1, wherein the first active circuit comprises one of: a) an amplifier circuit, b) a power amplifier, c) a low noise amplifier (LNA), d) a mixer, e) a voltage controlled oscillator (VCO), f) a modulator, and g) a demodulator.

* * * * *